United States Patent
Khlat et al.

(10) Patent No.: US 9,379,667 B2
(45) Date of Patent: Jun. 28, 2016

(54) MULTIPLE POWER SUPPLY INPUT PARALLEL AMPLIFIER BASED ENVELOPE TRACKING

(71) Applicant: RF Micro Devices, Inc., Greensboro, NC (US)

(72) Inventors: Nadim Khlat, Cugnaux (FR); Michael R. Kay, Summerfield, NC (US); Philippe Gorisse, Brax (FR)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/072,225

(22) Filed: Nov. 5, 2013

(65) Prior Publication Data

US 2014/0062590 A1    Mar. 6, 2014

Related U.S. Application Data

(63) Continuation-in-part of application No. PCT/US2012/036858, filed on May 7, 2012, and a continuation-in-part of application No. 13/218,400, filed on Aug. 25, 2011, now Pat. No. 8,519,788, and a
(Continued)

(51) Int. Cl.

| | |
|---|---|
| *H03F 3/04* | (2006.01) |
| *H03G 3/00* | (2006.01) |
| *H03F 1/02* | (2006.01) |
| *H02M 3/07* | (2006.01) |
| *H02M 3/158* | (2006.01) |

(Continued)

(52) U.S. Cl.
CPC ............... *H03F 1/02* (2013.01); *H02M 3/07* (2013.01) *H02M 3/158* (2013.01);
*H03F 1/0227*; (2013.01); *H03F 3/189* (2013.01); *H03F 3/24* (2013.01); *H03G 3/3042* (2013.01); *H03F 2200/432* (2013.01)

(58) Field of Classification Search
CPC .................................... H03F 3/04; H03G 3/00
USPC .................................... 330/297, 10, 127, 133
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |

(Continued)

FOREIGN PATENT DOCUMENTS

| | | |
|---|---|---|
| CN | 1076567 A | 9/1993 |
| CN | 1518209 A | 8/2004 |

(Continued)

OTHER PUBLICATIONS

Notice of Allowance for U.S. Appl. No. 13/661,552, mailed Jun. 13, 2014, 5 pages.

(Continued)

*Primary Examiner* — Patricia T Nguyen
(74) *Attorney, Agent, or Firm* — Withrow & Terranova, P.L.L.C.

(57) ABSTRACT

A switch mode power supply converter and a parallel amplifier are disclosed. The switch mode power supply converter is coupled to a modulated power supply output and the parallel amplifier has a parallel amplifier output coupled to the modulated power supply output. Further, the parallel amplifier has a group of output stages, such that each output stage is directly coupled to the parallel amplifier output and each output stage receives a separate supply voltage.

27 Claims, 11 Drawing Sheets

Related U.S. Application Data continuation-in-part of application No. 13/316,229, filed on Dec. 9, 2011, now Pat. No. 8,633,766, which is a continuation-in-part of application No. 13/218,400, filed on Aug. 25, 2011, now Pat. No. 8,519,788, said application No. PCT/US2012/036858 is a continuation-in-part of application No. 13/367,973, filed on Feb. 7, 2012, now Pat. No. 8,942,313, and a continuation-in-part of application No. 13/423,649, filed on Mar. 19, 2012, now Pat. No. 8,624,760, and a continuation-in-part of application No. 13/363,888, filed on Feb. 1, 2012, now Pat. No. 8,611,402, and a continuation of application No. PCT/US2011/054106, filed on Sep. 29, 2011.

(60) Provisional application No. 61/482,702, filed on May 5, 2011, provisional application No. 61/484,613, filed on May 10, 2011, provisional application No. 61/508,202, filed on Jul. 15, 2011, provisional application No. 61/530,625, filed on Sep. 2, 2011, provisional application No. 61/544,051, filed on Oct. 6, 2011, provisional application No. 61/551,605, filed on Oct. 26, 2011, provisional application No. 61/565,138, filed on Nov. 30, 2011, provisional application No. 61/576,520, filed on Dec. 16, 2011.

(51) Int. Cl.
*H03F 3/189* (2006.01)
*H03F 3/24* (2006.01)
*H03G 3/30* (2006.01)

(56) References Cited

U.S. PATENT DOCUMENTS

| | | | |
|---|---|---|---|
| 4,587,552 | A | 5/1986 | Chin |
| 4,692,889 | A | 9/1987 | McNeely |
| 4,831,258 | A | 5/1989 | Paulk et al. |
| 4,996,500 | A | 2/1991 | Larson et al. |
| 5,099,203 | A * | 3/1992 | Weaver et al. ............... 330/10 |
| 5,146,504 | A | 9/1992 | Pinckley |
| 5,187,396 | A | 2/1993 | Armstrong, II et al. |
| 5,311,309 | A | 5/1994 | Ersoz et al. |
| 5,317,217 | A | 5/1994 | Rieger et al. |
| 5,339,041 | A | 8/1994 | Nitardy |
| 5,351,087 | A | 9/1994 | Christopher et al. |
| 5,414,614 | A | 5/1995 | Fette et al. |
| 5,420,643 | A | 5/1995 | Romesburg et al. |
| 5,457,620 | A | 10/1995 | Dromgoole |
| 5,486,871 | A | 1/1996 | Filliman et al. |
| 5,532,916 | A | 7/1996 | Tamagawa |
| 5,541,547 | A | 7/1996 | Lam |
| 5,581,454 | A | 12/1996 | Collins |
| 5,646,621 | A | 7/1997 | Cabler et al. |
| 5,715,526 | A | 2/1998 | Weaver, Jr. et al. |
| 5,767,744 | A | 6/1998 | Irwin et al. |
| 5,822,318 | A | 10/1998 | Tiedemann, Jr. et al. |
| 5,898,342 | A | 4/1999 | Bell |
| 5,905,407 | A | 5/1999 | Midya |
| 5,936,464 | A | 8/1999 | Grondahl |
| 6,043,610 | A | 3/2000 | Buell |
| 6,043,707 | A | 3/2000 | Budnik |
| 6,055,168 | A | 4/2000 | Kotowski et al. |
| 6,070,181 | A | 5/2000 | Yeh |
| 6,118,343 | A | 9/2000 | Winslow et al. |
| 6,133,777 | A | 10/2000 | Savelli |
| 6,141,541 | A | 10/2000 | Midya et al. |
| 6,147,478 | A | 11/2000 | Skelton et al. |
| 6,166,598 | A | 12/2000 | Schlueter |
| 6,198,645 | B1 | 3/2001 | Kotowski et al. |
| 6,204,731 | B1 | 3/2001 | Jiang et al. |
| 6,256,482 | B1 | 7/2001 | Raab |
| 6,300,826 | B1 | 10/2001 | Mathe et al. |
| 6,313,681 | B1 | 11/2001 | Yoshikawa |
| 6,348,780 | B1 | 2/2002 | Grant |
| 6,400,775 | B1 | 6/2002 | Gourgue et al. |
| 6,483,281 | B2 | 11/2002 | Hwang |
| 6,559,689 | B1 | 5/2003 | Clark |
| 6,566,935 | B1 | 5/2003 | Renous |
| 6,583,610 | B2 | 6/2003 | Groom et al. |
| 6,617,930 | B2 | 9/2003 | Nitta |
| 6,621,808 | B1 | 9/2003 | Sadri |
| 6,624,712 | B1 | 9/2003 | Cygan et al. |
| 6,646,501 | B1 | 11/2003 | Wessel |
| 6,658,445 | B1 | 12/2003 | Gau et al. |
| 6,681,101 | B1 | 1/2004 | Eidson et al. |
| 6,686,727 | B2 | 2/2004 | Ledenev et al. |
| 6,690,652 | B1 | 2/2004 | Sadri |
| 6,701,141 | B2 | 3/2004 | Lam |
| 6,703,080 | B2 | 3/2004 | Reyzelman et al. |
| 6,728,163 | B2 | 4/2004 | Gomm et al. |
| 6,744,151 | B2 | 6/2004 | Jackson et al. |
| 6,819,938 | B2 | 11/2004 | Sahota |
| 6,885,176 | B2 | 4/2005 | Librizzi |
| 6,958,596 | B1 | 10/2005 | Sferrazza et al. |
| 6,995,995 | B2 | 2/2006 | Zeng et al. |
| 7,038,536 | B2 * | 5/2006 | Cioffi et al. .................... 330/10 |
| 7,043,213 | B2 | 5/2006 | Robinson et al. |
| 7,053,718 | B2 | 5/2006 | Dupuis et al. |
| 7,058,373 | B2 | 6/2006 | Grigore |
| 7,099,635 | B2 * | 8/2006 | McCune ...................... 455/110 |
| 7,164,893 | B2 | 1/2007 | Leizerovich et al. |
| 7,170,341 | B2 | 1/2007 | Conrad et al. |
| 7,200,365 | B2 | 4/2007 | Watanabe et al. |
| 7,233,130 | B1 | 6/2007 | Kay |
| 7,253,589 | B1 | 8/2007 | Potanin et al. |
| 7,254,157 | B1 | 8/2007 | Crotty et al. |
| 7,262,658 | B2 | 8/2007 | Ramaswamy et al. |
| 7,279,875 | B2 | 10/2007 | Gan et al. |
| 7,304,537 | B2 | 12/2007 | Kwon et al. |
| 7,348,847 | B2 | 3/2008 | Whittaker |
| 7,394,233 | B1 | 7/2008 | Trayling et al. |
| 7,405,618 | B2 | 7/2008 | Lee et al. |
| 7,411,316 | B2 | 8/2008 | Pai |
| 7,414,330 | B2 | 8/2008 | Chen |
| 7,454,238 | B2 | 11/2008 | Vinayak et al. |
| 7,515,885 | B2 * | 4/2009 | Sander et al. ............... 455/127.3 |
| 7,528,807 | B2 | 5/2009 | Kim et al. |
| 7,529,523 | B1 | 5/2009 | Young et al. |
| 7,539,466 | B2 | 5/2009 | Tan et al. |
| 7,595,569 | B2 | 9/2009 | Amerom et al. |
| 7,609,114 | B2 | 10/2009 | Hsieh et al. |
| 7,615,979 | B2 | 11/2009 | Caldwell |
| 7,627,622 | B2 | 12/2009 | Conrad et al. |
| 7,646,108 | B2 | 1/2010 | Paillet et al. |
| 7,653,366 | B2 | 1/2010 | Grigore |
| 7,679,433 | B1 | 3/2010 | Li |
| 7,684,216 | B2 | 3/2010 | Choi et al. |
| 7,696,735 | B2 | 4/2010 | Oraw et al. |
| 7,715,811 | B2 | 5/2010 | Kenington |
| 7,724,837 | B2 | 5/2010 | Filimonov et al. |
| 7,755,431 | B2 | 7/2010 | Sun |
| 7,764,060 | B2 | 7/2010 | Wilson |
| 7,773,691 | B2 | 8/2010 | Khlat et al. |
| 7,773,965 | B1 | 8/2010 | Van Brunt et al. |
| 7,777,459 | B2 | 8/2010 | Williams |
| 7,782,036 | B1 | 8/2010 | Wong et al. |
| 7,783,269 | B2 | 8/2010 | Vinayak et al. |
| 7,800,427 | B2 | 9/2010 | Chae et al. |
| 7,805,115 | B1 | 9/2010 | McMorrow et al. |
| 7,852,150 | B1 | 12/2010 | Arknaes-Pedersen |
| 7,856,048 | B1 | 12/2010 | Smaini et al. |
| 7,859,336 | B2 | 12/2010 | Markowski et al. |
| 7,880,547 | B2 | 2/2011 | Lee et al. |
| 7,884,681 | B1 | 2/2011 | Khlat et al. |
| 7,894,216 | B2 | 2/2011 | Melanson |
| 7,898,268 | B2 | 3/2011 | Bernardon et al. |
| 7,898,327 | B2 | 3/2011 | Nentwig |
| 7,907,010 | B2 | 3/2011 | Wendt et al. |
| 7,915,961 | B1 * | 3/2011 | Li ............................. 330/297 |
| 7,920,023 | B2 | 4/2011 | Witchard |
| 7,923,974 | B2 | 4/2011 | Martin et al. |

(56) References Cited

U.S. PATENT DOCUMENTS

| | | | |
|---|---|---|---|
| 7,965,140 B2 | 6/2011 | Takahashi | |
| 7,994,864 B2 | 8/2011 | Chen et al. | |
| 8,000,117 B2 | 8/2011 | Petricek | |
| 8,008,970 B1 | 8/2011 | Homol et al. | |
| 8,022,761 B2 | 9/2011 | Drogi et al. | |
| 8,026,765 B2 | 9/2011 | Giovannotto | |
| 8,044,639 B2 | 10/2011 | Tamegai et al. | |
| 8,054,126 B2 | 11/2011 | Yang et al. | |
| 8,068,622 B2 | 11/2011 | Melanson et al. | |
| 8,081,199 B2 | 12/2011 | Takata et al. | |
| 8,093,951 B1 * | 1/2012 | Zhang et al. | 330/251 |
| 8,159,297 B2 | 4/2012 | Kumagai | |
| 8,164,388 B2 | 4/2012 | Iwamatsu | |
| 8,174,313 B2 * | 5/2012 | Vice | 330/127 |
| 8,183,917 B2 | 5/2012 | Drogi et al. | |
| 8,183,929 B2 | 5/2012 | Grondahl | |
| 8,198,941 B2 | 6/2012 | Lesso | |
| 8,204,456 B2 | 6/2012 | Xu et al. | |
| 8,242,813 B1 | 8/2012 | Wile et al. | |
| 8,253,485 B2 | 8/2012 | Clifton | |
| 8,253,487 B2 | 8/2012 | Hou et al. | |
| 8,274,332 B2 | 9/2012 | Cho et al. | |
| 8,289,084 B2 | 10/2012 | Morimoto et al. | |
| 8,358,113 B2 | 1/2013 | Cheng et al. | |
| 8,362,837 B2 | 1/2013 | Koren et al. | |
| 8,493,141 B2 | 7/2013 | Khlat et al. | |
| 8,519,788 B2 | 8/2013 | Khlat | |
| 8,541,993 B2 | 9/2013 | Notman et al. | |
| 8,542,061 B2 | 9/2013 | Levesque et al. | |
| 8,548,398 B2 | 10/2013 | Baxter et al. | |
| 8,558,616 B2 | 10/2013 | Shizawa et al. | |
| 8,571,498 B2 | 10/2013 | Khlat | |
| 8,588,713 B2 | 11/2013 | Khlat | |
| 8,611,402 B2 | 12/2013 | Chiron | |
| 8,618,868 B2 | 12/2013 | Khlat et al. | |
| 8,624,576 B2 | 1/2014 | Khlat et al. | |
| 8,624,760 B2 | 1/2014 | Ngo et al. | |
| 8,626,091 B2 | 1/2014 | Khlat et al. | |
| 8,633,766 B2 | 1/2014 | Khlat et al. | |
| 8,638,165 B2 | 1/2014 | Shah et al. | |
| 8,648,657 B1 | 2/2014 | Rozenblit | |
| 8,659,355 B2 * | 2/2014 | Henshaw et al. | 330/127 |
| 8,693,676 B2 | 4/2014 | Xiao et al. | |
| 8,717,100 B2 | 5/2014 | Reisner et al. | |
| 8,718,579 B2 | 5/2014 | Drogi | |
| 8,718,582 B2 | 5/2014 | See et al. | |
| 8,725,218 B2 | 5/2014 | Brown et al. | |
| 8,744,382 B2 | 6/2014 | Hou et al. | |
| 8,749,307 B2 | 6/2014 | Zhu et al. | |
| 8,760,228 B2 | 6/2014 | Khlat | |
| 8,782,107 B2 | 7/2014 | Myara et al. | |
| 8,792,840 B2 | 7/2014 | Khlat et al. | |
| 8,803,605 B2 | 8/2014 | Fowers et al. | |
| 8,824,978 B2 | 9/2014 | Briffa et al. | |
| 8,829,993 B2 | 9/2014 | Briffa et al. | |
| 8,878,606 B2 | 11/2014 | Khlat et al. | |
| 8,884,696 B2 | 11/2014 | Langer | |
| 8,909,175 B1 | 12/2014 | McCallister | |
| 8,942,313 B2 | 1/2015 | Khlat et al. | |
| 8,942,651 B2 | 1/2015 | Jones | |
| 8,942,652 B2 | 1/2015 | Khlat et al. | |
| 8,947,161 B2 | 2/2015 | Khlat et al. | |
| 8,947,162 B2 | 2/2015 | Wimpenny et al. | |
| 8,952,710 B2 | 2/2015 | Retz et al. | |
| 8,957,728 B2 | 2/2015 | Gorisse | |
| 8,975,959 B2 | 3/2015 | Khlat | |
| 8,981,839 B2 | 3/2015 | Kay et al. | |
| 8,981,847 B2 | 3/2015 | Balteanu | |
| 8,981,848 B2 | 3/2015 | Kay et al. | |
| 8,994,345 B2 | 3/2015 | Wilson | |
| 9,019,011 B2 | 4/2015 | Hietala et al. | |
| 9,020,451 B2 | 4/2015 | Khlat | |
| 9,024,688 B2 | 5/2015 | Kay et al. | |
| 9,041,364 B2 | 5/2015 | Khlat | |
| 9,041,365 B2 | 5/2015 | Kay et al. | |
| 9,075,673 B2 | 7/2015 | Khlat et al. | |
| 9,077,405 B2 | 7/2015 | Jones et al. | |
| 9,099,961 B2 | 8/2015 | Kay et al. | |
| 9,112,452 B1 | 8/2015 | Khlat | |
| 2002/0071497 A1 | 6/2002 | Bengtsson et al. | |
| 2002/0125869 A1 | 9/2002 | Groom et al. | |
| 2003/0031271 A1 | 2/2003 | Bozeki et al. | |
| 2003/0062950 A1 | 4/2003 | Hamada et al. | |
| 2003/0137286 A1 | 7/2003 | Kimball et al. | |
| 2003/0146791 A1 | 8/2003 | Shvarts et al. | |
| 2003/0153289 A1 | 8/2003 | Hughes et al. | |
| 2003/0198063 A1 | 10/2003 | Smyth | |
| 2003/0206603 A1 | 11/2003 | Husted | |
| 2003/0220953 A1 | 11/2003 | Allred | |
| 2003/0232622 A1 | 12/2003 | Seo et al. | |
| 2004/0047329 A1 | 3/2004 | Zheng | |
| 2004/0051384 A1 | 3/2004 | Jackson et al. | |
| 2004/0124913 A1 | 7/2004 | Midya et al. | |
| 2004/0127173 A1 | 7/2004 | Leizerovich | |
| 2004/0132424 A1 | 7/2004 | Aytur et al. | |
| 2004/0184569 A1 | 9/2004 | Challa et al. | |
| 2004/0196095 A1 | 10/2004 | Nonaka | |
| 2004/0219891 A1 | 11/2004 | Hadjichristos | |
| 2004/0239301 A1 | 12/2004 | Kobayashi | |
| 2004/0266366 A1 | 12/2004 | Robinson et al. | |
| 2004/0267842 A1 | 12/2004 | Allred | |
| 2005/0008093 A1 | 1/2005 | Matsuura et al. | |
| 2005/0032499 A1 | 2/2005 | Cho | |
| 2005/0047180 A1 | 3/2005 | Kim | |
| 2005/0064830 A1 | 3/2005 | Grigore | |
| 2005/0079835 A1 | 4/2005 | Takabayashi et al. | |
| 2005/0093630 A1 | 5/2005 | Whittaker et al. | |
| 2005/0110562 A1 | 5/2005 | Robinson et al. | |
| 2005/0122171 A1 | 6/2005 | Miki et al. | |
| 2005/0156582 A1 | 7/2005 | Redl et al. | |
| 2005/0156662 A1 | 7/2005 | Raghupathy et al. | |
| 2005/0157778 A1 | 7/2005 | Trachewsky et al. | |
| 2005/0184713 A1 | 8/2005 | Xu et al. | |
| 2005/0200407 A1 | 9/2005 | Arai et al. | |
| 2005/0208907 A1 | 9/2005 | Yamazaki et al. | |
| 2005/0286616 A1 | 12/2005 | Kodavati | |
| 2006/0006946 A1 | 1/2006 | Burns et al. | |
| 2006/0062324 A1 | 3/2006 | Naito et al. | |
| 2006/0097711 A1 | 5/2006 | Brandt | |
| 2006/0128324 A1 | 6/2006 | Tan et al. | |
| 2006/0147062 A1 | 7/2006 | Niwa et al. | |
| 2006/0154637 A1 | 7/2006 | Eyries et al. | |
| 2006/0178119 A1 | 8/2006 | Jarvinen | |
| 2006/0181340 A1 | 8/2006 | Dhuyvetter | |
| 2006/0220627 A1 | 10/2006 | Koh | |
| 2006/0244513 A1 | 11/2006 | Yen et al. | |
| 2007/0008804 A1 | 1/2007 | Lu et al. | |
| 2007/0014382 A1 | 1/2007 | Shakeshaft et al. | |
| 2007/0024360 A1 | 2/2007 | Markowski | |
| 2007/0024365 A1 | 2/2007 | Ramaswamy et al. | |
| 2007/0054635 A1 | 3/2007 | Black et al. | |
| 2007/0063681 A1 | 3/2007 | Liu | |
| 2007/0082622 A1 | 4/2007 | Leinonen et al. | |
| 2007/0146076 A1 | 6/2007 | Baba | |
| 2007/0159256 A1 | 7/2007 | Ishikawa et al. | |
| 2007/0182392 A1 | 8/2007 | Nishida | |
| 2007/0183532 A1 | 8/2007 | Matero | |
| 2007/0184794 A1 | 8/2007 | Drogi et al. | |
| 2007/0249304 A1 | 10/2007 | Snelgrove et al. | |
| 2007/0259628 A1 | 11/2007 | Carmel et al. | |
| 2007/0290749 A1 | 12/2007 | Woo et al. | |
| 2008/0003950 A1 | 1/2008 | Haapoja et al. | |
| 2008/0044041 A1 | 2/2008 | Tucker et al. | |
| 2008/0081572 A1 | 4/2008 | Rofougaran | |
| 2008/0104432 A1 | 5/2008 | Vinayak et al. | |
| 2008/0150619 A1 | 6/2008 | Lesso et al. | |
| 2008/0157745 A1 | 7/2008 | Nakata | |
| 2008/0205095 A1 | 8/2008 | Pinon et al. | |
| 2008/0224769 A1 | 9/2008 | Markowski et al. | |
| 2008/0242246 A1 | 10/2008 | Minnis et al. | |
| 2008/0252278 A1 | 10/2008 | Lindeberg et al. | |
| 2008/0258831 A1 | 10/2008 | Kunihiro et al. | |
| 2008/0259656 A1 | 10/2008 | Grant | |
| 2008/0280577 A1 | 11/2008 | Beukema et al. | |

(56) References Cited

U.S. PATENT DOCUMENTS

| | | |
|---|---|---|
| 2009/0004981 A1 | 1/2009 | Eliezer et al. |
| 2009/0015229 A1 | 1/2009 | Kotikalapoodi |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0140706 A1 | 6/2009 | Taufik et al. |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1* | 1/2010 | Van Zeijl et al. ............. 330/10 |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0027301 A1 | 2/2010 | Hoyerby |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0193629 A1 | 8/2011 | Hou et al. |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2011/0304400 A1 | 12/2011 | Stanley |
| 2012/0025907 A1 | 2/2012 | Koo et al. |
| 2012/0025919 A1 | 2/2012 | Huynh |
| 2012/0032658 A1 | 2/2012 | Casey et al. |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0212197 A1 | 8/2012 | Fayed et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0274235 A1 | 11/2012 | Lee et al. |
| 2012/0299647 A1 | 11/2012 | Honjo et al. |
| 2012/0313701 A1 | 12/2012 | Khlat et al. |
| 2013/0024142 A1 | 1/2013 | Folkmann et al. |
| 2013/0034139 A1 | 2/2013 | Khlat et al. |
| 2013/0038305 A1 | 2/2013 | Arno et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0042999 A1 | 2/2014 | Barth et al. |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184335 A1 | 7/2014 | Nobbe et al. |
| 2014/0203868 A1 | 7/2014 | Khlat et al. |
| 2014/0203869 A1 | 7/2014 | Khlat et al. |
| 2014/0225674 A1 | 8/2014 | Folkmann et al. |
| 2014/0266427 A1 | 9/2014 | Chiron |
| 2014/0266428 A1 | 9/2014 | Chiron et al. |
| 2014/0285164 A1 | 9/2014 | Oishi et al. |
| 2014/0306769 A1 | 10/2014 | Khlat et al. |
| 2015/0048891 A1 | 2/2015 | Rozek et al. |
| 2015/0180422 A1 | 6/2015 | Khlat et al. |
| 2015/0234402 A1 | 8/2015 | Kay et al. |

FOREIGN PATENT DOCUMENTS

| | | |
|---|---|---|
| CN | 1898860 A | 1/2007 |
| CN | 101106357 A | 1/2008 |
| CN | 101379695 A | 3/2009 |
| CN | 101405671 A | 4/2009 |
| CN | 101416385 A | 4/2009 |
| CN | 101427459 U | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| EP | 0755121 A2 | 1/1997 |
| EP | 1047188 A2 | 10/2000 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| JP | 2010166157 A | 7/2010 |
| TW | 461168 B | 10/2001 |
| WO | 0048306 A1 | 8/2000 |

(56) References Cited

FOREIGN PATENT DOCUMENTS

| WO | 04002006 A1 | 12/2003 |
|---|---|---|
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Sahu, B. et al., "Adaptive Power Management of Linear RF Power Amplifiers in Mobile Handsets-An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujire%20Files%20100th%20-Envelope%20Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for US Appl. No. 11/113,873, now Patent No. 7,773,691, mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619, mailed May 8, 2007, 2 pages.
Extended European Search Report for application 06740532.4, mailed Dec. 7, 2010, 7 pages.
Non-final Office Action for U.S. Appl. No. 12/112,006, mailed Apr. 5, 2010, 6 pages.
Notice of Allowance for U.S. Appl. No. 12/112,006, mailed Jul. 19, 2010, 6 pages.

(56) References Cited

OTHER PUBLICATIONS

Non-Final Office Action for U.S. Appl. No. 12/836,307, mailed Nov. 5, 2013, 6 pages.
Notice of Allowance for U.S. Appl. No. 12/836,307, mailed May 5, 2014, 6 pages.
Non-final Office Action for U.S. Appl. No. 13/089,917, mailed Nov. 23, 2012, 6 pages.
Examination Report for European Patent Application No. 11720630, mailed Aug. 16, 2013, 5 pages.
Examination Report for European Patent Application No. 11720630.0, issued Mar. 18, 2014, 4 pages.
European Search Report for European Patent Application No. 14162682.0, issued Aug. 27, 2014, 7 pages.
International Search Report for PCT/US11/033037, mailed Aug. 9, 2011, 10 pages.
International Preliminary Report on Patentability for PCT/US2011/033037, mailed Nov. 1, 2012, 7 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 8 pages.
International Search Report for PCT/US2011/044857, mailed Oct. 24, 2011, 10 pages.
International Preliminary Report on Patentability for PCT/US2011/044857, mailed Mar. 7, 2013, 6 pages.
Non-final Office Action for U.S. Appl. No. 13/218,400, mailed Nov. 8, 2012, 7 pages.
Notice of Allowance for U.S. Appl. No. 13/218,400, mailed Apr. 11, 2013, 7 pages.
International Search Report for PCT/US11/49243, mailed Dec. 22, 2011, 9 pages.
International Preliminary Report on Patentability for PCT/US11/49243, mailed Nov. 13, 2012, 33 pages.
International Search Report for PCT/US2011/054106, mailed Feb. 9, 2012, 11 pages.
International Preliminary Report on Patentability for PCT/US2011/054106, mailed Apr. 11, 2013, 8 pages.
Notice of Allowance for U.S. Appl. No. 13/297,490, mailed Feb. 27, 2014, 7 pages.
Invitation to Pay Additional Fees for PCT/US2011/061007, mailed Feb. 13, 2012, 7 pages.
International Search Report for PCT/US2011/061007, mailed Aug. 16, 2012, 16 pages.
International Preliminary Report on Patentability for PCT/US2011/061007, mailed May 30, 2013, 11 pages.
Non-Final Office Action for U.S. Appl. No. 13/297,470, mailed May 8, 2013, 15 pages.
Final Office Action for U.S. Appl. No. 13/297,470, mailed Oct. 25, 2013, 17 pages.
Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.

(56) References Cited

OTHER PUBLICATIONS

International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
Notice of Allowance for U.S. Appl. No. 14/072,140, mailed Dec. 2, 2014, 8 pages.
Notice of Allowance for U.S. Appl. No. 3/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Advisory Action for U.S. Appl. No. 13/689,883, mailed Apr. 20, 2015, 3 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Notice of Allowance for U.S. Appl. No. 13/948,291, mailed Feb. 11, 2015, 7 pages.
Notice of Allowance for U.S. Appl. No. 14/022,858, mailed Feb. 17, 2015, 7 pages.
Final Office Action for U.S. Appl. No. 13/661,227, mailed Feb. 6, 2015, 24 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
First Office Action for Chinese Patent Application No. 201180030273.5, issued Dec. 3, 2014, 15 pages (with English translation).
International Preliminary Report on Patentability for PCT/US2013/052277, mailed Feb. 5, 2015, 9 pages.
European Search Report for European Patent Application No. 14190851.7, issued Mar. 5, 2015, 6 pages.
First Office Action for Chinese Patent Application No. 201280052694.2, issued Mar. 24, 2015, 35 pages.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
First Office Action and Search Report for Chinese Patent Application No. 201280007941.7, issued May 13, 2015, 13 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Qualye Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
First Office Action for Chinese Patent Application No. 201180067293.X, mailed Aug. 6, 2015, 13 pages.
Author Unknown, "Automatically," Definition, Dictionary.com Unabridged, 2015, pp. 1-6, http://dictionary.reference.com/browse/automatically.
Final Office Action for U.S. Appl. No. 13/689,883, mailed Dec. 23, 2015, 12 pages.
Final Office Action for U.S. Appl. No. 13/714,600, mailed Dec. 24, 2015, 15 pages.

(56) References Cited

OTHER PUBLICATIONS

Notice of Allowance for U.S. Appl. No. 13/747,725, mailed Oct. 28, 2015, 9 pages.
Advisory Action for U.S. Appl. No. 13/689,922, mailed Dec. 18, 2015, 3 pages.
Notice of Allowance for U.S. Appl. No. 13/727,911, mailed Nov. 10, 2015, 8 pages.
Notice of Allowance for U.S. Appl. No. 14/163,229, mailed Nov. 5, 2015, 8 pages.
Final Office Action for U.S. Appl. No. 14/163,256, mailed Nov. 2, 2015, 10 pages.
Corrected Notice of Allowability for U.S. Appl. No. 13/689,940, mailed Nov. 17, 2015, 4 pages.
Final Office Action for U.S. Appl. No. 14/082,629, mailed Nov. 4, 2015, 17 pages.
Non-Final Office Action for U.S. Appl. No. 14/458,341, mailed Nov. 12, 2015, 5 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 14/072,140, mailed Aug. 20, 2015, 6 pages.
Notice of Allowance for U.S. Appl. No. 13/747,725, mailed Sep. 1, 2015, 9 pages.
Notice of Allowance for U.S. Appl. No. 14/027,416, mailed Aug. 11, 2015, 9 pages.
International Preliminary Report on Patentability for PCT/US2014/012927, mailed Aug. 6, 2015, 9 pages.
First Office Action and Search Report for Chinese Patent Application No. 20120596632.X, mailed Jun. 25, 2015, 16 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
Notice of Allowance for U.S. Appl. No. 13/661,164, mailed Oct. 21, 2015, 7 pages.
Non-Final Office Action for U.S. Appl. No. 14/254,215, mailed Oct. 15, 2015, 5 pages.
Final Office Action for Chinese Patent Application No. 201280042523.1, issued Dec. 4, 2015, 12 pages.
Notice of Allowance for U.S. Appl. No. 13/661,227, mailed Feb. 9, 2016, 28 pages.
Advisory Action for U.S. Appl. No. 14/082,629, mailed Jan. 22, 2016, 3 pages.
Non-Final Office Action for U.S. Appl. No. 13/876,518, mailed Jan. 20, 2016, 16 pages.
Notice of Allowance for U.S. Appl. No. 14/163,256, mailed Feb. 10, 2016, 8 pages.
First Office Action for Chinese Patent Application No. 201280052739.6, mailed Mar. 3, 2016, 31 pages.
Communication under Rule 164(2)(a) EPC for European Patent Application No. 12725911.7, mailed Feb. 17, 2016, 8 pages.
Advisory Action for U.S. Appl. No. 13/689,883, mailed Mar. 4, 2016, 3 pages.
Advisory Action for U.S. Appl. No. 13/714,600, mailed Mar. 14, 2016, 3 pages.
Notice of Allowance for U.S. Appl. No. 13/689,922, mailed Mar. 18, 2016, 9 pages.
Notice of Allowance for U.S. Appl. No. 14/101,770, mailed Apr. 11, 2016, 6 pages.
Notice of Allowance for U.S. Appl. No. 14/151,167, mailed Mar. 4, 2016, 7 pages.
Non-Final Office Action for U.S. Appl. No. 14/082,629, mailed Mar. 16, 2016, 23 pages.
Notice of Allowance for U.S. Appl. No. 14/702,192, mailed Feb. 22, 2016, 8 pages.
Notice of Allowance for U.S. Appl. No. 14/254,215, mailed Feb. 18, 2016, 7 pages.
Notice of Allowance for U.S. Appl. No. 14/458,341, mailed Feb. 18, 2016, 6 pages.
Non-Final Office Action for U.S. Appl. No. 13/689,883, mailed Apr. 20, 2016, 13 pages.

* cited by examiner

MULTIPLE POWER SUPPLY INPUT PARALLEL AMPLIFIER BASED ENVELOPE TRACKING

RELATED APPLICATIONS

The present application claims priority to and is a continuation-in-part of International Patent Application No. PCT/US12/36858, filed May 7, 2012, entitled "POWER MANAGEMENT SYSTEM FOR PSEUDO-ENVELOPE AND AVERAGE POWER TRACKING," which claims priority to U.S. Provisional Patent Applications No. 61/482,702, filed May 5, 2011; Ser. No. 61/484,613, filed May 10, 2011; Ser. No. 61/508,202, filed Jul. 15, 2011; Ser. No. 61/530,625, filed Sep. 2, 2011; Ser. No. 61/544,051, filed Oct. 6, 2011; Ser. No. 61/551,605, filed Oct. 26, 2011; Ser. No. 61/565,138, filed Nov. 30, 2011; and Ser. No. 61/576,520, filed Dec. 16, 2011.

International Patent Application No. PCT/US12/36858, filed May 7, 2012, claims priority to and is a continuation-in-part of U.S. patent application Ser. No. 13/218,400, filed Aug. 25, 2011, entitled "BOOST CHARGE-PUMP WITH FRACTIONAL RATIO AND OFFSET LOOP FOR SUPPLY MODULATION," now U.S. Pat. No. 8,519,788, which was also filed as International Patent Application No. PCT/US11/49243 on Aug. 25, 2011.

International Patent Application No. PCT/US12/36858, filed May 7, 2012, claims priority to and is a continuation-in-part of International Patent Application No. PCT/US11/54106, filed Sep. 29, 2011, entitled "SINGLE μC-BUCK-BOOST CONVERTER WITH MULTIPLE REGULATED SUPPLY OUTPUTS."

International Patent Application No. PCT/US12/36858, filed May 7, 2012, claims priority to and is a continuation-in-part of U.S. patent application Ser. No. 13/316,229, filed Dec. 9, 2011, entitled "PSEUDO-ENVELOPE FOLLOWER POWER MANAGEMENT SYSTEM WITH HIGH FREQUENCY RIPPLE CURRENT," now U.S. Pat. No. 8,633,766, which was also filed as International Patent Application No. PCT/US11/64255 on Dec. 9, 2011. U.S. patent application Ser. No. 13/316,229, filed Dec. 9, 2011, is a continuation-in-part of U.S. patent application Ser. No. 13/218,400, filed Aug. 25, 2011, which was also filed as International Patent Application No. PCT/US11/49243 on Aug. 25, 2011.

International Patent Application No. PCT/US12/36858, filed May 7, 2012, claims priority to and is a continuation-in-part of U.S. patent application Ser. No. 13/367,973, filed Feb. 7, 2012, entitled "GROUP DELAY CALIBRATION METHOD FOR POWER AMPLIFIER ENVELOPE TRACKING," now U.S. Pat. No. 8,942,313, which was also filed as International Patent Application No. PCT/US12/24124 on Feb. 7, 2012.

International Patent Application No. PCT/US12/36858, filed May 7, 2012, claims priority to and is a continuation-in-part of U.S. patent application Ser. No. 13/423,649, filed Mar. 19, 2012, entitled "APPARATUSES AND METHODS FOR RATE CONVERSION AND FRACTIONAL DELAY CALCULATION USING A COEFFICIENT LOOK UP TABLE," now U.S. Pat. No. 8,624,760.

International Patent Application No. PCT/US12/36858, filed May 7, 2012, claims priority to and is a continuation-in-part of U.S. patent application Ser. No. 13/363,888, filed Feb. 1, 2012, entitled "FAST ENVELOPE SYSTEM CALIBRATION," now U.S. Pat. No. 8,611,402, which was also filed as International Patent Application No. PCT/US12/23495, on Feb. 1, 2012.

All of the applications listed above are hereby incorporated herein by reference in their entireties.

FIELD OF THE DISCLOSURE

The embodiments described herein relate to a power management system for delivering current to a linear radio frequency power amplifier. More particularly, the embodiments relate to the use of a pseudo-envelope tracker in a power management system of mobile communications equipment.

BACKGROUND

Next-generation mobile devices are morphing from voice-centric telephones to message and multimedia-based "smart" phones that offer attractive new features. As an example, smart phones offer robust multimedia features such as web-browsing, audio and video playback and streaming, email access and a rich gaming environment. But even as manufacturers race to deliver ever more feature rich mobile devices, the challenge of powering them looms large.

In particular, the impressive growth of high bandwidth applications for radio-frequency (RF) hand-held devices has led to increased demand for efficient power saving techniques to increase battery life. Because the radio frequency power amplifier of the mobile device consumes a large percentage of the overall power budget of the mobile device, various power management systems have been proposed to increase the overall power efficiency of the radio frequency power amplifier. As such, there remains a need to further improve the power efficiency of mobile devices to provide extended battery life. In this regard, there is a need to improve the power management system of mobile devices.

SUMMARY

A switch mode power supply converter and a parallel amplifier are disclosed according to one embodiment of the present disclosure. The switch mode power supply converter is coupled to a modulated power supply output and the parallel amplifier has a parallel amplifier output coupled to the modulated power supply output. Further, the parallel amplifier has a group of output stages, such that each output stage is directly coupled to the parallel amplifier output and each output stage receives a separate supply voltage.

In one embodiment of the switch mode power supply converter and the parallel amplifier, the switch mode power supply converter cooperatively operates with the parallel amplifier to provide a power amplifier supply voltage to a radio frequency power amplifier. The power amplifier supply voltage is based on the group of supply voltages. Each supply voltage is not equal to any other supply voltage. Therefore, voltage drops in the output stages in the parallel amplifier may be reduced, thereby increasing efficiency.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A switch mode power supply converter and a parallel amplifier are disclosed according to one embodiment of the present disclosure. The switch mode power supply converter is coupled to a modulated power supply output and the parallel amplifier has a parallel amplifier output coupled to the modulated power supply output. Further, the parallel amplifier has a group of output stages, such that each output stage is directly coupled to the parallel amplifier output and each output stage receives a separate supply voltage.

In one embodiment of the switch mode power supply converter and the parallel amplifier, the switch mode power supply converter cooperatively operates with the parallel amplifier to provide a power amplifier supply voltage to a radio frequency power amplifier. The power amplifier supply voltage is based on the group of supply voltages. Each supply voltage is not equal to any other supply voltage. Therefore, voltage drops in the output stages in the parallel amplifier may be reduced, thereby increasing efficiency.

Figure 1A:
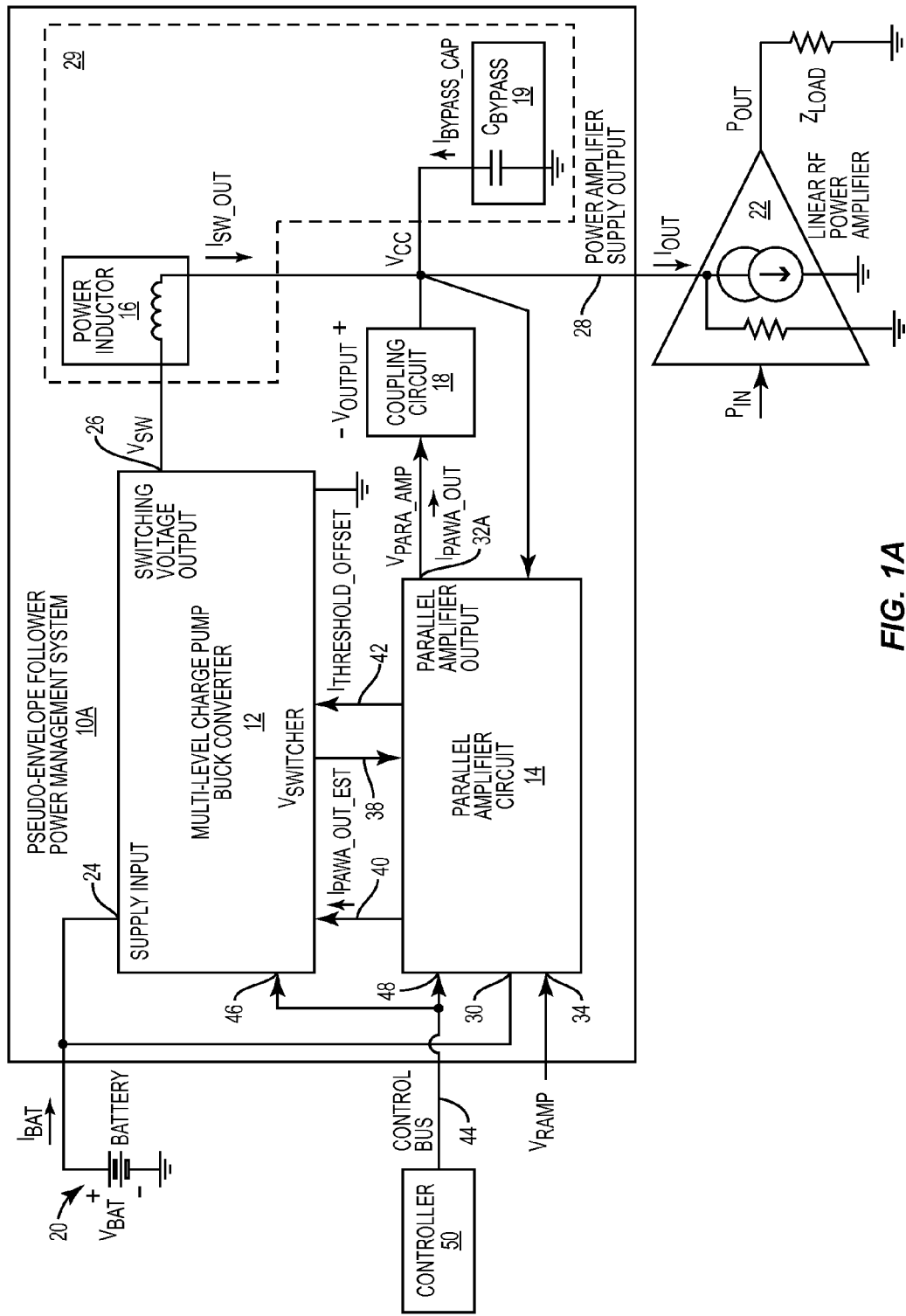
FIG. 1A depicts an embodiment of a pseudo-envelope follower power management system for managing power supplied to a linear radio frequency power amplifier according to one embodiment of the pseudo-envelope follower power management system.
Figure 1B:
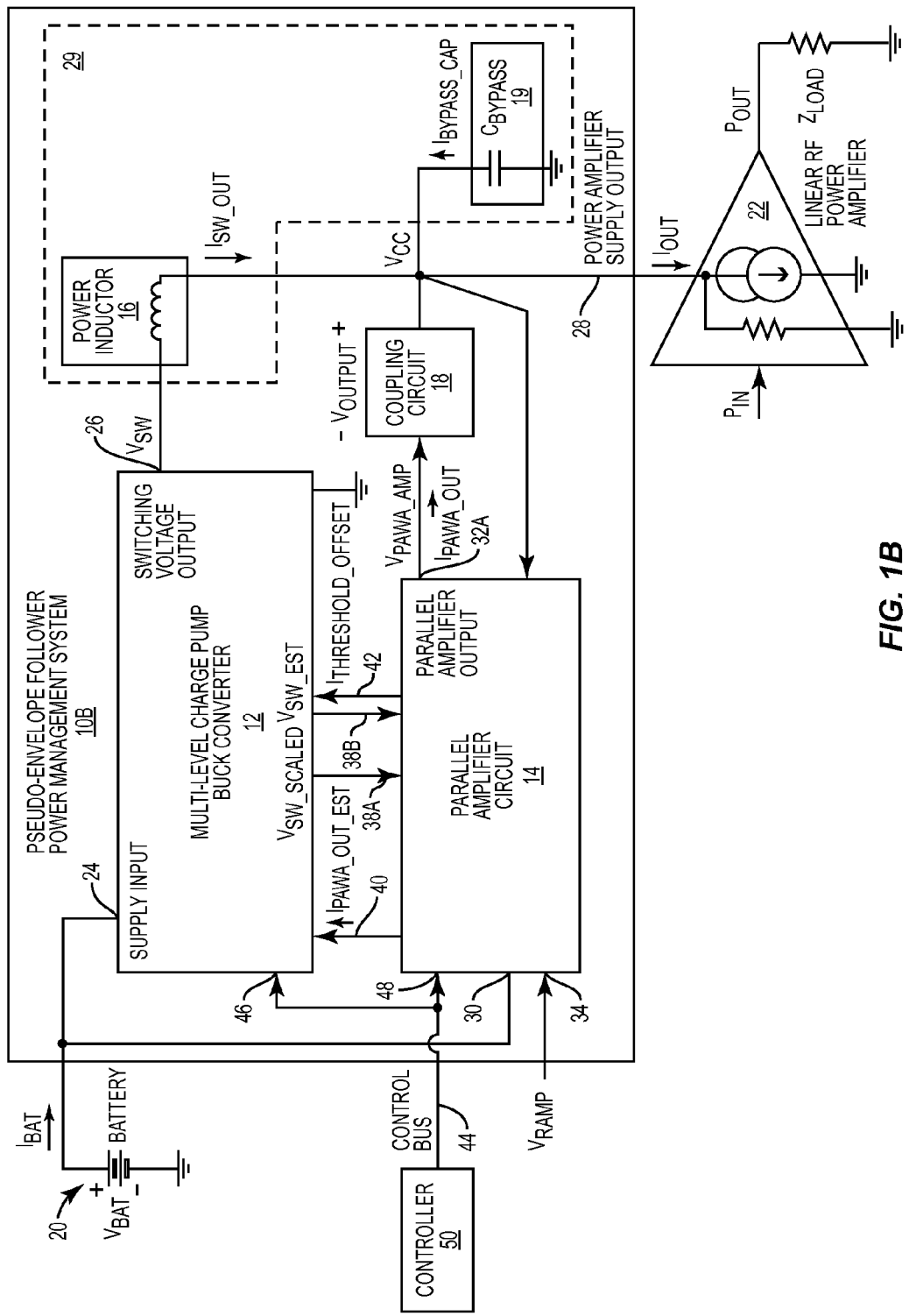
FIG. 1B depicts an embodiment of the pseudo-envelope follower power management system for managing power supplied to a linear radio frequency power amplifier according to an alternate embodiment of the pseudo-envelope follower power management system.
Figure 2A:
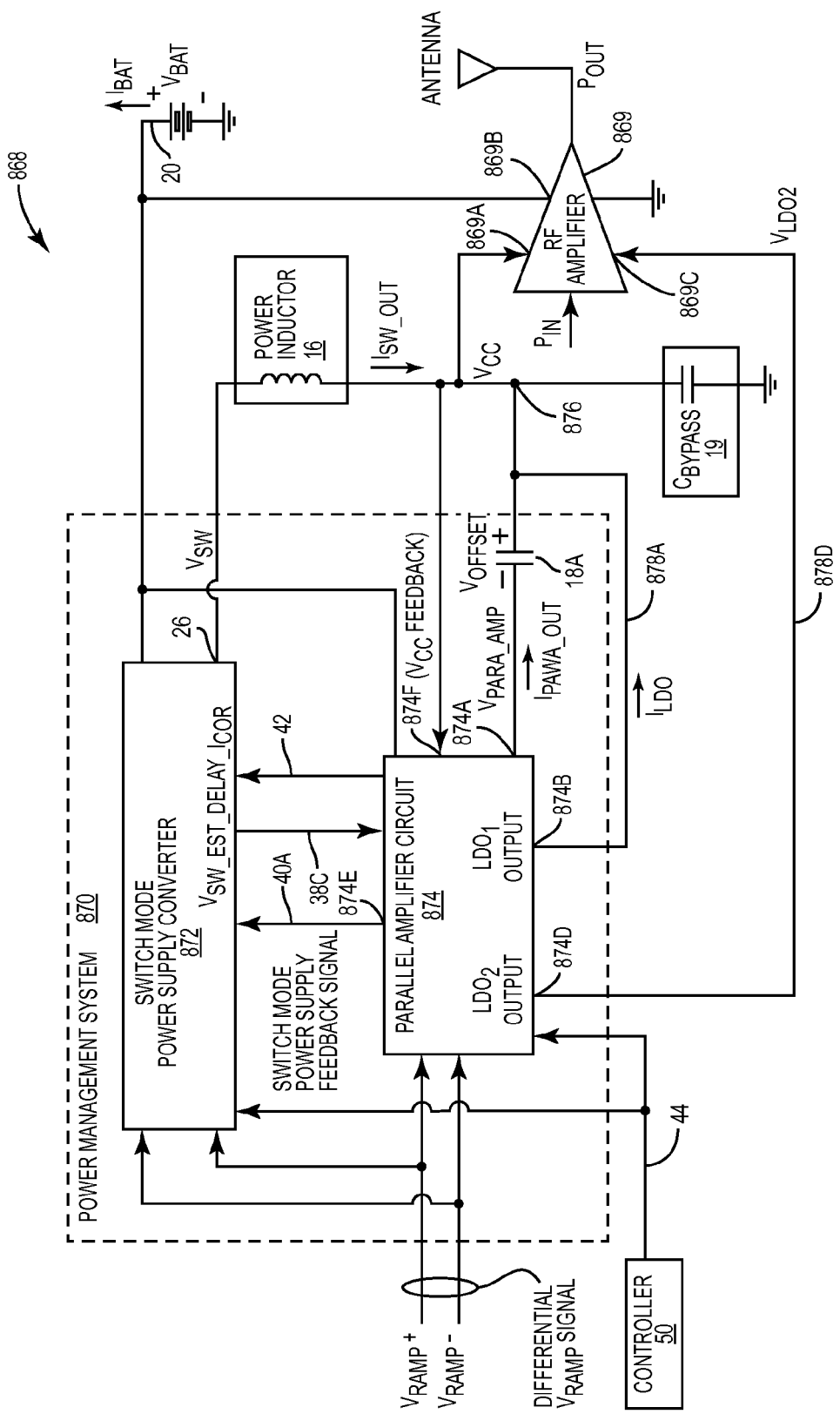
FIG. 2A depicts one embodiment of a pseudo-envelope tracking modulated power supply system according to one embodiment of the pseudo-envelope tracking modulated power supply system.

FIG. 1A depicts an embodiment of a pseudo-envelope follower power management system 10A for managing power supplied to a linear radio frequency power amplifier 22 according to one embodiment of the pseudo-envelope follower power management system 10A. FIG. 1B depicts an embodiment of the pseudo-envelope follower power management system 10B for managing power supplied to the linear radio frequency power amplifier 22 according to an alternate embodiment of the pseudo-envelope follower power management system 10B. As such, FIGS. 1A and 2A depict an example embodiment of pseudo-envelope follower power management system 10A including a multi-level charge pump buck converter 12, a parallel amplifier circuit 14, a power inductor 16, a coupling circuit 18, and a bypass capacitor 19. The bypass capacitor 19 has a bypass capacitor capacitance, $C_{BYPASS}$.

The multi-level charge pump buck converter 12 and the parallel amplifier circuit 14 may be configured to operate in tandem to generate a power amplifier supply voltage, $V_{CC}$, at a power amplifier supply output 28 of the pseudo-envelope follower power management system 10A for a linear radio frequency power amplifier 22. The power amplifier supply voltage, $V_{CC}$, may also be referred to as a modulated power supply voltage, $V_{CC}$. The power amplifier supply output 28 provides an output current, $I_{OUT}$, to the linear radio frequency power amplifier 22. The linear radio frequency power amplifier 22 may include a radio frequency power amplifier input configured to receive a modulated radio frequency input signal having an input power $P_{IN}$. The linear radio frequency power amplifier 22 may further include a radio frequency power amplifier output coupled to an output load, $Z_{LOAD}$. The radio frequency power amplifier 22 may generate an amplified modulated radio frequency output signal having an output power $P_{OUT}$ in response to the modulated radio frequency input signal having the input power $P_{IN}$.

As an example, the output load, $Z_{LOAD}$, may be an antenna. The radio frequency power amplifier output may generate the amplified modulated radio frequency output signal as a function of the modulated radio frequency input signal and the power amplifier supply voltage, $V_{CC}$. In some embodiments, the power amplifier supply voltage, $V_{CC}$, may be modulated to substantially follow the signal envelope characteristic of the modulated radio frequency input signal to improve the power efficiency of the pseudo-envelope follower power management system 10A. The modulated radio frequency output signal may be provided to the antenna for transmission. The multi-level charge pump buck converter 12 may include a supply input 24, ($V_{BAT}$), configured to receive a battery voltage, $V_{BAT}$, from a battery 20 and a switching voltage output 26 configured to provide a switching voltage, $V_{SW}$. The switching voltage output 26 may be coupled to the power amplifier supply output 28 by the power inductor 16, where the power inductor 16 couples to a bypass capacitor 19 to form an output filter 29 for the switching voltage output 26 of the multi-level charge pump buck converter 12. As such, the power inductor 16 is coupled between the switching voltage output 26 and the power amplifier supply output 28. The power inductor 16 provides a power inductor current, $I_{SW\_OUT}$, to the power amplifier supply output 28. The parallel amplifier circuit 14 may include a parallel amplifier supply input 30 configured to receive the battery voltage, $V_{BAT}$, from the battery 20, a parallel amplifier output 32A, a first control input 34 configured to receive a $V_{RAMP}$ signal, and a second control input configured to receive the power amplifier supply voltage, $V_{CC}$. The parallel amplifier output 32A of the parallel amplifier circuit 14 may be coupled to the power amplifier supply voltage $V_{CC}$, by a coupling circuit 18. The parallel amplifier output voltage, $V_{PARA\_AMP}$, is provided by the parallel amplifier circuit 14.

As an example, the parallel amplifier circuit 14 may generate the parallel amplifier output voltage, $V_{PARA\_AMP}$, based on the difference between the $V_{RAMP}$ signal and the power amplifier supply voltage, $V_{CC}$. Thus, the $V_{RAMP}$ signal may represent either an analog or digital signal that contains the required supply modulation information for a power amplifier collector of a linear radio frequency power amplifier. Typically, the $V_{RAMP}$ signal is provided to the parallel amplifier circuit 14 as a differential analog signal to provide common mode rejection against any noise or spurs that could appear on this signal. The $V_{RAMP}$ signal may be a time domain signal, $V_{RAMP}(t)$, generated by a transceiver or modem and used to transmit radio-frequency (RF) signals. For example, the $V_{RAMP}$ signal may be generated by a digital baseband processing portion of the transceiver or modem, where the digital $V_{RAMP}$ signal, $V_{RAMP\_DIGITAL}$, is digital-to-analog converted to form the $V_{RAMP}$ signal in the analog domain. In some embodiments, the "analog" $V_{RAMP}$ signal is a differential signal. The transceiver or a modem may generate the $V_{RAMP}$ signal based upon a known radio frequency modulation Amp(t)*cos(2*pi*$f_{RF}$*t+Phase(t)). The $V_{RAMP}$ signal may represent the target voltage for the power amplifier supply voltage, $V_{CC}$, to be generated at the power amplifier supply output 28 of the pseudo-envelope follower power management system 10A, where the pseudo-envelope follower power management system 10A provides the power amplifier supply voltage, $V_{CC}$, to the linear radio frequency power amplifier 22. Also the $V_{RAMP}$ signal may be generated from a detector coupled to the radio frequency input power amplifier.

For example, the parallel amplifier circuit 14 includes a parallel amplifier output 32A that provides a parallel amplifier output voltage, $V_{PARA\_AMP}$, to the coupling circuit 18. The parallel amplifier output 32A sources a parallel amplifier circuit output current, $I_{PAWA\_OUT}$, to the coupling circuit 18. The parallel amplifier circuit 14, depicted in FIG. 1A and FIG. 1B, may provide a parallel amplifier circuit output current estimate 40, $I_{PAWA\_OUT\_EST}$, to the multi-level charge pump buck converter 12 as an estimate of the parallel amplifier circuit output current $I_{PAWA\_OUT}$, of the parallel amplifier circuit 14. Thus, the parallel amplifier circuit output current estimate 40, $I_{PAWA\_OUT\_EST}$, represents an estimate of the parallel amplifier circuit output current $I_{PAWA\_OUT}$, provided by the parallel amplifier circuit as a feedback signal to the multi-level charge pump buck converter 12. Based on the parallel amplifier circuit output current estimate 40, $I_{PAWA\_OUT\_EST}$, multi-level charge pump buck converter 12 may be configured to control the switching voltage, $V_{SW}$, provided at the switching voltage output 26 of the multi-level charge pump buck converter 12.

In some embodiments of the pseudo-envelope follower power management system 10A, depicted in FIG. 1A, and the pseudo-envelope follower power management system 10B, depicted in FIG. 1B, the coupling circuit 18 may be an offset capacitor, $C_{OFFSET}$. An offset voltage, $V_{OFFSET}$, may be developed across the coupling circuit 18. In other alternative embodiments, the coupling circuit may be a wire trace such that the offset voltage, $V_{OFFSET}$, between the parallel amplifier output voltage, $V_{PARA\_AMP}$, and the power amplifier supply voltage output, $V_{CC}$, is zero volts. In still other embodiments, the coupling circuit may be a transformer.

FIG. 2A depicts one embodiment of a pseudo-envelope tracking modulated power supply system 868 according to one embodiment of the pseudo-envelope tracking modulated power supply system 868.

Figure 2B:
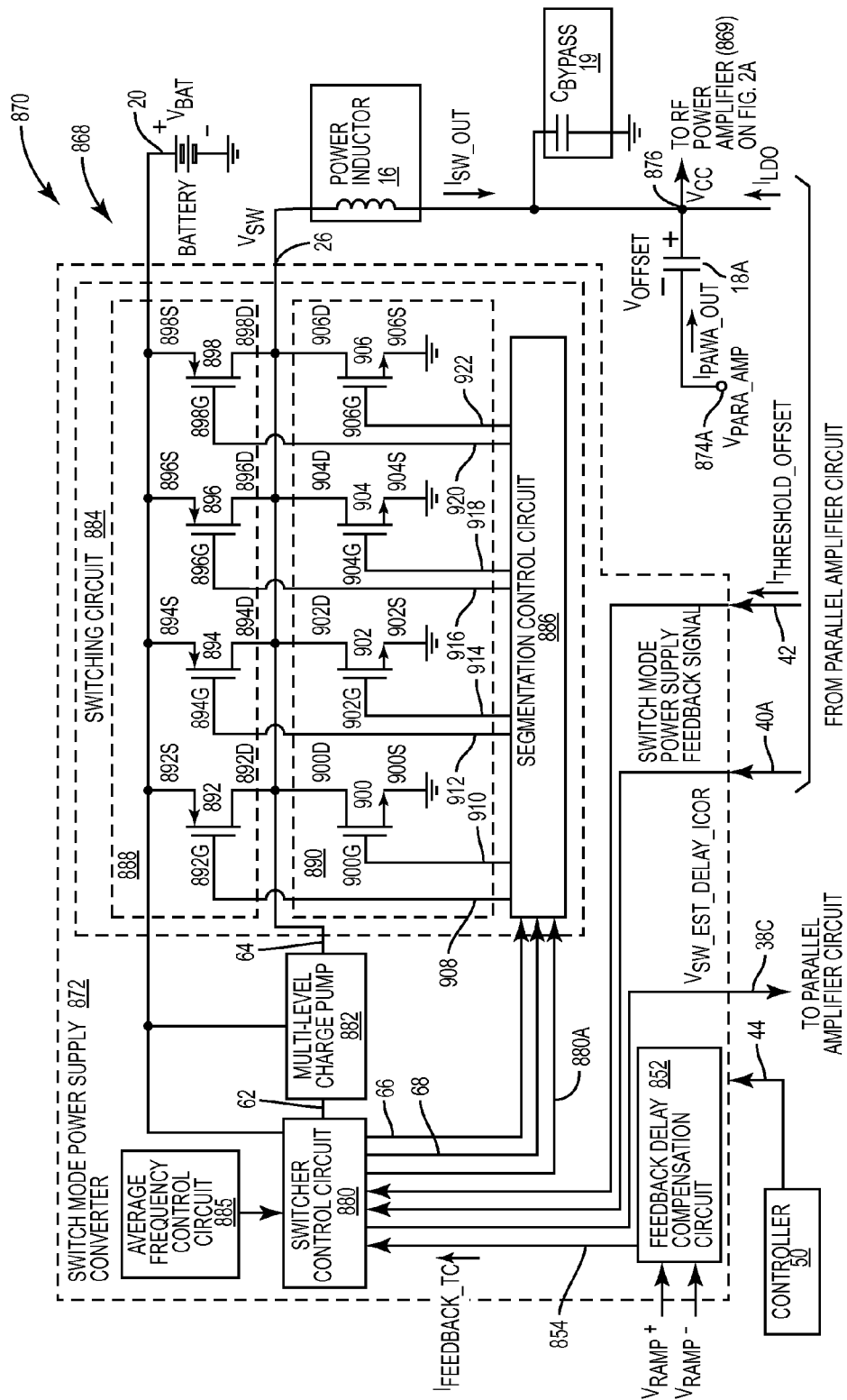
FIG. 2B depicts one embodiment of a pseudo-envelope tracking modulated power supply system according to an alternate embodiment of the pseudo-envelope tracking modulated power supply system.

FIG. 2B depicts one embodiment of a pseudo-envelope tracking modulated power supply system 868 according to an alternate embodiment of the pseudo-envelope tracking modulated power supply system 868.

Figure 2C:
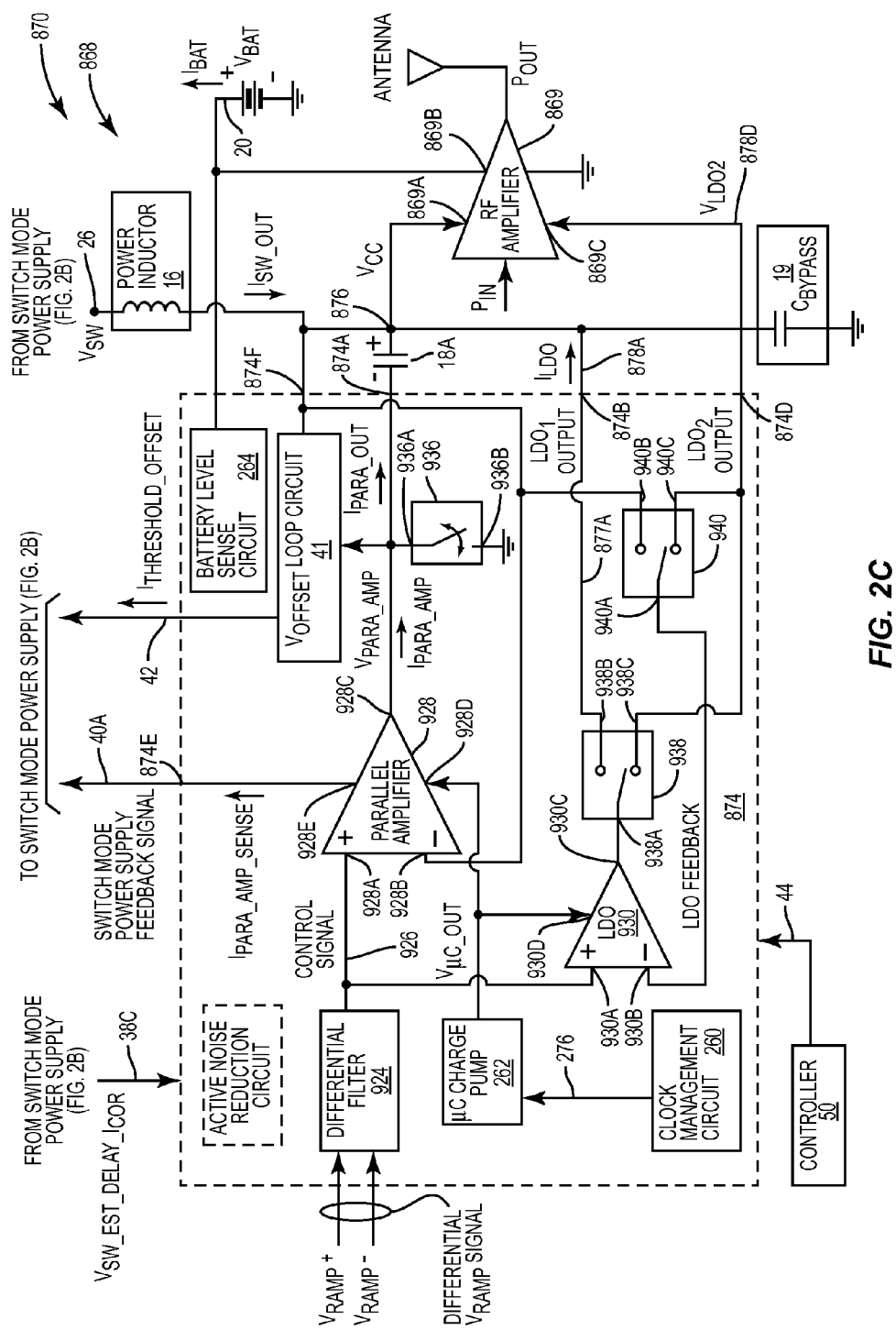
FIG. 2C depicts one embodiment of a pseudo-envelope tracking modulated power supply system according to an additional embodiment of the pseudo-envelope tracking modulated power supply system.

FIG. 2C depicts one embodiment of a pseudo-envelope tracking modulated power supply system 868 according to an additional embodiment of the pseudo-envelope tracking modulated power supply system 868.

FIG. 2A depicts a high level illustration of a pseudo-envelope tracking modulated power supply system 868 that may include a radio frequency power amplifier 869 configured to be powered by or under the control of a power management system 870. The power amplifier supply voltage, $V_{CC}$, may also be referred to as a modulated power supply voltage, $V_{CC}$, that is generated at a modulated power supply output 876.

Similar to other previously described switch mode power supply converters, multi-level charge pump buck converters, and parallel amplifier circuits, the switch mode power supply converter 872 and the parallel amplifier circuit 874 may be configured to receive an input supply voltage from a battery 20. The battery 20 may provide a supply voltage substantially equal to the battery voltage, $V_{BAT}$.

For the sake of simplicity of description, and not by way of limitation, the pseudo-envelope tracking modulated power supply system 868 may include a controller 50 coupled via a control bus 44 to the switch mode power supply converter 872 and the parallel amplifier circuit 874. The switch mode power supply converter 872 may be arranged to cooperatively operate with a parallel amplifier circuit 874 to generate the modulated power supply voltage, $V_{CC}$, at the modulated power supply output 876. For example, in some embodiments, the controller 50 may configure the switch mode power supply converter 872 and the parallel amplifier circuit 874 to operate in various power level modulation modes, depending upon the expected output power to be generated by the radio frequency power amplifier 869 during a transmission of information. In some embodiments, the control functions described with respect to the controller 50 may be incorporated into a digital baseband modem or transceiver circuit that provides a differential $V_{RAMP}$ signal as a control signal to the power management system 870 based on a radio frequency input signal provided to the radio frequency power amplifier 869 for transmission.

The power management system 870 may be configured to receive a differential $V_{RAMP}$ signal having a non-inverted $V_{RAMP}$ signal component, $V_{RAMP}+$, and an inverted $V_{RAMP}$ signal component, $V_{RAMP}-$. In some alternative embodiments, the power management system 870 may be configured to receive a $V_{RAMP}$ signal that is a single ended $V_{RAMP}$ signal, a differential $V_{RAMP}$ signal, and/or both the single ended $V_{RAMP}$ signal and the differential $V_{RAMP}$ signal. The differential $V_{RAMP}$ signal may be provided as a control signal to govern generation of the modulated power supply voltage, $V_{CC}$. Illustratively, the switch mode power supply converter 872 and the parallel amplifier circuit 874 may each be configured to receive the differential $V_{RAMP}$ signal.

The switch mode power supply converter 872 may include the switching voltage output 26 in communication with the modulated power supply output 876. A power inductor 16 may be coupled between the switching voltage output 26 and the modulated power supply output 876.

The parallel amplifier circuit 874 may include a parallel amplifier circuit output 874A in communication with the modulated power supply output 876. Illustratively, in some embodiments, a coupling capacitor 18A is coupled between the modulated power supply output 876 and the parallel amplifier circuit output 874A. In addition, the parallel amplifier circuit 874 may also include a first linear regulator output 874B, $LDO_1$ OUTPUT, in communication with the modulated power supply output 876. In some power level modulation modes, the power management system 870 may configure the first linear regulator output 874B, $LDO_1$ OUTPUT, to provide a high impedance path with respect to ground. In other power level modulation modes, the power management system 870 may configure the first linear regulator output 874B, $LDO_1$ OUTPUT, to apply a first linear regulator output current 878A, $I_{LDO}$, to the modulated power supply output 876 to regulate the modulated power supply voltage, $V_{CC}$.

The parallel amplifier circuit 874 may also include a second linear regulator output 874D, $LDO_2$ OUTPUT, in communication with a CMOS logic supply input 869C. In some power level modulation modes, the power management system 870 may configure the second linear regulator output 874D, LDO₂ OUTPUT, to provide a second linear regulator output voltage, $V_{LDO2}$, to the CMOS logic supply input 869C as a function of the battery voltage, $V_{BAT}$. As an example, the CMOS logic supply input 869C include a minimum CMOS logic supply voltage threshold. Accordingly, the power management system 870 may configure the second linear regulator output 874D, LDO₂ OUTPUT, to provide a second linear regulator output voltage, $V_{LDO2}$, to the CMOS logic supply input 869C that is at least equal to the minimum CMOS logic supply voltage threshold.

The parallel amplifier circuit 874 may also include a switch mode power supply converter control output 874E configured to output a switch mode power supply feedback signal 2A to the switch mode power supply converter 872, depicted in FIG. 2B. In addition, the parallel amplifier circuit 874 may provide a threshold offset current 42, $I_{THRESHOLD\_OFFSET}$, to the switch mode power supply converter 872. The parallel amplifier circuit 874 may receive the modulated power supply voltage, $V_{CC}$, from the modulated power supply output 876 at a modulated power supply voltage feedback input 874F. The parallel amplifier circuit 874F may use the input to the power supply voltage feedback input 874F as a feedback signal to regulate the modulated power supply voltage, $V_{CC}$.

In some embodiments, the radio frequency power amplifier 869 may be a linear radio frequency power amplifier. The radio frequency power amplifier 869 may include a radio frequency power amplifier input configured to receive a modulated radio frequency input signal from a digital baseband processing portion of the transceiver or modem, where the modulated radio frequency input signal has an input power, $P_{IN}$. In addition, the radio frequency power amplifier 869 may also include a radio frequency power amplifier output in communication with an antenna via the radio frequency duplexer and switch (not shown). The radio frequency power amplifier 869 may generate an amplified modulated radio frequency output signal having an output power $P_{OUT}$ at the radio frequency power amplifier output.

In some embodiments, the radio frequency power amplifier 869 may include a collector voltage supply input 869A configured to receive the modulated power supply voltage, $V_{CC}$, from the modulated power supply output 876. The radio frequency power amplifier 869 may further include a battery voltage supply input 869B configured to receive the battery voltage, $V_{BAT}$, from the battery 20. The radio frequency power amplifier 869 may also include a CMOS logic supply input 869C configured to receive a second linear regulator output voltage, $V_{LDO2}$.

In some embodiments of the power management system 870, the power management system 870 may be configured to operate in various power level modulation modes based on an expected output power to be generated by the radio frequency power amplifier 869 during a data transmission. In addition, the power management system 870 may be reconfigured prior to each data transmission to minimize the energy drawn from the battery 20 during the data transmission. For example, some embodiments of the power management system 870 may be configured to operate in one of many power level modulation modes on a data transmission slot by data transmission slot basis.

As a non-limiting list of example power level modulation modes of operation, the power management system 870 may be configured to operate in a set of power level modulation modes including a high power modulation mode, a medium power modulation mode, and lower power modulation mode.

As another example, in other embodiments, the power management system 870 may be configured to operate in a set of power level modulation modes including a high power modulation mode, a medium power modulation mode, a medium power average power tracking modulation modes, and a low power average power tracking modulation mode. In other embodiments, the medium power average power tracking modulation modes are omitted.

As a further example, in a slow tracking mode of operation, the power management system 870 may disable the switch mode power supply converter 872, and configure the parallel amplifier circuit 874 to track an envelope of a modulated radio frequency input signal to be transmitted by the radio frequency power amplifier 869 as a function of a slowly modulated or unmodulated differential $V_{RAMP}$ signal. In the no tracking mode of operation, the power management system 870 may further configure the parallel amplifier circuit 874 to provide a modulated power supply output voltage, $V_{CC}$, based on a substantially unmodulated differential $V_{RAMP}$ signal. In the no tracking mode, the power management system 870 may be configured to generate a modulated power supply output voltage, $V_{CC}$ that has a substantially fixed voltage level. In the slow tracking mode of operation, the parallel amplifier circuit 874 may be configured to slowly track the envelope differential $V_{RAMP}$ signal.

To minimize energy consumed from the battery during a data transmission, the power management system 870 may enable and disable various elements and signal processing functions of the switch mode power supply converter 872 and the parallel amplifier circuit 874 as a function of the power level modulation mode of operation. In some embodiments, the power management system 870 may disable the least energy efficient element and signal processing functions as a function of the expected output power to be generated by the radio frequency power amplifier 869. For example, the power management system 870 may disable portions of the switch mode power supply converter 872, the parallel amplifier circuit 874, and/or a combination thereof as the expected output power of the radio frequency power amplifier 869 decreases to achieve an overall decrease in energy consumption from the battery during a data transmission. In addition, some embodiments of the power management system 870 may generate the modulated power supply output 876 using a less energy efficient device or power generation circuit in response to an expected output power of the radio frequency power amplifier 869 falling below a lower power modulation mode threshold in order to disable other energy consuming circuitry and achieve an overall reduction in energy drawn from the battery 20 during a data transmission.

As a non-limiting example, in some embodiments of the high power level modulation mode and the medium power modulation mode, the power management system 870 may configure the switch mode power supply converter 872 and the parallel amplifier circuit 874 to generate the modulated power supply voltage, $V_{CC}$, based on the differential $V_{RAMP}$ signal as a function of the expected output power to be generated by the radio frequency power amplifier 869 during the data transmission. As an example, in some embodiments of the high power modulation mode and the medium power modulation mode, the parallel amplifier circuit 874 may be configured to govern the operation of the switch mode power supply converter 872, regulate generation of the modulated power supply voltage, $V_{CC}$, as a function of the differential $V_{RAMP}$ signal, and regulate the offset voltage, $V_{OFFSET}$, across the coupling capacitor 18A. In one embodiment of the switch mode power supply converter 872, during the high power modulation mode, the switch mode power supply converter 872 boosts the power amplifier supply voltage, $V_{CC}$, above the battery voltage, $V_{BAT}$.

In general, in one embodiment of the pseudo-envelope tracking modulated power supply system 868, during the high power modulation mode and the medium power modulation mode, the power amplifier supply voltage, $V_{CC}$, is modulated and provides envelope tracking. Further, during the low power average power tracking mode, the power amplifier supply voltage, $V_{CC}$, is not modulated and provides average power tracking. In this regard, during the low power average power tracking mode, a magnitude of the power amplifier supply voltage, $V_{CC}$, is adjustable based on an expected output power from the radio frequency power amplifier 869.

As an example, the parallel amplifier circuit 874 may be configured to apply a parallel amplifier output current, $I_{PAWA\_OUT}$, from the parallel amplifier to regulate the modulated power supply voltage, $V_{CC}$, as a function of the differential $V_{RAMP}$ signal. The parallel amplifier circuit may provide the switch mode power supply feedback signal 40A and a threshold offset current 42, $I_{THRESHOLD\_OFFSET}$, to govern the operation of the switch mode power supply converter 872 and regulate the offset voltage, $V_{OFFSET}$, across the coupling capacitor 18A. In response to the switch mode power supply feedback signal 40A and a threshold offset current 42, $I_{THRESHOLD\_OFFSET}$, and the differential $V_{RAMP}$ signal, the switch mode power supply converter 872 may generate the switching voltage, $V_{SW}$, at the switching voltage output 26, and provide a delayed $I_{COR}$ estimated switching voltage output 38C, $V_{SW\_EST\_DELAY\_ICOR}$, to the parallel amplifier circuit 874. In addition, the parallel amplifier circuit 874 may configure the first linear regulator output 874B, $LDO_1$ OUTPUT, to provide a high impedance path to ground. Depending on the battery voltage, $V_{BAT}$, the parallel amplifier circuit 874 may configure the second linear regulator output 874D, $LDO_2$ OUTPUT, to provide the second linear regulator output voltage, $V_{LDO2}$, at least equal to the minimum CMOS logic supply voltage to the CMOS logic supply input 869C of the radio frequency power amplifier 869.

As another non-limiting example, in some embodiments of the low power modulation mode, the power management system 870 may disable the switch mode power supply converter 872 and configure the switching voltage output 26 to provide a high impedance path to ground. In addition, the parallel amplifier circuit output 874A may be configured to provide a low impedance path to ground to short the negative terminal of the coupling capacitor 18A to ground.

To generate the modulated power supply voltage, $V_{CC}$, the first linear regulator output 874B, $LDO_1$ OUTPUT, may be configured to apply a linear regulator output current, $I_{LDO}$, to the modulated power supply output 876 as a function of the differential $V_{RAMP}$ signal and a selected tracking mode of operation. The differential $V_{RAMP}$ signal may be substantially constant or only slowly modulated during the data transmission. In the case where the differential $V_{RAMP}$ signal is substantially constant, the power management system 870 may configure the parallel amplifier circuit 874 to operate in a no tracking mode of operation. In the no tracking mode of operation, the first linear regulator output 874B, $LDO_1$ OUTPUT, may regulate the modulated power supply voltage, $V_{CC}$, to be substantially constant or unmodulated during data transmission. Alternatively, in the case where the differential $V_{RAMP}$ signal slowly changes relative to the envelope of the radio frequency input signal provided to the radio frequency power amplifier 869, the power management system 870 may configure the first linear regulator output 874B, $LDO_1$ OUTPUT, to slowly track the differential $V_{RAMP}$ signal during the data transmission.

In some embodiments of the low power modulation mode, the parallel amplifier circuit 874 may disable the second linear regulator output 874D, $LDO_2$ OUTPUT. In some alternative embodiments of the low power modulation mode, the parallel amplifier circuit 874 may configure the second linear regulator output 874D, $LDO_2$ OUTPUT, to selectively output a second linear regulator output voltage, $V_{LDO2}$, to a CMOS logic supply input 869C as a function of the battery voltage, $V_{BAT}$.

FIG. 2B depicts a non-limiting example of the embodiments of the switch mode power supply converter 872 that may be selectively configured to operate in a number of various buck converter modes, a number of various envelope tracking modes, a number of various average power tracking modes, and/or a combination thereof as a function of an expected output power to be generated by the radio frequency power amplifiers 869 depicted FIGS. 2A and 2C. The switch mode power supply converter 872 may further include an off mode. The various embodiments of the switch mode power supply converter 872 are described with continuing reference to the various embodiments of the power management system 870, depicted in FIGS. 2A-C.

As an example, the various envelope tracking modes may include one or more envelope tracking power modes of operation including the high power modulation mode and the medium power modulation mode. As another example, the various average power tracking modes may include one or more average power tracking modes of operation include a medium power average power tracking mode and a low power average power tracking mode. In one embodiment of the pseudo-envelope tracking modulated power supply system 868, the pseudo-envelope tracking modulated power supply system 868 operates in one of the high power modulation mode, the medium power modulation mode, and the low power average power tracking mode. The pseudo-envelope tracking modulated power supply system 868 provides envelope tracking using the power amplifier supply voltage, $V_{CC}$, during the high power modulation mode and the medium power modulation mode. Further, the pseudo-envelope tracking modulated power supply system 868 provides average power tracking during the low power average power tracking mode.

In one embodiment of the pseudo-envelope tracking modulated power supply system 868, the pseudo-envelope tracking modulated power supply system 868 sequentially transmits multiple communications slots. As such, selection of the one of the high power modulation mode, the medium power modulation mode, and the low power average power tracking mode is based on an expected output power from the radio frequency power amplifier 869 and is made on a communications slot to communications slot basis.

The controller 50 may configure the switch mode power supply converter 872 to operate in the medium power average power tracking mode when the power management systems 870A-C and 870E-H are configured to operate in a medium power average power tracking modulation mode. The controller 50 may configure the switch mode power supply converter 872 to be in a high power modulation mode when the power management system 870 is configured to operate in the high power modulation mode. The controller 50 may configure the switch mode power supply converter 872 to be in a medium power modulation mode when the power management system 870 is configured to operate in the medium power modulation mode. The controller 50 may configure the switch mode power supply converter 872 to be in an off mode when the power management systems 870 is configured to operate in either a low power modulation mode or a low power average power tracking mode.

The switch mode power supply converter 872 may include embodiments of a switcher control circuit 880, the multi-level charge pump 882, a switching circuit 884, and an average frequency control circuit 885. The switcher control circuit 880, the multi-level charge pump 882, the switching circuit 884, and the feedback delay compensation circuit 852 may be configured to receive the battery voltage, $V_{BAT}$. Some embodiments of the switch mode power supply converter 872 may further include the feedback delay compensation circuit 852. The controller 50 may configure the switcher control circuit 880 to govern the operation of the multi-level charge pump 882 and the switching circuit 884 as a function of the power level modulation mode and the expected output power to be generated by the embodiments of the radio frequency power amplifier 869 in response to a modulated radio frequency input signal to be transmitted. In some embodiments, the switcher control circuit 880 may also be configured to control the operation of the feedback delay compensation circuit 852 as a function of the power level modulation mode and the expected output power of the radio frequency power amplifier 869. In addition, in some embodiments, the feedback delay compensation circuit 852 may generate the feedback delay compensation signal 854, $I_{FEEDBACK\_TC}$, as a function of the power level modulation mode and the expected output power of the radio frequency power amplifier 869.

As a non-limiting example, in the high power modulation mode, the controller 50 or the switcher control circuit 880 may configure the feedback delay compensation circuit 852 to operate as a function of a high power mode apparent gain to increase the aggressiveness of the feedback compensation provided by the feedback delay compensation signal 854, $I_{FEEDBACK\_TC}$. As the apparent gain of the feedback delay compensation circuit 852 is increased, the switch mode power supply converter 972 may respond to a change in the target voltage for the modulated power supply voltage, $V_{CC}$, provided by the differential $V_{RAMP}$ circuit, which may increase the power efficiency of the various embodiments of the parallel amplifier 928, depicted in FIG. 2C.

In the medium power modulation mode, the controller 50 or the switcher control circuit 880 may configure the feedback delay compensation circuit 852 to operate as a function of a medium power mode apparent gain to decrease the aggressiveness of the feedback compensation provided by the feedback delay compensation signal 854, $I_{FEEDBACK\_TC}$, in order to prevent the switcher control circuit 880 from prematurely changing the switching voltage, $V_{SW}$. The feedback delay compensation circuit 852 may operate in an over aggressive manner when the apparent gain is set too high with respect to the expected output power to be generated by the radio frequency power amplifier 869 or 869' during a data transmission. Over aggressiveness of feedback compensation provided by the feedback delay compensation circuit 852 may result in pre-mature changes the switching voltage, $V_{SW}$, because the switch mode power supply converter 972 may overreact to a change in the target voltage for the modulated power supply voltage, $V_{CC}$, provided by the differential $V_{RAMP}$ circuit. As a result, the switch mode power supply converter 872 may generate a switching voltage that provides too much or too little energy to the modulated power supply voltage, which may decrease the power efficiency of the various embodiments of the parallel amplifier 928, depicted in FIG. 2C.

In some embodiments of the medium power modulation mode, the controller 50 may set the apparent gain of the feedback delay compensation circuit 852 based on a sliding scale as a function of the expected output power to be generated by the radio frequency power amplifier 869 during the data transmission. As an alternative example, some embodiments of the switcher control circuit 880 may be further configured to adjust the apparent gain of the feedback delay compensation circuit 852 based on a segmentation mode of the switching circuit 884. In some embodiments, the controller 50 or the switcher control circuit 880 may disable the feedback delay compensation circuit 852 during the low power average power tracking mode and during the off mode. Some embodiments of the power manage system 870 may enable the feedback delay compensation circuit 852 in a high power modulation mode and a medium power modulation mode.

In the low power average power tracking mode, the switcher control circuit 880 may disable the multi-level charge pump 882 and the switching circuit 884, and configure the switching voltage output 26 to provide a high impedance path to ground. In the low power average power tracking mode, the switch mode power supply converter 872 may be configured to disable clocking signal that may be used by a µC charge pump circuit 262.

In a buck converter "bang-bang" mode of operation, the switcher control circuit 880 may disable the multi-level charge pump 882, and control the switching circuit 884 to swing the switching voltage, $V_{SW}$, between the battery voltage, $V_{BAT}$, and ground. In the multi-level charge pump buck converter mode, the switcher control circuit 880 may enable both the multi-level charge pump 882 and the switching circuit 884. The switcher control circuit 880 may further control the multi-level charge pump 882 and the switching circuit 884 to generate both buck level voltages and boost level voltages to provide the switching voltage, $V_{SW}$, at the switching voltage output 26 as a function of the operational state of the switcher control circuit 880 and the power level modulation mode.

In a medium power average power tracking mode of operation, the switcher control circuit 880 may be configured to operate in a number of average power tracking "bang-bang" modes of operation. As an example, in some embodiments of an average power tracking "bang-bang" mode of operation, the switcher control circuit 880 may configure the multi-level charge pump 882 and the switching circuit 884 to switch the switching voltage, $V_{SW}$, between only a first bang-bang switching voltage, $V_{SW\_BB1}$, and a second bang-bang switching voltage, $V_{SW\_BB2}$, during a data transmission, where the first bang-bang switching voltage, $V_{SW\_BB1}$, is less than the second bang-bang switching voltage, $V_{SW\_BB2}$.

But unlike a buck converter mode of operation in which the switching voltage swings between ground and the battery supply, $V_{BAT}$, the first bang-bang switching voltage, $V_{SW\_BB1}$, may be substantially equal to ground, the battery voltage, $V_{BAT}$, or a switching voltage between ground and the battery voltage, $V_{BAT}$. The second bang-bang switching voltage, $V_{SW\_BB2}$, may be substantially equal to the supply voltage, $V_{BAT}$, or a charge pump output voltage generated by the multi-level charge pump 882 from the battery voltage, $V_{BAT}$. The average power tracking "bang-bang" modes of operation may include an average power tracking "buck-buck" mode of operation and an average power tracking "buck-boost" mode of operation.

In the average power tracking "buck-buck" mode of operation, the switcher control circuit 880 may configured the multi-level charge pump 882 and the switching circuit 884 to generate a first bang-bang switching voltage, $V_{SW\_BB1}$, and the second bang-bang switching voltage, $V_{SW\_BB2}$, that are no greater than the battery voltage, $V_{BAT}$. For example, the switcher control circuit 880 may configure the multi-level charge pump 882 to generate only a bucked output voltage at the charge pump output 64. As an example, the switcher control circuit may configure the multi-level charge pump 882 to generate a first buck mode output voltage, $V_{FIRST\_BUCK}$, substantially equal to $\frac{1}{2} \times V_{BAT}$ in a first buck mode of operation. In the average power tracking "buck-buck" mode, the switcher control circuit 880 may disable the multi-level charge pump 882 provided the first bang-bang switching voltage, $V_{SW\_BB1}$, and the second bang-bang switching voltage, $V_{SW\_BB2}$, are a shunt mode output voltage substantially equal to ground and a series mode output voltage substantially equal to $V_{BAT}$.

In the average power tracking "buck-boost" mode, the first bang-bang switching voltage, $V_{SW\_BB1}$, may be no greater than the battery voltage, $V_{BAT}$, and the second bang-bang switching voltage, $V_{SW\_BB2}$, is a boost voltage that is greater than the battery voltage, $V_{BAT}$. In the average power tracking "buck-boost" mode, the switcher control circuit 880 may configure the multi-level charge pump 882 and the switching circuit 884 to generate the first bang-bang switching voltage, $V_{SW\_BB1}$. The switcher control circuit 880 may configure the multi-level charge pump 882 to generate the second bang-bang switching voltage, $V_{SW\_BB2}$. A further description of the average power tracking "bang-bang" modes of operation is provided below.

Some embodiments of the switcher control circuit 880 may be configured to form a composite control signal as a function of the various envelope tracking modes, the various average power tracking modes, and buck converter modes. As an example, the various embodiments of the switcher control circuit 880 may combine the various fractional amounts and combinations of the feedback delay compensation signal 854, $I_{FEEDBACK\_TC}$, the switch mode power supply feedback signal 40A, and the threshold offset current 42, $I_{THRESHOLD\_OFFSET}$, to form one or more composite control signals as a function of the power level modulation mode. In some embodiments, the composite control signal may depend on the power level modulation mode.

As an example, FIG. 2C depicts an embodiment of the power management system 870 in which a parallel amplifier 928 may generate the switch mode power supply feedback signal 40A in the high power modulation mode and medium low power modulation mode. In addition, the $V_{OFFSET}$ loop circuit 41 may generate the threshold offset current 42, $I_{THRESHOLD\_OFFSET}$, in the high power modulation mode and the medium power modulation mode.

Returning to FIG. 2B, the switcher control circuit 880 may also provide a series switch control signal 66 and a shunt switch control signal 68 to the switching circuit 884. In response to an assertion of the series switch control signal 66, the switching circuit 884 couples the switching voltage output 26 to the battery voltage, $V_{BAT}$, to generate the switching voltage, $V_{SW}$, substantially equal to $V_{BAT}$. In response to the shunt switch control signal 68, the switching circuit 884 couples the switching voltage output 26 to ground to provide generate the switching voltage, $V_{SW}$, substantially equal to zero volt. In addition, the switcher control circuit 880 provides a segmentation control signal 880A to the switching circuit 884 as a function of the power level modulation mode. In some embodiments, the switcher control circuit 880 may generate the segmentation control signal 880A as a function of the power level modulation mode and the expected output power to be generated by the radio frequency power amplifiers 869 during a data transmission. For example, some embodiments of the power management systems 870 and 870A may be configured to generate the segmentation control signal 880A based on an average expected output power, $P_{OUT\_AVE}$, the radio frequency power amplifier that maximizes the efficiency of the switch mode power supply converter 872.

In general, the switch mode power supply converter 872 has a segmented output stage, such that during the high power modulation mode and the medium power modulation mode, segment selection of the segmented output stage is based on an expected output power from the radio frequency power amplifier 869 to increase efficiency of the pseudo-envelope tracking modulated power supply system 868.

The switcher control circuit 880 may be configured to switch mode power supply converter 872 to generate a switching voltage, $V_{SW}$, at the switching voltage output 26 based on an operational state of the switcher control circuit 880 as a function of a power level modulation mode, which is dependent on the expected output power to be generated by the radio frequency power amplifiers 869 and 869' during a data transmission. In some embodiments, the switcher control circuit 880 may configure the multi-level charge pump 882 and the switching circuit 884 to operate in one of a buck converter "bang-bang" mode, a multi-level charge pump buck converter mode, and an average power tracking mode of operation as a function of the power level modulation mode and operational mode of the switcher control circuit 880.

Referring to FIGS. 2C and 2B, in some embodiments, the control signal 926 received at the non-inverting input of the parallel amplifier 928 to generate the parallel amplifier output current, $I_{PARA\_AMP}$, may be generated by the differential filter 924 as a function of the power level modulation mode. For example, in the high power modulation mode, the differential filter 924 may provide an increased level of frequency compensation or correction as compared to the frequency compensation or correction provided by the differential filter 924 in the medium power modulation mode. Accordingly, some embodiments of the switcher control circuit 880, the switch mode power supply converter 872, the parallel amplifier circuits 874 and/or a combination thereof, may be further adapted to adjust the scaling factor, M, provided to the buffer scalar 434 and/or the magnitude of the delayed $I_{COR}$ estimated switching voltage output 38C, $V_{SW\_EST\_DELAY\_ICOR}$, as a function of the power level modulation mode.

Some alternative embodiments of the switcher control circuit 880, the switch mode power supply converter 872, the parallel amplifier circuits 874 and 874', and/or combinations thereof, may be further configured to adjust the magnitude of the delayed $I_{COR}$ estimated switching voltage output 38C, $V_{SW\_EST\_DELAY\_ICOR}$, based on the magnitude of the control signal 926 that is received by at the non-inverting input of the parallel amplifier 928, which is generated by the differential filter 924. In some embodiments, the switcher control circuit 880 may selectively adjust the scaling factor, M, as a function of the magnitude of the differential $V_{RAMP}$ signal and the power level modulation mode. For example, in some embodiments of the switcher control circuit 880, the scaling factor, M, may be further adjusted as a function of the power level modulation mode to reflect the amount of frequency compensation or correction applied by the differential filter 924 to generate the control signal 926 received at the non-inverting input 928A of the parallel amplifier 928, depicted in FIG. 2C.

In some embodiments of the power management system 870, either the switch mode power supply converter 872 or the parallel amplifier circuit 874 may be further adapted to adjust the scaling factor, M, based on the magnitude of the control signal 926 or the power level modulation mode. For example, in some embodiments, the magnitude of the delayed $I_{COR}$ estimated switching voltage output 38C, $V_{SW\_EST\_DELAY\_ICOR}$, used by the open loop ripple compensation assist circuit 414 may be adjusted as a function of the power level modulation mode, the magnitude of the differential $V_{RAMP}$ signal, and the expected frequency response of the parallel amplifier 928 when operating in each of the respective power level modulation modes.

For example, the switcher propagation delay is a time period between when the state of the switcher control circuit 880 changes to a new operational state and the switching voltage, $V_{SW}$, generated in response to the new operational state of the switcher control circuit 880 is generated at the switching voltage output 26. In some embodiments of the switch mode power supply converter 872, the switcher propagation delay may vary based on being configured to operate in the envelope tracking mode of operation and the average power tracking mode. Thus, the controller 50 may be configured to adjust the programmable delay period as a function of an expected output power to be generated by the radio frequency power. Alternatively, the switcher control circuit 880 may be configured to adjust the programmable delay period of the programmable delay circuitry 432 as a function of the power level modulation mode.

As another example, in some embodiments, the switching circuit 884 may be a segmented switching circuit having a number of sets of series switch and shunt switch pairs. The sets of series switch and shunt switch pairs may be arranged in parallel and operably coupled to form a segmented series switch and shunt switch network. The switcher control circuit 880 may generate the series switch control signal 66, the shunt switch control signal 68, and the segmentation control signal 880A based on an operational state of the switcher control circuit 880 to control the operation of the switching circuit 884. In addition, the segmentation control signal 880A may be dependent on the power level modulation mode of the power management systems 870 and 870A. For example, the switcher control circuit 880 may configure the segmentation control signal 880A to enable or disable various combinations of the sets of series switch and shunt switch pairs of the switching circuit 884 based on the power level modulation mode of operation of the respective power management system 870, depicted in FIG. 2A-C. As an example, in some embodiments of the medium power modulation mode, the switcher control circuit 880 may generate a segmentation control signal 880A to enable either 75% or 50% of the number of sets of series switch and shunt switch pairs of the switching circuit 884.

In some embodiments of the switching circuit 884, the switcher propagation delay may vary depending on the number of sets of series switch and shunt switch pairs are configured to operate during a data transmission. In some embodiments, the switcher control circuit 880 may be configured to adjust the programmable delay period of the programmable delay circuitry 432 depending on the segmentation control signal 880A to maintain the temporal alignment of the delayed $I_{COR}$ estimated switching voltage output 38C with respect to the switching voltage, $V_{SW}$, provided at the switching voltage output 26.

The switching circuit 884 may include a segmentation control circuit 886 configured to receive a segmentation control signal 880A from the switcher control circuit 880. The switching circuit 884 may further include segmented series switches 888 and segmented shunt switches 890 in communication with the segmentation control circuit 886. The segmented series switches 888 may include a first series switch 892, a second series switch 894, a third series switch 896, and the fourth series switch 898. The segmented shunt switches 890 may include a first shunt switch 900, a second shunt switch 902, a third shunt switch 904, and a fourth shunt switch 906.

A source 892S of the first series switch 892, a source 894S of the second series switch 894, a source 896S of the third series switch 896, and a source 898S of the fourth series switch 898 are in communication with a supply voltage received from the battery 20 substantially equal to the battery voltage, $V_{BAT}$. A drain 892D of the first series switch 892, a drain 894D of the second series switch 894, a drain 896D of the third series switch 896, and a drain 898D of the fourth series switch 898 are respectively coupled to a drain 900D of the first shunt switch 900, a drain 902D of the second shunt switch 902, a drain 904D of the third shunt switch 904, and a drain 906D of the fourth shunt switch 906 to form the switching voltage output 26. A source 900S of the first shunt switch 900, a source 902S of the second shunt switch 902, a source 904S of the third shunt switch 904, and the source 906S of the fourth shunt switch 906 are in communication with a reference voltage substantially equal to ground.

The segmentation control circuit 886 may include a first series switch control output 908 coupled to the gate 892G of the first series switch 892, a first shunt switch control output 910 coupled to the gate 900G of the first shunt switch 900, a second series switch control output 912 coupled to the gate 894G of the second series switch 894, a second shunt switch control output 914 coupled to the gate 902G of the second shunt switch 902, a third series switch control output 916 coupled to the gate 896G of the third series switch 896, a third shot control output 918 coupled to the gate 904G of the third shunt switch 904, a fourth series switch control output 920 couple to the gate 898G of the fourth series switch 898, and a fourth shunt switch control output 992 coupled to the gate 906G of the fourth shunt switch 906.

Operationally, the segmentation control circuit 886 may divide the segmented series switches 888 and segmented shunt switches 890 into logical groupings of sets of series and shunt switches such that each set of series and shunt switches includes one of the segmented series switches 888 and one of the segmented shunt switches 890. For example, a first set of series and shunt switches may include a first series switch 892 and the first shunt switch 900. A second set of series and shunt switches may include the second series switch 894 and the second shunt switch 902. A third set of series and shunt switches may include the third series switch 896 and the third shunt switch 904. The forth set of series and shunt switches may include the fourth series switch 898 and the fourth shunt switch 906.

The segmentation control circuit 886 is configured to receive a series switch control signal 66 and a shunt switch control signal 68 from the switcher control circuit 880. The power management system 870 may configure the switcher control circuit 880 to generate a segmentation control signal 880A to select which of the segmented series switches 888 and segmented shunt switches 890 are to be enabled by the segmentation control circuit 886 to generate the switching voltage, $V_{SW}$, at the switching voltage output 26 as a function of the average expected output power, $P_{OUT\_AVE}$, to be generated by the radio frequency power amplifier 869 during the data transmission. Illustratively, in the case where there are four sets of series and shunt switches, the operation of the segmentation control circuit 886 may be divided into four regions or modes of operation.

In some embodiments, the switcher control circuit 880 may determine generate the segmentation control signal 800A as a function of the average expected output power, $P_{OUT\_AVE}$, and a set of switcher output power thresholds including a first switcher output power threshold, $P_{OUT1}$, a second switcher output power threshold, $P_{OUT2}$, and a third switcher output power threshold, $P_{OUT3}$. The values of the first switcher output power threshold, $P_{OUT1}$, the second switcher output power threshold, $P_{OUT2}$, and the third switcher output power threshold, $P_{OUT3}$, may be determined to maximize the efficiency of the switch mode power supply converter 872 with respect to the expected output power of the radio frequency power amplifier as a function of the power level modulation mode and the expected load line, $R_{RF\_AMP\_EXP}$, of the radio frequency power amplifier 869 or 869' during the data transmission.

In the case where the average expected output power, $P_{OUT\_AVE}$, of the radio frequency power amplifier is at least equal to the first switcher output power threshold, $P_{OUT1}$, the segmentation control signal 880A may configure the segmentation control circuit 886 to enable all four of the series switch and shunt switch segments. In the case where the average expected output power, $P_{OUT\_AVE}$, of the radio frequency power amplifier is less than the first switcher output power threshold, $P_{OUT1}$, and at least equal to the second switcher output power threshold, $P_{OUT2}$, the segmentation control signal 880A may configure the segmentation control circuit 886 to enable three of the series switch and shunt switch segments. In the case where the average expected output power, $P_{OUT\_AVE}$, of the radio frequency power amplifier is less than the second switcher output power threshold, $P_{OUT2}$, and at least equal to the third switcher output power threshold, $P_{OUT3}$, the segmentation control signal 880A may configure the segmentation control circuit 886 to enable two of the series switch and shunt switch segments. And in the case where the average expected output power, $P_{OUT\_AVE}$, of the radio frequency power amplifier is less than the third switcher output power threshold, $P_{OUT3}$, the segmentation control signal 880A may configure the segmentation control circuit 886 to enable one of the series switch and shunt switch segments.

The multi-level charge pump 882 may configure the multi-level charge pump switching network to generate a variety of "boost" output voltages and "buck" output voltage as a function of a charge pump mode control signal 60 received from the switcher control circuit 880. Some embodiments of the multi-level charge pump 882 may generate a variety of "boost" output voltages and "buck" output voltage as a multi-level charge pump output voltage, $V_{MLCP}$, in response to the charge pump mode control input 60 generated by the switcher control circuit 52. The multi-level charge pump 882 may provide the multi-level charge pump output voltage, $V_{MLCP}$, to the charge pump output 64, which may be coupled through the switching circuit 884 to the switching voltage output 26.

For example, in a second boost mode of operation, the multi-level charge pump 882 may configure the switching network to generate a second boost mode output voltage, $V_{SECOND\_BOOST}$, substantially equal to $2\times V_{BAT}$ at the charge pump output 64. In a first boost mode of operation, the multi-level charge pump 882 may configure the switching network to generate a first boost mode output voltage at the charge pump output 64 substantially equal to $3/2\times V_{BAT}$. In a first buck mode of operation, the multi-level charge pump 882 may configure the switching network to generate a first buck mode output voltage at the charge pump output 64 substantially equal to $\frac{1}{2}\times V_{BAT}$. In some alternative embodiments, the multi-level charge pump 882 may be configured to generate other ratios of boost mode output voltages and buck mode output voltage.

Some embodiments of the multi-level charge pump 882 may include only two flying capacitors that are coupled in various switching arrangements with respect to each other, the battery voltage, $V_{BAT}$, and the charge pump output 64 to generate the various charge pump output voltages at the charge pump output 64. For example, similar to the μC charge pump circuit 262, some embodiments of the multi-level charge pump 882 may generate various ratios of output voltages that may be provided as a boost output voltage or a buck output voltage to the switching voltage output 26 as the switching voltage, $V_{SW}$. In still other alternative embodiments, the multi-level charge pump 882 may generate a boost output voltage or a buck output voltage with respect to a supply voltage other than the battery voltage, $V_{BAT}$, where the supply voltage may be greater than the battery voltage, $V_{BAT}$, or less than the battery voltage, $V_{BAT}$. In some alternative embodiments, the supply voltage provided to the multi-level charge pump 882 may be a boosted voltage or a bucked voltage derived from the battery voltage, $V_{BAT}$.

Based on the power level modulation mode, in some embodiments of the multi-level charge pump buck converter mode of operation, the switcher control circuit 880 may configure the switch mode power supply converter 872 to generate a series output voltage substantially equal to the battery voltage, $V_{BAT}$, a shunt output voltage substantially equal to a ground voltage, and a subset of the available charge pump output voltages. As an example, as a function of the power level modulation mode, the switcher control circuit 880 may configure the multi-level charge pump 882 and the switching circuit 884 to generate a shunt mode output voltage substantially equal to a ground voltage, in the shunt output mode, a series mode output voltage substantially equal to $V_{BAT}$, in the series output mode, and a first boost mode output voltage substantially equal to $3/2\times V_{BAT}$ in the first boost output mode. As another non-limiting example, as a function of the power level modulation mode, in some power level modulation modes, the switcher control circuit 880 may configure the multi-level charge pump 882 to provide a first buck mode output voltage substantially equal to $\frac{1}{2}\times V_{BAT}$ in the first buck mode of operation. As an example, as a function of the power level modulation mode, the switcher control circuit 880 may configure the multi-level charge pump 882 and the switching circuit 884 to generate a shunt mode output voltage substantially equal to ground, a first buck mode output voltage substantially equal to $\frac{1}{2}\times V_{BAT}$, a series mode output voltage substantially equal to $V_{BAT}$, and a first boost mode output voltage substantially equal to $3/2\times V_{BAT}$ as a function of the operational state of the switcher control circuit 880. As still another non-limiting example, in some power level modulation modes, the switcher control circuit 880 may configure the multi-level charge pump 882 to only operate in a first boost mode of operation to generate a first boot output voltage, $V_{FIRST\_BOOST}$, substantially equal to $3/2\times V_{BAT}$.

As another example, in some power level modulation modes, the multi-level charge pump 882 may be configured to only operate in the second boost mode of operation. In still another example, in some power level modulation modes, the multi-level charge pump 882 may be configured to operate in the first buck mode and either the first boost mode or the second boost mode of operation. For example, in some power level modulation modes, the switcher control circuit 880 may configure the multi-level charge pump 882 to provide either a first buck mode output voltage substantially equal to $\frac{1}{2}\times V_{BAT}$ and a first boost mode output voltage substantially equal to $3/2\times V_{BAT}$ as a function of the operational state of the switcher control circuit 880. In other power level modulation modes, the switcher control circuit may configure the multi-level charge pump 882 to provide a buck output voltage substantially equal to $\frac{1}{2}\times V_{BAT}$ in the first buck mode and a second boost level output voltage substantially equal to $2 \times V_{BAT}$ as a function of the operational state of the switcher control circuit 880.

Depending on a power level modulation mode, a characteristic of the data transmission, and/or a desired distribution of harmonics of the switching frequency within the frequency spectrum, the controller 50 may configure the comparator thresholds to set the equivalent main ripple voltage level at the modulated power supply output 876 and/or the switching frequency of the switch mode power supply converter 872. For example, in the medium power average power tracking modulation mode The parallel amplifier 928 may include a non-inverting input 928A configured to receive the control signal 926. In some embodiments, the control signal 926 may be a compensated $V_{RAMP}$ signal, $V_{RAMP\_C}$. The parallel amplifier 928 may also include an inverting input 928B in communication with the modulated power supply output 876. Based on the difference between the control signal and the modulated power supply voltage, $V_{CC}$, the parallel amplifier 928 may generate a parallel amplifier output current, $I_{PARA\_AMP}$, at the parallel amplifier output 928C in order to generate the parallel amplifier output voltage, $V_{PARA\_AMP}$ at the parallel amplifier circuit output 874A during the high power modulation mode and the medium power modulation mode. Additionally, the parallel amplifier 928 may be disabled during the low power average power tracking mode.

The parallel amplifier 928 may generate a scaled parallel amplifier output current estimate, $I_{PARA\_AMP\_SENSE}$, which is a fractional representation of the parallel amplifier output current, $I_{PARA\_AMP}$, from the parallel amplifier feedback output 928E. The parallel amplifier 928 may include a parallel amplifier supply voltage input 928D configured to receive a μC charge pump output voltage, $V_{\mu C\_OUT}$, from the μC charge pump circuit 262, such that the parallel amplifier output voltage, $V_{PARA\_AMP}$ is based on the μC charge pump output voltage, $V_{\mu C\_OUT}$ during the high power modulation mode and the medium power modulation mode. In general, the power amplifier supply voltage, $V_{CC}$, is based on the μC charge pump output voltage, $V_{\mu C\_OUT}$, during the high power modulation mode and the medium power modulation mode.

In one embodiment of the parallel amplifier 928, the parallel amplifier 928 has a segmented output stage, such that during the high power modulation mode and the medium power modulation mode, segment selection of the segmented output stage is based on an expected output power from the radio frequency power amplifier 869 to increase efficiency of the pseudo-envelope tracking modulated power supply system 868.

Alternatively, as previously described, in some embodiments the parallel amplifier supply voltage input 928D may be switchably configured to be powered by the μC charge pump output voltage, $V_{\mu C\_OUT}$, or a supply voltage provided by the multi-level charge pump 882 of the switch mode power supply converter 872, depicted in FIG. 2B.

For example, in some embodiments, the μC charge pump circuit 262 may generate the μC charge pump output voltage, $V_{\mu C\_OUT}$, as a function of the battery voltage and the modulation mode of operation. For example, in the high power modulation mode, the power management system 870 may configure the μC charge pump circuit 262 to operate in the $1 \times V_{BAT}$ mode or the $4/3 \times V_{BAT}$ mode to generate the μC charge pump output voltage, $V_{\mu C\_OUT}$, substantially equal to either the battery voltage, $1 \times V_{BAT}$, or $4/3 \times V_{BAT}$, respectively. In the medium power modulation mode, the power management system 870 may configure the μC charge pump circuit 262 to operate in the $1 \times V_{BAT}$ mode or the $2/3 \times V_{BAT}$ mode to generate the μC charge pump output voltage, $V_{\mu C\_OUT}$, substantially equal to either the battery voltage, $V_{BAT}$, or $2/3 \times V_{BAT}$, respectively. In some embodiments, in the low power modulation mode, the power management system 870 may configure the μC charge pump circuit 262 to operate in the $1/4 \times V_{BAT}$ mode, $1/3 \times V_{BAT}$ mode, or the $1/2 \times V_{BAT}$ mode to generate the μC charge pump output voltage, $V_{\mu C\_OUT}$, substantially equal to $1/4 \times V_{BAT}$, $1/3 \times V_{BAT}$, or $1/2 \times V_{BAT}$, respectively.

In one embodiment of the μC charge pump circuit 262, the μC charge pump circuit 262 provides the μC charge pump output voltage, $V_{\mu C\_OUT}$ based on the battery voltage, VBAT. In one embodiment of the μC charge pump circuit 262, the μC charge pump circuit 262 is a capacitor-based μC charge pump circuit 262, such that multiple switched flying capacitors are used to provide the μC charge pump output voltage, $V_{\mu C\_OUT}$. In one embodiment of the μC charge pump circuit 262, the μC charge pump circuit 262 has a segmented output stage, such that during the high power modulation mode, during the medium power modulation mode, and during the low power average power tracking mode, segment selection of the segmented output stage is based on an expected output power from the radio frequency power amplifier 869 to increase efficiency of the pseudo-envelope tracking modulated power supply system 868.

In some embodiments, a segmented parallel amplifier output stage of the parallel amplifier 928 may be configured based upon the expected output power of the radio frequency power amplifier 869. As an example, the segmentation configuration of the parallel amplifier 928 may be a function of the maximum instantaneous output power, $P_{INST\_MAX}$, to be generated by the radio frequency power amplifier 869 during the data transmission and the expected load line, $R_{RF\_AMP\_EXP}$, of the radio frequency power amplifier 869 during the data transmission. As an example, in some embodiments, the maximum instantaneous output current, $I_{MAX\_PARA\_AMP}$, to be provided by the parallel amplifier 928 during the data transmission may be substantially equal to $(P_{INST\_MAX}/R_{RF\_AMP\_EXP})^{1/2}$. In some embodiments, the parallel amplifier 928 may include a maximum parallel amplifier output current, $I_{PARA\_MAX}$, which is the maximum output current to be generated by the parallel amplifier 928. In some embodiments, the power management system 870 may configure the segmentation configuration of the parallel amplifier 928 based on the maximum parallel amplifier output current, $I_{PARA\_MAX}$, and the maximum instantaneous output current, $I_{MAX\_PARA\_AMP}$.

For example, in some embodiments, the controller may determine the maximum instantaneous output current, $I_{MAX\_PARA\_AMP}$, based on the envelope characteristics of the modulated radio frequency input signal to be transmitted and the expected load line, $R_{RF\_AMP\_EXP}$, of the radio frequency power amplifier 869 during the data transmission. The power management system 870 may determine the maximum instantaneous output power, $P_{INST\_MAX}$, based on the envelope characteristics of the modulated radio frequency input signal. Based on the maximum instantaneous output current, $I_{MAX\_PARA\_AMP}$, the power management system 870 may determine an estimated percentage of output current generation capacity of the parallel amplifier 928 that may be used during the data transmission.

For example, the power management system 870 may calculate the percentage of the output current generation capacity based on the ratio of the maximum instantaneous output current, $I_{MAX\_PARA\_AMP}$, to the maximum parallel amplifier output current, $I_{PARA\_MAX}$. The power management system 870 may determine the number of output stage segments of the parallel amplifier 928 to enable based on the estimated percentage of output current generation capacity of the parallel amplifier 928 to be used. For example, in the case where the parallel amplifier 928 includes two output stage segments that are configured to have a substantially equal output current generation capacity, the power management system 870 may set the segmentation configuration to be 100% when the ratio of the maximum instantaneous output current, $I_{MAX\_PARA\_AMP}$, to the maximum parallel amplifier output current, $I_{PARA\_MAX}$, is substantially equal to or near at least 50%. The power management system 870 may set the segmentation configuration to be 50% when the ratio of the maximum instantaneous output current, $I_{MAX\_PARA\_AMP}$, to the maximum parallel amplifier output current, $I_{PARA\_MAX}$, is at least less than 50%. In the case where the output stage segments of the parallel amplifier 928 are not substantially equal, the controller 50 may determine which of the output stage segments to enable based on the ratio of the maximum instantaneous output current, $I_{MAX\_PARA\_AMP}$, and the current generation capacity of each of the output stage segments.

In some alternative embodiments, the segmentation configuration of the parallel amplifier 928 may be based on the expected peak-to-peak swing of the modulated power supply voltage, $V_{CC\_PKPK}$, and the expected load line, $R_{RF\_AMP\_EXP}$, of the radio frequency power amplifier 869 during the data transmission.

For example, when operating in the high power modulation mode, the power management system 870 may set the segmentation configuration to be 100%. Alternatively, the power management system 870 may configure the parallel amplifier 928 to use only the first output stage segment or only the second output stage segment while operating in the medium power modulation mode depending on the ratio of the maximum instantaneous output current, $I_{MAX\_PARA\_AMP}$, to the maximum parallel amplifier output current, $I_{PARA\_MAX}$. And in the low power modulation mode, the power management system 870 may disable the parallel amplifier 928 to place the parallel amplifier output 928C a high impedance mode.

As previously described with respect to FIG. 2A, FIG. 2C depicts that the parallel amplifier circuit 874 may provide the threshold offset current 42, $I_{THRESHOLD\_OFFSET}$, from an embodiment of the $V_{OFFSET}$ loop circuit 41 to regulate the offset voltage, $V_{OFFSET}$, across the coupling capacitor 18A.

In some embodiments, $V_{OFFSET}$ loop circuit 41 may be configured to generate the threshold offset current 42, $I_{THRESHOLD\_OFFSET}$, that represents an average or integrated error between the modulated power supply voltage, $V_{CC}$, and a $V_{RAMP}$ signal when the switch mode power supply converter 872 is configured to operate in an average power tracking mode of operation. Some embodiments of the $V_{OFFSET}$ loop circuit 41 may be configured to pre-charge the bypass capacitor 19 and the coupling capacitor 18A while the switch mode power supply converter 872 is configured to operate in the average power tracking mode of operation.

The parallel amplifier circuit 874 may further include a linear regulator 930, LDO. The linear regulator 930, LDO, may be a low dropout voltage linear regulator. The parallel amplifier circuit 874 may also include a parallel amplifier output bypass switch 936, a linear regulator output selection switch 938, and feedback selection switch 940. The parallel amplifier output bypass switch 936 includes a first terminal 936A coupled to the parallel amplifier output 928C and a second terminal 936B coupled to ground. The power management system 870 may configure the parallel amplifier output bypass switch 936 to close when the parallel amplifier 928 is disabled.

For example, the power management system 870 may configure the parallel amplifier output bypass switch 936 to close based on a determination that the expected output power of the radio frequency power amplifier 869 is less than the low half power modulation mode threshold or the parallel amplifier output 928C is disabled and configured to provide a high impedance. Alternatively, the power management system 870 may configure the parallel amplifier output bypass switch 936 to be open when the parallel amplifier 928 is enabled. As such, the parallel amplifier output bypass switch 936 is coupled between the parallel amplifier circuit output 874A and ground. During the high power modulation mode and the medium power modulation mode, the parallel amplifier output bypass switch 936 is OPEN and during the low power average power tracking mode, the parallel amplifier output bypass switch 936 is CLOSED.

The linear regulator output selection switch 938 may include an input terminal 938A coupled to a linear regulator output 930C of the linear regulator 930, a first output terminal 938B in communication with the modulated power supply output 876, and a second output terminal 938C in communication with the second linear regulator output 874D, $LDO_2$ OUTPUT, in communication with the CMOS logic supply input 869C of the radio frequency power amplifier 869.

The feedback selection switch 940 includes an output terminal 940A in communication with a inverting input 930B of the linear regulator 930, a first input terminal 940B in communication with the modulated power supply output 876, and the second input terminal 940C in communication with the second linear regulator output 874D, $LDO_2$ OUTPUT, of the parallel amplifier circuit 874. The linear regulator ninth rate also includes a linear regulator power supply input 930D configured to receive the μC charge pump output voltage, $V_{\mu C\_OUT}$. The μC charge pump output voltage, $V_{\mu C\_OUT}$, may be configured provide a voltage level to the linear regulator power supply input 930D as a function of the battery voltage, $V_{BAT}$, and the expected output power of the radio frequency power amplifier 869.

The linear regulator 930, LDO, may also include a non-inverting input 930A may be in communication with the non-inverting input 928A of the parallel amplifier. The non-inverting input 930A of the linear regulator 930, LDO, may also be in communication with the differential filter 924, and configured to receive the control signal 926 at the non-inverting input 930A. The linear regulator 930 may also receive a linear regulator feedback signal, LDO FEEDBACK, from the output terminal 940A of the feedback selection switch 940. Based on the difference between the control signal 926 and the linear regulator feedback signal, LDO FEEDBACK, the linear regulator 930 may generate a linear regulator output voltage at the linear regulator output 930C. Based on the switch states of the linear regulator output selection switch 938 and feedback selection switch 940, the linear regulator 930, LDO, may generate a linear regulator output voltage to apply the first linear regulator output current 878A, $I_{LDO}$, to the modulated power supply output 876.

In this regard, in one embodiment of the linear regulator output selection switch 938 and the linear regulator 930, LDO, during the low power average power tracking mode, the linear regulator 930, LDO, provides the power amplifier supply voltage, $V_{CC}$, based on the μC charge pump output voltage, $V_{\mu C\_OUT}$. As such, the power amplifier supply voltage, $V_{CC}$, is based on the μC charge pump output voltage, $V_{\mu C\_OUT}$, during the low power average power tracking mode. Further, in one embodiment of the linear regulator 930, LDO, during the medium power modulation mode, the linear regulator 930, LDO, is disabled. Additionally, in one embodiment of the linear regulator 930, LDO, during the high power modulation mode, the linear regulator 930, LDO, is disabled.

FIG. 3A, FIG. 3B, FIG. 3C, and FIG. 3D depict a number of embodiments of a parallel amplifier 2300 operably disposed in a number of embodiments of the pseudo-envelope tracking modulated power supply system 868 depicted in FIGS. 2A-C. Each of the various embodiments of the parallel amplifier 2300 may include a segmented output driver stage having two or more output stage segments. Each of the two or more output stage segments may receive one of a set of supply voltages provided to the parallel amplifier 2300. In addition, some embodiments of the parallel amplifier 2300 may include three or more output stage segments.

Figure 3A:
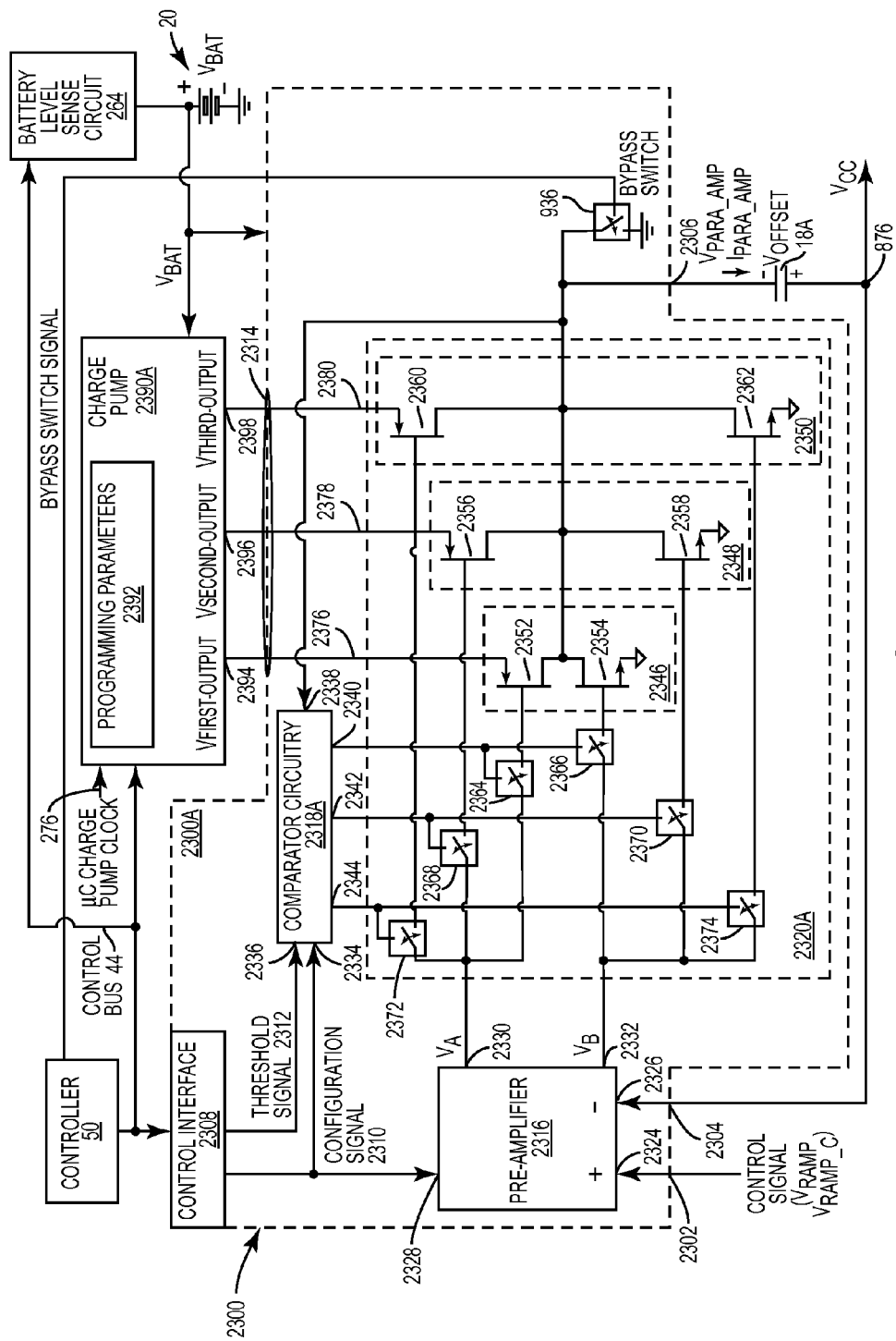
FIGS. 3A-D depict embodiments of a parallel amplifier having a segmented output stage, where each segment receives a different supply voltage.

FIG. 3A depicts an embodiment of the parallel amplifier 2300A. Advantageously, the parallel amplifier 2300A may further provide a separate supply voltage for each of the output stage segments in order to reduce the overall energy drained from the battery 20 during a data transmission.

Figure 3B:
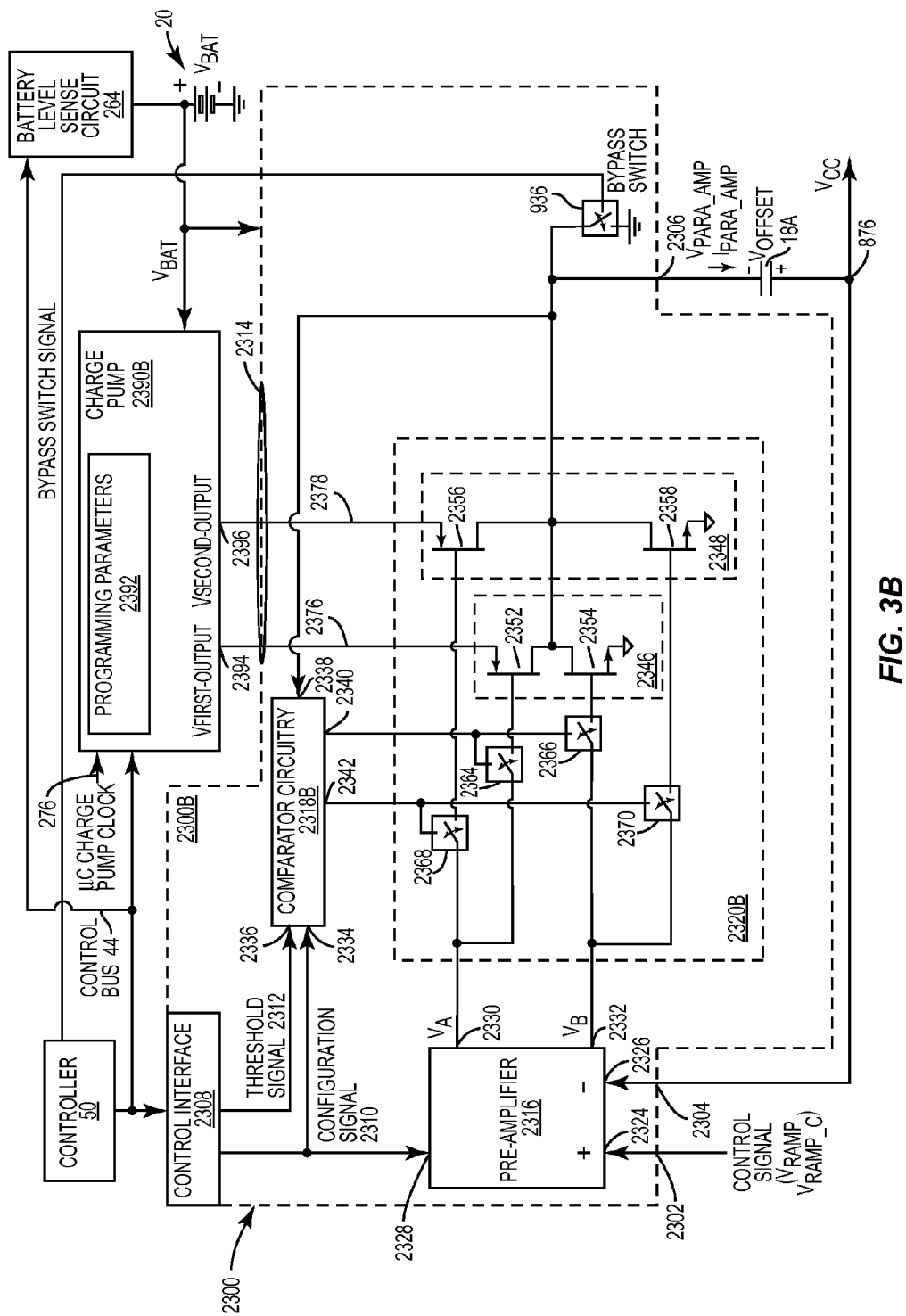
Figure 3C:
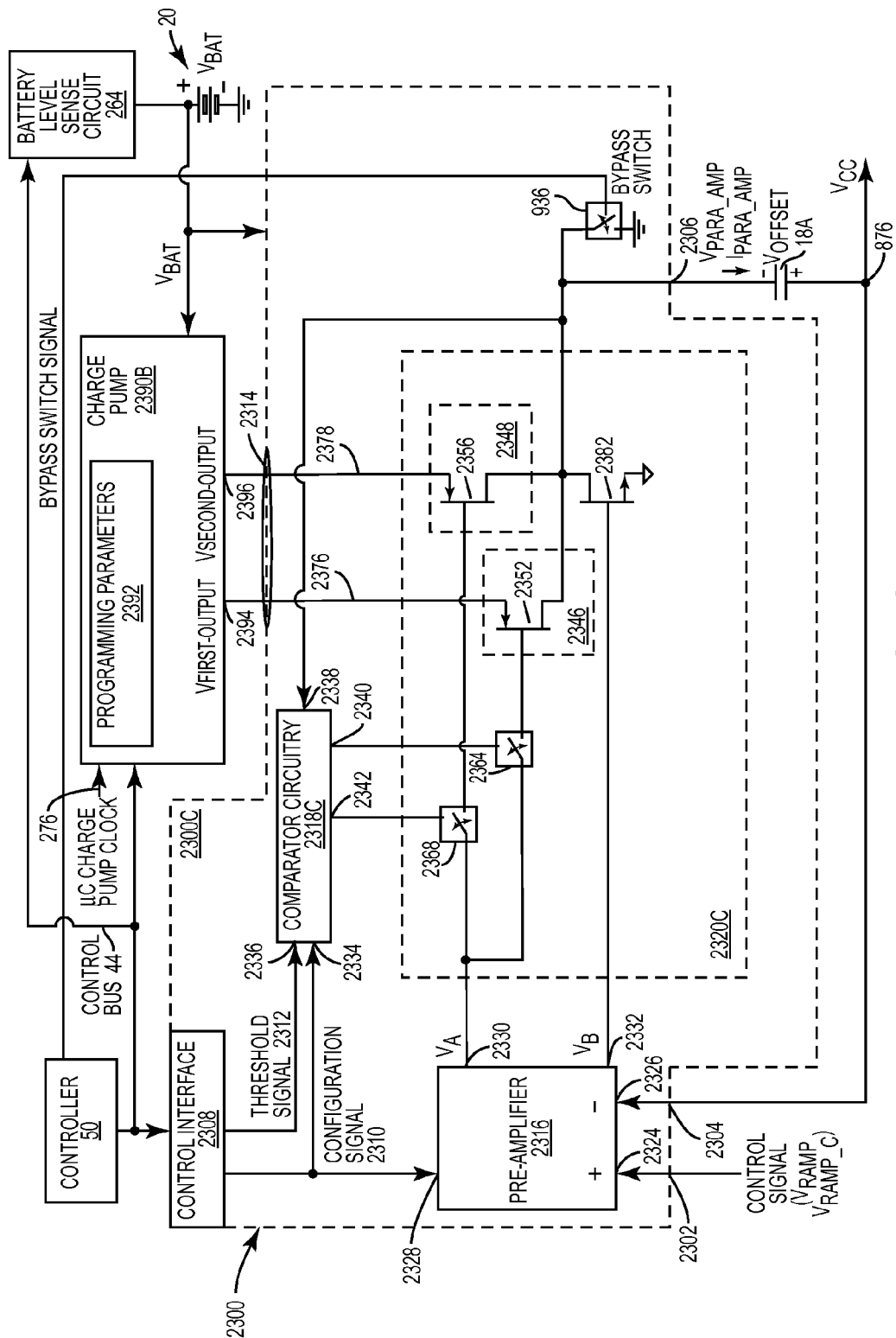

FIG. 3B depicts an example embodiment of a parallel amplifier 2300B having two output stage segments. Each of the two or more output segments may receive a respective supply voltage from a set of supply voltages provided to the parallel amplifier by a charge pump 2390B configured to provide two output voltages derived from the battery voltage, $V_{BAT}$. In some embodiments, the charge pump 2390B may further provide the battery voltage, $V_{BAT}$, as the voltage level for one of the two output voltages or as a third output voltage. Similarly, FIG. 3C depicts a parallel amplifier 2300C having two output stage segments, where each output stage segment of the two output segments is in communication with one of the two output voltages provided by the charge pump 2390B. FIG. 3C depicts the parallel amplifier 2300C having one output stage segment configured to receive a supply voltage from the μC charge pump circuit 262' and a second output stage segment configured to receive the battery voltage, $V_{BAT}$. The μC charge pump circuit 262' is substantially similar in form and function to the embodiments of the μC charge pump circuit 262 depicted in FIG. 2C. For the sake of description, the μC charge pump circuit 262' is substantially the same as the operation of the μC charge pump circuit 262 except the μC charge pump output voltage generated by μC charge pump circuit 262' is labeled $V_{FIRST\_OUTPUT}$, whereas the μC charge pump output voltage for the μC charge pump circuit 262 is labeled $V_{\mu C\_OUT}$. The changes in names for the μC charge pump output voltage is by way of convenience and not by limitation and to provide the reader with a consistent correspondence between the various embodiments of the charge pump 2390A, the charge pump 2390B, and the μC charge pump circuit 262'.

Returning to FIG. 3A, the parallel amplifier 2300A may include a first control input 2302, a second control input 2304, a parallel amplifier output 2306, and a control interface 2308. The controller 50 may be configured to interface with the control interface 2308 to configure and control the operation of the parallel amplifier 2300A. As an example, in some embodiments, the controller 50 may communicate with the control interface 2308 via a control bus 44. The controller 50 may provide control settings, configuration parameters, and threshold parameters to the parallel amplifier 2300A. In addition, the controller 50 may be configured to both read and write the control settings, configuration parameters, and threshold parameters from the control interface 2308. For example, the controller 50 may provide one or more configuration parameters to the control interface 2308, which may store the control parameters in local parameter registers. As an example, based on the control parameters, the control interface 2308 may generate a configuration signal 2310 and a threshold signal 2312. Alternatively, in some embodiments, the controller 50 may generate the configuration signal 2310 and a threshold signal 2312. The parallel amplifier 2300A may further include a supply voltage interface 2314 configured to receive two or more supply voltages. In addition, in some embodiments, the first control input 2302 and the second control input 2304 provide a high input impedance input. For example, the first control input 2302 and the second control input 2304 may be a differential input configured to provide a high impedance input. For example, the first control input 2302 may be a non-inverting input. The second control input 2304 may be an inverting input. As a further example, the first control input 2302 and the second control input 2304 may be a non-inverting input and an inverting input of a class AB amplifier, respectively.

As an example, in some embodiments, the first control input 2302 may receive a target voltage for the modulated power supply voltage, $V_{CC}$. The target voltage for the modulated power supply voltage, $V_{CC}$, may be a $V_{RAMP}$ signal. For example, the low power differential to signal-ended converter 942 may generate the $V_{RAMP}$ signal in response to a differential $V_{RAMP}$ signal. As another example, the first control input 2302 may receive the control signal 926 generated by the differential filter 924 in response to the differential $V_{RAMP}$ signal. The second control input 2304 may be in communication with the modulated power supply output 876, and configured to receive the modulated power supply voltage, $V_{CC}$. The parallel amplifier 2300 may generate the parallel amplifier output current, $I_{PARA\_AMP}$, as a function a difference voltage between the first control input 2302 and the second control input 2304. The parallel amplifier 2300A may apply the parallel amplifier output current, $I_{PARA\_AMP}$, to the parallel amplifier output 2306 to generate a parallel amplifier output voltage, $V_{PARA\_AMP}$.

As depicted in FIGS. 3A-D, each of the two or more output stage segments may receive a number of supply voltages from a variety of voltage sources. As a non-limiting example, embodiments of the voltage sources may include some combination of a battery voltage, $V_{BAT}$, from a battery 20, boost supply voltages generated by various embodiments of charge pumps as a function of the battery voltage, $V_{BAT}$, and a number of buck supply voltages generated by various embodiments of charge pumps as a function of the battery voltage, $V_{BAT}$. In addition, the supply voltages provided to each of the two or more output stage segments may change as a function of the expected output power to be generated by a radio frequency power amplifier 869' and the battery voltage, $V_{BAT}$. The supply voltages provided to each of the two or more output stage segments may change for each data transmission as a function of an expected output power to be generated by the radio frequency power amplifier 869'.

Each of the two or more output stage segments may include a first transistor in communication with a respective one of the supply voltages, and a parallel amplifier output of the parallel amplifier 2300, and configured to source current from the respective one of the supply voltages to the parallel amplifier output of the parallel amplifier 2300 to generate a parallel amplifier output current, $I_{PARA\_AMP}$, as a function of the parallel amplifier output voltage, $V_{PARA\_AMP}$, a headroom voltage of the first transistor, a voltage level of the respective one of the supply voltages, and a relative magnitude of the voltage level of the respective one of the supply voltage to the other supply voltages. For example, the parallel amplifier 2300 may be configured to compare the parallel amplifier output voltage, $V_{PARA\_AMP}$, to one or more threshold levels to determine which of the two or more output stage segments to enable to generate the parallel amplifier output current, $I_{PARA\_AMP}$.

To determine the one or more thresholds, a controller 50 may determine a relative magnitude of each supply voltage of the supply voltages associated with a respective one of the two or more output stage segments. The controller 50 sets a first threshold level of the one or more threshold levels to substantially equal a smallest supply voltage of the one of the supply voltages having the smallest magnitude less the headroom of the first transistor of the respective one of the two or more output stage segments that receives the smallest supply voltage. The parallel amplifier 2300 may enable the respective one of the one of the two or more output stage segments that receives the smallest supply voltage to generate the parallel amplifier output current, $I_{PARA\_AMP}$, so long as the parallel amplifier output voltage, $V_{PARA\_AMP}$, is less than the first threshold. The controller 50 may set a second threshold level of the one or more threshold levels to substantially equal the second smallest supply voltage of the two or more output stage segments less the headroom of the first transistor of output stage segment of the two or more output stage segments communication with the second smallest supply voltage. The parallel amplifier 2300 may enable the respective one of two or more output stage segments that receives the second smallest supply voltage to generate the parallel amplifier output current, $I_{PARA\_AMP}$, so long as the parallel amplifier output voltage, $V_{PARA\_AMP}$, is at least substantially equal to the first threshold and less than the second threshold. Similarly, the controller 50 may set a third threshold level of the one or more threshold levels to substantially equal the third smallest supply voltage of the two or more output stage segments less the headroom of the first transistor of the output stage segment of the two or more output stage segments in communication with the third smallest supply voltage. The parallel amplifier 2300 may enable the respective one of the two or more output stage segments that receives the third smallest supply voltage to generate the parallel amplifier output current, $I_{PARA\_AMP}$, so long as the parallel amplifier output voltage, $V_{PARA\_AMP}$, is at least substantially equal to the second threshold and less than the third threshold. Subsequent threshold levels may be determined by the controller 50 for each of the two or more output stage segments. The parallel amplifier 2300 may enable the respective one of the two or more output stage segments that receives the largest supply voltage to generate the parallel amplifier output current, $I_{PARA\_AMP}$, so long as the parallel amplifier output voltage, $V_{PARA\_AMP}$, is at least equal to the $n^{th}$ threshold where the two or more output stage segments include (n+1) segments configured to receiver (n+1) supply voltages.

In some embodiments of the parallel amplifier 2300, each of the two or more output stage segments may include a second transistor in communication with the parallel amplifier output of the parallel amplifier 2300 and a common voltage level, such as ground. For each of the two or more output stage segments, the second transistor may be configured to sink current to generate the parallel amplifier output current, $I_{PARA\_AMP}$, as a function of the parallel amplifier output voltage, $V_{PARA\_AMP}$, the headroom voltage of the first transistor of the respective segment, the voltage level of the respective one of the supply voltages received by the first transistor of the respective segment, and the relative magnitude of the voltage level of the respective one of the supply voltages received by the first transistor of the respective segment to the other supply voltages. The parallel amplifier 2300 may enable each of the two or more output stage segments to generate the parallel amplifier output current, $I_{PARA\_AMP}$, in a mutually exclusive manner such that only one of the two or more output stage segments is enabled at any one time. The second transistor of a respective output stage segment of the two or more output stage segments may sink a bias current associated with the respective segment while the segment is in a standby mode of operation. The segment may be in a standby mode of operation when not configured to generate parallel amplifier output current, $I_{PARA\_AMP}$.

Other embodiments of the parallel amplifier 2300 may include a shared or common transistor in communication with the parallel amplifier output of the parallel amplifier 2300 and the common voltage level. The shared or common transistor may sink current to generate the parallel amplifier output current, $I_{PARA\_AMP}$, for each of two or more output stage segments. In other words, because the parallel amplifier 2300 may enable each of the two or more output stage segments to generate the parallel amplifier output current, $I_{PARA\_AMP}$, in a mutually exclusive manner such that only one of the two or more output stage segments is a enabled at any one time, a shared or common transistor may sink current to generate the parallel amplifier output current, $I_{PARA\_AMP}$, for each of the two or more output stage segments. In addition, the shared or common transistor may sink a respective bias current for each of the two or more output stage segments that are in a standby mode of operation.

For example, FIG. 3A depicts a parallel amplifier 2300A having three or more output stage segments. Each of the three or more output stage segments may receive a respective supply voltage from a set of supply voltages provided to the parallel amplifier by a charge pump 2390A configured to provide three output voltages derived from the battery voltage, $V_{BAT}$. In some operational configurations, the charge pump 2390A may provide the battery voltage, $V_{BAT}$, as one of the three output voltages. The controller 50 may configure the charge pump 2390A to generate specific output voltages depending on the battery voltage, $V_{BAT}$, the maximum expected parallel amplifier supply voltage, $V_{CC\_MAX}$, to be generated by the modulated power supply output 876, the minimum CMOS logic power supply threshold, and the minimum driver supply voltage of the driver 869F provided to the driver supply voltage input 869D of the radio frequency power amplifier 869'. In some embodiments, the charge pump 2390A may provide a fourth output voltage substantially equal to the battery voltage, $V_{BAT}$. Furthermore, depending on the various supply voltages needed by the parallel amplifier 2300 to regulate the modulated power supply output 876, the battery voltage, $V_{BAT}$, and the minimum supply voltage for the driver supply voltage input 869D, the controller 50 may configure the charge pump 2390A to generate a set of supply voltages that minimizes the overall expected energy drawn from the battery 20 during a data transmission. Some embodiments of the charge pump 2390A receive a μC charge pump clock 276 from the clock management circuit 260. In some embodiments, the μC charge pump clock 276 may be derived from the switching frequency of the switch mode power supply converter 872. In other embodiments or configurations, the μC charge pump clock 276 may be derived from an oscillator 270, which is enabled when the switch mode power supply converter 872 is disabled. Based on the μC charge pump clock 276, the charge pump 2390A may operate in a number of phases, described below in further detail, to generate a first output voltage $V_{FIRST-OUTPUT}$ provided at the first output 2394 of the charge pump 2390A, the second output voltage $V_{SECOND-OUTPUT}$ provided at the second output 2396 of the charge pump 2390A, and the third output voltage $V_{THIRD-OUTPUT}$ at the third output 2398. The controller 50 may determine a first threshold level and a second threshold level to be used by the comparator circuitry 2318A to control the operation of the first push-pull output stage 2346, the second push-pull output stage 2348, and the third push-pull output stage 2350.

During operation, the controller 50 may enable the pre-amplifier 2316 and the comparator circuitry 2318A. The pre-amplifier 2316 may generate a first amplifier output voltage, $V_A$, and a second amplifier output voltage, $V_B$, in response to the difference voltage between the first input 2324 and the second input 2326 of the pre-amplifier 2316. The comparator circuitry 2318A compares the parallel amplifier output voltage, $V_{PARA\_AMP}$, to the first threshold and the second threshold. If the parallel amplifier output voltage, $V_{PARA\_AMP}$, is less than the first supply voltage 2378, and the third supply voltage 2380 has the least magnitude. Comparator circuitry 2318A may enable the one of the first push-pull output stage 2346, the second push-pull output stage 2348, and the third push-pull output stage 2350 that is associated with the one of the first supply voltage 2376, the second supply voltage 2378, and the third supply voltage 2380 having the least magnitude so long as the parallel amplifier output voltage, $V_{PARA\_AMP}$, is less than the first threshold. The comparator circuitry 2318A enables the one of the first push-pull output stage 2346, the second push-pull output stage 2348, and the third push-pull output stage 2350 that is associated with the one of the first supply voltage 2376, the second supply voltage 2378, and the third supply voltage 2380 having the maximum magnitude so long as the parallel amplifier output voltage, $V_{PARA\_AMP}$, is greater than the third threshold. Otherwise, the comparator circuitry 2318A enables the one of the first push-pull output stage 2346, the second push-pull output stage 2348, and the third push-pull output stage 2350 that is associated with the one of the first supply voltage 2376, the second supply voltage 2378, and the third supply voltage 2380 having the middle range magnitude so long as the parallel amplifier output voltage, $V_{PARA\_AMP}$, is at least equal to the first threshold and not more than the second threshold level.

The parallel amplifier 2300A may further include a pre-amplifier 2316, comparator circuitry 2318A, and a segmented output driver stage 2320A. The pre-amplifier 2316 may include a first input 2324 in communication with the first control input 2302, a second input 2326 in communication with the second control input 2304, and a control input 2328 in communication with a control interface 2308. The control input 2328 may receive the configuration signal 2310 from the control interface 2308. The pre-amplifier 2316 may further include a first pre-amplifier output 2330 and a second pre-amplifier output 2332 configured to respectively generate a first amplifier output voltage, $V_A$, and a second amplifier output voltage, $V_B$, in response to the difference in voltage between the first input 2324 and the pre-amplifier of the pre-amplifier 2316. The first pre-amplifier output 2330 and the second pre-amplifier output 2332 may drive the segmented output driver stage 2320.

The comparator circuitry 2318A may include a control input 2334 configured to receive the configuration signal 2310 and a threshold input 2336 configured to receive the threshold signal 2312 from the control interface 2308. The comparator circuitry 2318 may further include a parallel amplifier output voltage input 2338 configured to receive the parallel amplifier output voltage, $V_{PARA\_AMP}$, from the parallel amplifier output 2306. The comparator circuitry 2318A may include a first segment control output 2340, a second segment control output 2342, and a third segment control output 2344. As described below, the comparator circuitry 2318A may be configured to control the generation of the parallel amplifier output current, $I_{PARA\_AMP}$, as a function of the parallel amplifier output voltage, $V_{PARA\_AMP}$, a first threshold level, and a second threshold level.

The segmented output driver stage 2320 may include the first push-pull output stage 2346, the second push-pull output stage 2348, and the third push-pull output stage 2350. The first push-pull output stage 2346 may include a first PFET transistor 2352 and a first NFET transistor 2354. The second push-pull output stage 2348 may include a second PFET transistor 2356 and a second NFET transistor 2358. The third push-pull output stage 2350 may include a third PFET transistor 2360 and a third NFET transistor 2362. The drains of the first PFET transistor 2352, the first NFET transistor 2354, the second PFET transistor 2356, the second NFET transistor 2358, the third PFET transistor 2360, and the third NFET transistor 2362 may be operably coupled or combined to form the parallel amplifier output 2306. The sources of the first NFET transistor 2354, the second NFET transistor 2358, and the third NFET transistor 2362 may be operably coupled to ground.

The segmented output driver stage 2320 may further include a first switch element 2364, a second switch element 2366, a third switch element 2368, a fourth switch element 2370, a fifth switch element 2372, and a sixth switch element 2374. Each of the first switch element 2364, the second switch element 2366, the third switch element 2368, the fourth switch element 2370, the fifth switch element 2372, and the sixth switch element 2374 may include a first terminal, a second terminal and a control terminal, and configured to have an on state and an off state. The first pre-amplifier output 2330 may be in communication with the first terminal of the first switch element 2364, the third switch element 2368, and the fifth switch element 2372. The first segment control output 2340 may be in communication with the control terminal of the first switch element 2364 and the control terminal of the second switch element 2366. The second segment control output 2342 may be in communication with the third switch element 2368 and the fourth switch element 2370. The third segment control output 2344 may be in communication with the fifth switch element 2372 and the sixth switch element 2374. The gate of the first PFET transistor 2352 may be in communication with the second terminal of the first switch element 2364. The gate of the first NFET transistor 2354 may be in communication with the second terminal of the second switch element 2366. The gate of the second PFET transistor 2356 may be in communication with second terminal of the third switch element 2368. The gate of the second NFET transistor 2358 may be in communication with the second terminal of the fourth switch element 2370. The gate of the third PFET transistor 2360 may be in communication with the second terminal of the fifth switch element 2372. The gate of the third NFET transistor 2362 may be in communication with the second terminal of the sixth switch element 2374.

The control interface 2308 may be in communication with the controller 50. The control interface 2308 may include a configuration signal 2310 and a threshold signal 2312. As an example, the control input of the pre-amplifier 2316 may receive a configuration signal 2310. The configuration signal 2310 may include a pre-amplifier enable signal and a comparator circuitry control signal. The controller 50 may assert the comparator circuitry control signal to enable the comparator circuitry 2318A. The controller 50 may de-assert the comparator circuitry control signal to disable the comparator circuitry 2318A. In the disabled state, the comparator circuitry 2318 may default to an output state that configures each of the first switch element 2364, the second switch element 2366, the third switch element 2368, the fourth switch element 2370, the fifth switch element 2372, and the sixth switch element 2374 to disable the first PFET transistor 2352, the first NFET transistor 2354, the second PFET transistor 2356, the second NFET transistor 2358, the third PFET transistor 2360, and the NFET transistor 2362. As a result, the first push-pull output stage 2346, the second push-pull output stage 2348, and the third push-pull output stage 2350 are each disabled and provide a high impedance path to ground. Accordingly, the parallel amplifier output 2306 presents a high impedance path to ground.

The source of the first PFET transistor 2352 may receive a first supply voltage 2376. The source of the second PFET transistor 2356 may receive a second supply voltage 2378. The source of the third PFET transistor 2360 may receive a third supply voltage 2380. As an example, in some embodiments, the supply voltage interface 2314 may receive the first supply voltage 2376, the second supply voltage 2378, and a third supply voltage 2380 from the charge pump 2390A.

Some embodiments of the charge pump 2390A may receive the battery voltage, $V_{BAT}$, from the battery 20. The charge pump 2390A may include a first output 2394 configured to provide the first supply voltage 2376, a second output 2396 configured to provide the second supply voltage 2378, and a third output 2398 configured to provide the third supply voltage 2380 to the supply voltage interface 2314. In addition, the charge pump 2390A may be in communication with a controller 50 via the control bus 44. The controller 50 may provide a set of programming parameters 2392 to the charge pump 2390A. The controller 50 may generate the programming parameters 2392 as a function of the battery voltage, $V_{BAT}$, and the maximum expected parallel amplifier supply voltage, $V_{CC\_MAX}$. In response to receipt of the programming parameters, the charge pump 2390A may generate a set of output voltages based on the programming parameters 2392.

For example, based on the programming parameters 2392, the charge pump 2390A may generate a first output voltage, $V_{FIRST-OUTPUT}$, at the first output 2394, a second output voltage, $V_{SECOND-OUTPUT}$, at the second output 2396, and a third output voltage, $V_{THIRD-OUPUT}$, at the third output 2398.

Based on the first output voltage $V_{FIRST-OUTPUT}$ provided at the first output 2394, the second output voltage $V_{SECOND-OUTPUT}$ provided at the second output 2396, and the third output voltage $V_{THIRD-OUPUT}$ at the third output 2398, the controller 50 may determine a first threshold level and a second threshold level to be used by the comparator circuitry 2318A to control the operation of the first push-pull output stage 2346, the second push-pull output stage 2348, and the third push-pull output stage 2350.

Some embodiments of the charge pump 2390A may be configured to generate a buck output voltage, or a boost voltage that is greater than the battery voltage, $V_{BAT}$, and/or some combination thereof. In the case where the operational ratio of the μC charge pump, $\mu BB_{RATIO}$, results in one of the first output voltage, $V_{FIRST-OUTPUT}$, the second output voltage, $V_{SECOND-OUTPUT}$, and the third output voltage, $V_{THIRD-OUPUT}$, being below the minimum expected power amplifier supply voltage, $V_{CC\_MIN}$, the controller 50 may configure the charge pump 2390A to bypass the switching network 2412 to provide an output voltage substantially equal to the battery voltage, $V_{BAT}$.

The controller 50 may set the voltage levels of the output voltage $V_{FIRST-OUTPUT}$, the second output voltage $V_{SECOND-OUTPUT}$, and the third charge pump output voltage $V_{THIRD-OUTPUT}$ based on the envelope characteristic of the modulated radio frequency input signal provided to the radio frequency power amplifier 869' such that the parallel amplifier 2300A may generate a maximum power amplifier supply voltage, $V_{CC\_MAX}$. In addition, the controller 50 may further determine whether the battery voltage is greater than the minimum CMOS supply voltage threshold. In the case where the battery voltage, $V_{BAT}$, is less than the minimum CMOS supply voltage threshold, the controller 50 may configure the charge pump 2390A to generate at least one of the first output voltage $V_{FIRST-OUTPUT}$, the second output voltage $V_{SECOND-OUTPUT}$, and the third output voltage $V_{THIRD-OUTPUT}$ that is greater than the minimum CMOS supply voltage threshold, which is provided to the radio frequency power amplifier 869 or 869' as previously described. Similarly, based on the expected output power to be generated by the radio frequency power amplifier 869 or 869', the controller 50 may configure one of the first output voltage $V_{FIRST-OUTPUT}$, the second output voltage $V_{SECOND-OUTPUT}$, and the third output voltage $V_{THIRD-OUTPUT}$ to provide a supply voltage to the second linear regulator, $V_{LDO2}$, at least equal to the minimum driver supply voltage threshold of the driver 869F of the radio frequency power amplifier 869'.

As an example, and not by way of limitation, the following description of the operation of the comparator circuit assumes that the $V_{FIRST-OUTPUT} < V_{SECOND-OUTPUT} < V_{THIRD-OUTPUT}$. As depicted in FIG. 3A, the first output voltage $V_{FIRST-OUTPUT}$ is received by the first PFET transistor 2352, the second output voltage $V_{SECOND-OUTPUT}$ is received by the second PFET transistor 2356, and the third output voltage $V_{THIRD-OUTPUT}$ is received by the third PFET transistor 2360. The controller 50 may set the first threshold level substantially equal to the $V_{FIRST-OUTPUT}$ less the headroom voltage of the first PFET transistor 2352, $V_{HEADROOM-FIRST-PFET}$. The controller 50 may set the second threshold level substantially equal to the second output voltage $V_{SECOND-OUTPUT}$ less the headroom voltage of the second PFET transistor 2356, $V_{HEADROOM-SECOND-PFET}$.

The controller 50 may communicate the first threshold level and the second threshold level to the comparator circuitry 2318A via the control bus 44. In addition, in some embodiments, the controller 50 may configure the comparator circuitry 2318A to compare the parallel amplifier output voltage, $V_{PARA\_AMP}$, to the first threshold and the second threshold to govern the operation of the first segment control output 2340, the second segment control output 2342, and the third segment control output 2344.

Because the first output voltage $V_{FIRST-OUTPUT}$ has the least magnitude, the comparator circuitry 2318A may activate the first segment control output 2340 to enable the first PFET transistor 2352 and the first NFET transistor 2354 to generate the parallel amplifier output current, $I_{PARA\_AMP}$, so long as the parallel amplifier output voltage, $V_{PARA\_AMP}$, is less than the first threshold. For example, the first segment control output 2340 may generate a control signal to configure the first switch element 2364 to provide the first amplifier output voltage, $V_A$, to the gate of the first PFET transistor 2352, and a second switch element 2366 to provide a second amplifier output voltage, $V_B$, to the gate of the first NFET transistor 2354. When the parallel amplifier output voltage, $V_{PARA\_AMP}$, rises above the first threshold, the comparator circuitry 2318A may configure the first segment control output 2340 to place the first switch element 2364 and the second switch element 2366 in a standee mode or bias mode of operation. In addition, the comparator circuitry 2318A may activate the second segment control output 2342 to enable the second PFET transistor 2356 and the first NFET transistor 2354 to generate the parallel amplifier output current, $I_{PARA\_AMP}$, so long as the parallel amplifier output voltage, $V_{PARA\_AMP}$, is between the first threshold and the second threshold. For example, the second segment control output 2342 may generate a control signal to configure the third switch element 2368 to provide the first amplifier output voltage, $V_A$, to the gate of the second PFET transistor 2356, and a fourth switch element 2370 to provide the second amplifier output voltage, $V_B$, to the gate of the second NFET transistor 2358.

When the parallel amplifier output voltage, $V_{PARA\_AMP}$, rises above the second threshold, the comparator circuitry 2318A may configure the second segment control output 2342 to place the third switch element 2368 and the fourth switch element 2370 in a standee mode or bias mode of operation. In addition, the comparator circuitry 2318A activate the third segment control output 2342 to enable the third PFET transistor 2360 and the third NFET transistor 2362 to generate the parallel amplifier output current, $I_{PARA\_AMP}$, so long as the parallel amplifier output voltage, $V_{PARA\_AMP}$, is at least equal to the second threshold. For example, the third segment control output 2344 may generate a control signal to configure the fifth switch element 2372 to provide the first amplifier output voltage, $V_A$, to the gate of the third PFET transistor 2360, and a third switch element 2374 to provide the second amplifier output voltage, $V_B$, to the gate of the third NFET transistor 2362. When the parallel amplifier output voltage, $V_{PARA\_AMP}$, is less than equal to the second threshold, the comparator circuitry 2318A may configure the third segment control output 2344 to place the fifth switch element 2372 and the sixth switch element 2374 in a standby mode or bias mode of operation. In a standby mode or bias mode of operation, the first switch element 2364 and the second switch element 2366 may provide a gate voltage to the first PFET transistor 2352 and a gate voltage to the first NFET transistor 2354 to generate a first bias current through the first PFET transistor 2352 and the first NFET transistor 2354. In a standby mode or bias mode of operation, the third switch element 2368 and the fourth switch element 2370 may provide a gate voltage to the second PFET transistor 2356 and a gate voltage to the second NFET transistor 2358 to generate a second bias current through the second PFET transistor 2356 and the second NFET transistor 2358. Likewise, in a standby mode or bias mode of operation, the fifth switch element 2372 and the sixth switch element 2374 may provide a gate voltage to the third PFET transistor 2360 and a gate voltage to the third NFET transistor 2362 to generate a third bias current through the third PFET transistor 2360 and the third NFET transistor 2362.

The magnitude of the first bias current may be a function of a source voltage on the source of the first PFET transistor 2352. The magnitude of the second bias current may be a function of a source voltage on the source of the second PFET transistor 2356. The magnitude of the third bias current may be a function of a source voltage on the source of the third PFET transistor 2360.

In the example case where the first output voltage $V_{FIRST-OUTPUT}$ is less than the second output voltage $V_{SECOND-OUTPUT}$, and the second output voltage $V_{SECOND-OUTPUT}$ is less than the third output voltage $V_{THIRD-OUTPUT}$, the bias current through the first PFET transistor 2352 may be less than a second bias current generated by the second PFET transistor 2356. Similarly, the second bias current generated by the second PFET transistor 2356 may be less than a third bias current generated by the third PFET transistor 2360.

In addition, in some embodiments, the comparator circuitry 2318A may configure the first segment control output 2340 to turn off first PFET transistor 2352 and the first NFET transistor 2354. For example, the first segment control output 2340 may provide a control signal to configure the first switch element 2364 and the second switch element 2366 to put the first PFET transistor 2352 and the first NFET transistor 2354 in a non-conducting state. The first PFET transistor 2352 and the first NFET transistor 2354 may provide a high impedance path to ground in the non-conducting state. Likewise, the comparator circuitry 2318A may configure the second segment control output 2342 to turn off second PFET transistor 2356 and the second NFET transistor 2358. For example, the second segment control output 2342 may provide a control signal to configure the third switch element 2368 and the fourth switch element 2370 to put the second PFET transistor 2356 and the second NFET transistor 2358 in a non-conducting state. The second PFET transistor 2356 and the second NFET transistor 2358 may provide a high impedance path to ground in the non-conducting state. The comparator circuitry 2318A may further configure the third segment control output 2344 to turn off third PFET transistor 2360 and the third NFET transistor 2362. For example, the third segment control output 2344 may provide a control signal to configure the fifth switch element 2372 and the sixth switch element 2374 to put the third PFET transistor 2360 and the third NFET transistor 2362 in a non-conducting state. The third PFET transistor 2360 and the third NFET transistor 2362 may provide a high impedance path to ground in the non-conducting state.

In addition, in some embodiments of the parallel amplifier 2300A, the comparator circuitry 2318A may be configured to receive and use the target voltage for the modulated power supply voltage, $V_{CC}$, received by the first control input 2302 to determine when to enable each of the first push-pull output stage 2346, the second push-pull output stage 2348, and the third push-pull output stage 2350 to generate the parallel amplifier output current, $I_{PARA\_AMP}$. As discussed above, the first control input 2302 may receive the $V_{RAMP}$ signal or the control signal 926 generated in response to the differential $V_{RAMP}$ signal. Advantageously, both the $V_{RAMP}$ signal and the control signal 926 may provide a time advanced control signal that may be used to determine which of the first push-pull output stage 2346, the second push-pull output stage 2348, and the third push-pull output stage 2350 to enable to generate the parallel amplifier output current, $I_{PARA\_AMP}$. Because both the $V_{RAMP}$ signal and the control signal 926 are time advance relative to the parallel amplifier output voltage, $V_{PARA\_AMP}$, the comparator circuitry 2318A may determine earlier in time when to switch between the first push-pull output stage 2346, the second push-pull output stage 2348, and the third push-pull output stage 2350 to ensure linear operation of the parallel amplifier 2300. As an example, the various embodiments of the $V_{OFFSET}$ loop control circuit 41 may regulate the threshold voltage, $V_{THRESHOLD}$, across the coupling capacitor 18A to be substantially constant based on a target offset voltage parameter, $V_{OFFSET\_TARGET}$. Thus, the comparator circuitry 2318A may generate a time advanced estimate of the parallel amplifier output voltage, $V_{PARA\_AMP}$, by subtracting a target offset voltage, $V_{OFFSET\_TARGET}$, represented by the target offset voltage parameter, $V_{OFFSET\_TARGET}$, from the $V_{RAMP}$ signal. Similarly, the comparator circuitry 2318A may generate a time advanced estimate of the parallel amplifier output voltage, $V_{PARA\_AMP}$, by subtracting the target offset voltage, $V_{OFFSET\_TARGET}$, represented by the target offset voltage parameter, $V_{OFFSET\_TARGET}$, from control signal 926. The comparator circuitry 2318A may compare the time advance estimate of the parallel amplifier output voltage, $V_{PARA\_AMP}$, to the first threshold and the second threshold to control the generation of the parallel amplifier output current, $I_{PARA\_AMP}$. Equivalently, the controller 50 may calculate the first threshold and the second threshold to take into account the target offset voltage, $V_{OFFSET\_TARGET}$, represented by the target offset voltage parameter, $V_{OFFSET\_TARGET}$. For example, referring to the above example where the $V_{FIRST-OUTPUT} < V_{SECOND-OUTPUT} < V_{THIRD-OUTPUT}$, the first threshold may be substantially equal to sum of the target offset voltage, $V_{OFFSET\_TARGET}$, and the first output voltage $V_{FIRST-OUTPUT}$ less the headroom voltage of the first PFET transistor 2352, $V_{HEADROOM\_FIRST\_PFET}$. Similarly, the second threshold may be substantially equal to sum of the target offset voltage, $V_{OFFSET\_TARGET}$, and the second output voltage $V_{SECOND-OUTPUT}$ less the headroom voltage of the second PFET transistor 2356, $V_{HEADROOM-SECOND-PFET}$.

In addition, in some power level modulation modes, the controller 50 may configure the comparator circuitry 2318A to disable at least one of the first push-pull output stage 2346, the second push-pull output stage 2348, and the third push-pull output stage 2350 to reduce the bias current used by the parallel amplifier 2300A. For example, in some embodiments of the medium power modulation mode, the controller 50 may configured the comparator circuitry 2318A to not use one of the first push-pull output stage 2346, the second push-pull output stage 2348, and the third push-pull output stage 2350 by either setting the first threshold to be less than the minimum expected power amplifier supply voltage, $V_{CC\_MIN}$, plus the target offset voltage, $V_{OFFSET\_TARGET}$, or setting the second threshold to be greater than the maximum power amplifier supply voltage, $V_{CC\_MAX}$, plus the target offset voltage, $V_{OFFSET\_TARGET}$, less the headroom voltage of the respective one of the first PFET transistor 2352, the second PFET transistor 2356, or the third PFET transistor 2360 to be disabled. The controller 50 may then configure the one charge pump 2390A to not provide an output voltage to the respective one of the first PFET transistor 2352, the second PFET transistor 2356, or the third PFET transistor 2360 to be disabled. As a result, the parallel amplifier 2300A may be configured to decrease the energy consumed by generation of the additional charge pump output voltage as well as the bias current associated with the disabled push-pull output stage.

FIG. 3B depicts an embodiment of a parallel amplifier 2300B that is similar to the parallel amplifier 2300A. The parallel amplifier 2300B is configured to operate with a charge pump 2390B that includes a first output 2394 configured to provide the first supply voltage 2376 and a second output 2396 configured to provide the second supply voltage 2378 to the supply voltage interface 2314. Similar to the parallel amplifier 2300A, the controller 50 may be in communication with the charge pump 2390B via the control bus 44. The controller 50 may provide the programming parameters 2392 to configure the charge pump 2390B. Based on the programming parameters 2392, the charge pump 2390B may generate a first output voltage $V_{FIRST-OUTPUT}$ at the first output 2394 and a second output voltage $V_{SECOND-OUTPUT}$ at the second output 2396.

The parallel amplifier 2300B may include a control interface 2308. The parallel amplifier 2300B is similar in form and function to the parallel amplifier 2300A depicted in FIG. 3A. However, the parallel amplifier 2300B may not include the third push-pull output stage 2350, the fifth switch element 2372 and the sixth switch element 2374. In addition, the parallel amplifier 2300B may include an embodiment of the comparator circuitry 2318B. The comparator circuitry 2318B may be similar to the comparator circuitry 2318A depicted in FIG. 3A. However, the comparator circuitry 2318B does not include a third segment control output 2344 configured to control the fifth switch element 2372 and the sixth switch element 2374.

The comparator circuitry 2318B may operate in substantially the same manner as the comparator circuitry 2318A depicted in FIG. 3A, except that the controller 50 only calculates a first threshold. When the parallel amplifier voltage, $V_{PARA\_AMP}$, is less that the first threshold, the one of the first push-pull output stage 2346 and the second push-pull output stage 2348 that receives a first supply voltage 2376 and a second supply voltage 2378 having the least magnitude is enabled. When the parallel amplifier voltage, $V_{PARA\_AMP}$, is greater than the first threshold, the other of the first push-pull output stage 2346 and the second push-pull output stage 2348 is enabled.

FIG. 3C depicts an embodiment of a parallel amplifier 2300C that is substantially similar in form and function to the parallel amplifier 2300B. The parallel amplifier 2300C combines the first NFET transistor 2354 and the second NFET transistor 2358 into a shared NFET transistor 2382. The parallel amplifier 2300C operates substantially the same as the parallel amplifier 2300B except that the shared NFET transistor 2382 is always enabled. The shared NFET transistor 2382 may be configured to provide a bias current for the one of the first PFET transistor 2352 and the second PFET transistor 2356 that is not configured to generate the parallel amplifier output current, $I_{PARA\_AMP}$.

Figure 3D:
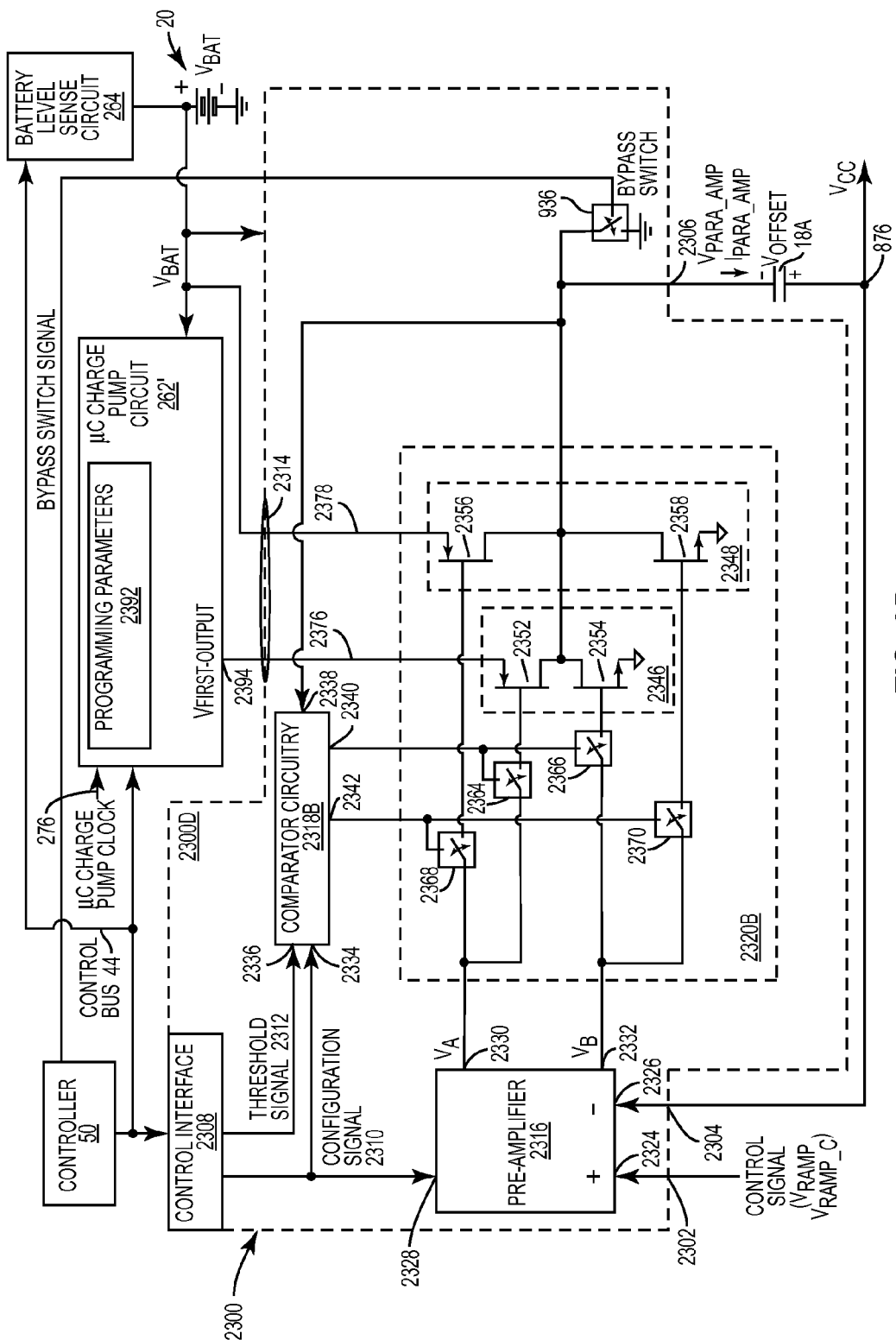

FIG. 3D depicts an embodiment of a parallel amplifier 2300D. The difference is that the first supply voltage 2376 is provided by the μC charge pump circuit 262 and the second supply voltage 2378 is substantially equal to the battery voltage, $V_{BAT}$. Accordingly, for the case where the first supply voltage 2376 is greater than the battery voltage, $V_{BAT}$, the first threshold is substantially equal to the battery voltage less the headroom voltage of the second PFET transistor 2356. In the case where the first supply voltage 2376 is less than the battery voltage, the first threshold is substantially equal to the first supply voltage 2376 less the headroom voltage of the first PFET transistor 2352.

Figure 4A:
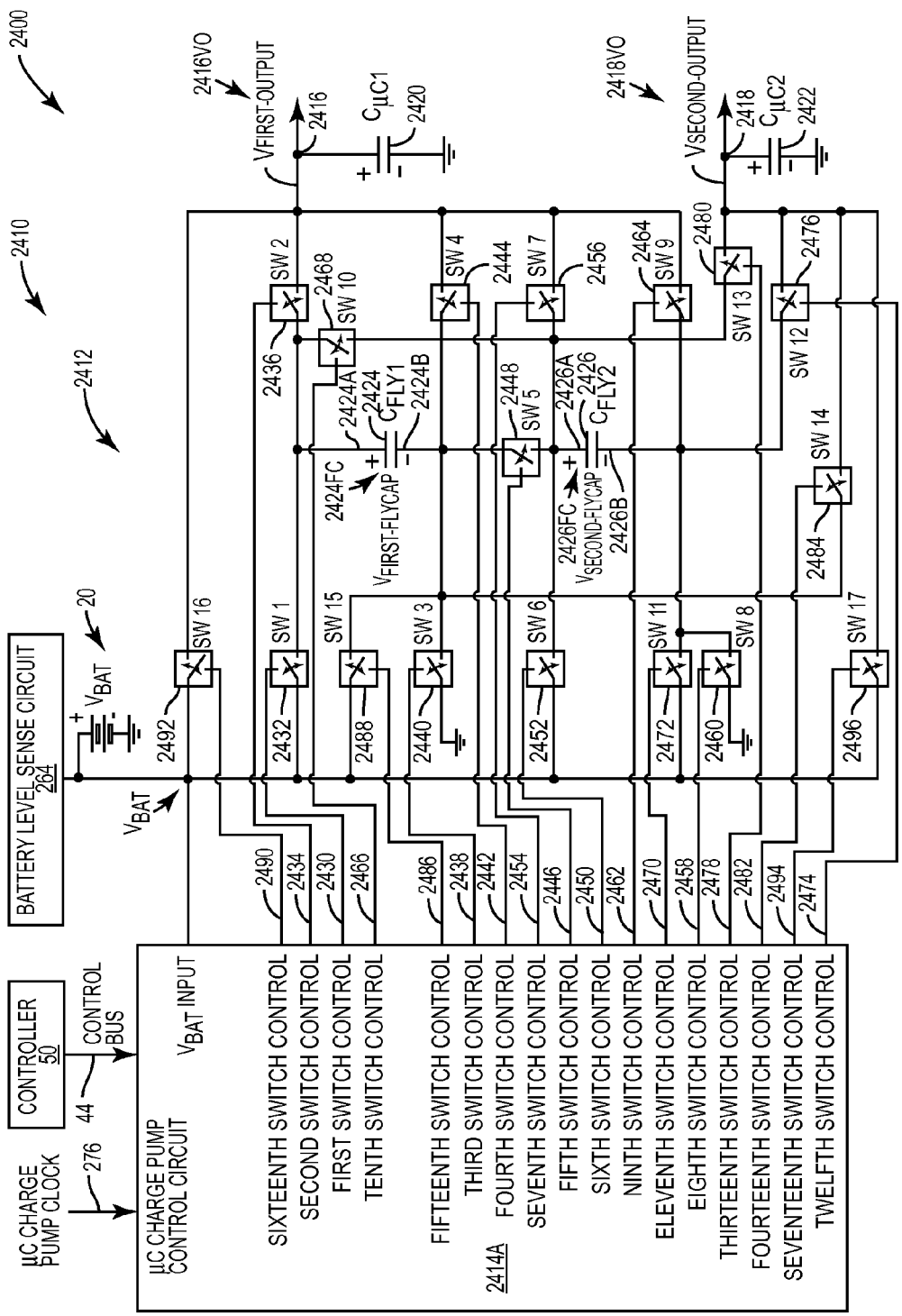
FIGS. 4A-B respectively depict embodiments of a charge pump having two outputs and three outputs.

FIG. 4A depicts an example embodiment of a μC charge pump system 2400 including a μC charge pump 2410, which uses only two flying capacitors to generate multiple output voltages. The μC charge pump 2410 may be similar in form and function to the various embodiments of μC charge pumps described and depicted in the international patent application PCT/US2011/054106, filed Sep. 29, 2011, and entitled, "SINGLE μC-BUCKBOOST CONVERTER WITH MULTIPLE REGULATED SUPPLY OUTPUTS." Some embodiments of the μC charge pump 2410 may be similar to the charge pumps depicted in FIGS. 2A-D, of the international patent application PCT/US2011/054106. The μC charge pump system 2400 and the μC charge pump 2410 will be described with continuing reference to the embodiments of the power management systems 870 depicted in FIGS. 2A-C.

The embodiments of the μC charge pump reduce or eliminate the need for inductors, large numbers of capacitors, more than two flying capacitors, and complex switching techniques to transform an available voltage level from a system power source, such as a battery 20, to more desirable power supply voltages. Some described embodiments of the μC charge pump 2410 may only include two flying capacitors. The μC charge pump 2410 may use the only two flying capacitors to simultaneously generate multiple supply outputs. Each of the multiple supply outputs may provide either the same or a different output voltage level. The described embodiments also include efficient power management systems that flexibly provide highly accurate voltage levels that are substantially insensitive to the voltage level provided by a system power source, such as the battery voltage, $V_{BAT}$. In some embodiments, the μC charge pump 2410 may provide the battery voltage, $V_{BAT}$, as one of the different output voltages.

The μC charge pump system 2400 may be configured to provide multiple supply voltages to various circuits of an electronic system. The μC charge pump system 2400 may include a μC charge pump 2410 having a μC charge pump control circuit 2414A cooperatively coupled to a switching network 2412. The switching network 2412 may include a first output 2416 and a second output 2418. A first output capacitor 2420 may be coupled between the first output 2416 and ground, and configured to store charge transferred from the battery 20 by the switching network 2412 to generate a first output voltage $V_{FIRST\text{-}OUTPUT}$ 2416VO. As second output capacitor 2422 may be coupled between the second output 2418 and ground, and configured to store charge transferred from the battery 20 by the switching network 2412 to generate a second output voltage $V_{SECOND\text{-}OUTPUT}$ 2418VO. The first output 2416 may be coupled to a first output capacitor 2420, having a capacitance substantially equal to $C_{\mu C1}$. The first output 2416 may be coupled to a second output capacitor 2422 having a capacitance substantially equal to $C_{\mu C2}$. The switching network 2412 and the μC charge pump control circuit 2414A may receive a battery voltage, $V_{BAT}$, from the battery 20. Similar to the μC charge pump circuit 262, the μC charge pump control circuit 2414A may receive a μC charge pump clock 276 from a clock management circuit 260. Depending on a power level modulation mode of operation, the μC charge pump clock 276 may be generated based on a switching frequency of the switch mode power supply converter 872. Alternatively, the μC charge pump clock 276 may be generated based on a frequency of an oscillator 270.

The switching network 2412 and the μC charge pump control circuit 2414A may cooperatively transfer charge from the battery 20 to the first output capacitor 2420 and the second output capacitor 2422 as a function of a first flying capacitor voltage $V_{FIRST\text{-}FLYCAP}$ 2424FC developed across a first flying capacitor 2424 and a second flying capacitor voltage $V_{SECOND\text{-}FLYCAP}$ 2426FC developed across a second flying capacitor 2426. The first flying capacitor 2424 may have a first terminal 2424A and a second terminal 2424B. The first flying capacitor voltage $V_{FIRST\text{-}FLYCAP}$ 2424FC is developed across the first terminal 2424A and the second terminal 2424B of the first flying capacitor 2424. The first flying capacitor 2424 may have a capacitance substantially equal to $C_{FLY1}$. The second flying capacitor 2426 may have a first terminal 2426A and a second terminal 2426B. The second flying capacitor voltage $V_{SECOND\text{-}FLYCAP}$ 2426FC is developed across the first terminal 2426A and the second terminal 2426B of the second flying capacitor 2426. The second flying capacitor 2426 may have a capacitance substantially equal to $C_{FLY2}$.

As a non-limiting example, FIG. 4A may depict an embodiment of the charge pump 2390B, depicted in FIGS. 3B-C, as a μC charge pump 2410. Each of the at least two output voltage levels may be provided to one or more different electronic components, sub-assemblies, and devices of electronic devices, sub-systems, and systems. As an example, the μC charge pump 2410 may include first flying capacitor 2424 having a first flying capacitor voltage $V_{FIRST\text{-}FLYCAP}$ 2424FC, and a second flying capacitor 2426 having a second flying capacitor voltage $V_{SECOND\text{-}FLYCAP}$ 2426FC. The μC charge pump 2410 may generate the two or more output voltages as a function of a first flying capacitor voltage $V_{FIRST\text{-}FLYCAP}$ 2424FC developed across a first flying capacitor 2424 and a second flying capacitor voltage $V_{SECOND\text{-}FLYCAP}$ 2426FC developed across the second flying capacitor 2426. As an example, the μC charge pump 2410 may include a switching network 2412 in communication with the μC charge pump control circuit 2414A. The switching network 2412 may include a number of switch elements and a first flying capacitor 2424 and a second flying capacitor 2426.

FIG. 4A depicts an example embodiment of the μC charge pump control circuit 2414A configured to control the switching network 2412. The μC charge pump control circuit 2414A may actuate various switches of the switching network 2412 based on a phase of operation to switchably couple the first flying capacitor 2424 and the second flying capacitor 2426 in various relationships between the battery voltage, $V_{BAT}$, the ground, the first output 2416, and the second output 2418 to simultaneously generate multiple output voltages.

As a first example, the μC charge pump system 2400 may include a non-limiting example of a μC charge pump 2410 and a controller 50 coupled to the μC charge pump 2410 via the control bus 44. In some embodiments, the controller 50 may be coupled to a battery level sense circuit 264 via the control bus 44. The battery level sense circuit 264 may be configured to provide the controller 50 a measured or estimated voltage of the battery 20. As an example, the battery voltage, $V_{BAT}$, may be derived from a battery 20.

The μC charge pump 2410 may also be coupled to the battery 20, and be configured to receive the battery voltage, $V_{BAT}$. The μC charge pump 2410 may generate a first output 2416 and a second output 2418. As an example, the controller 50 may configure the μC charge pump 2410 to generate a first output voltage $V_{FIRST\text{-}OUTPUT}$ 2416VO on the first output 2416 and a second output voltage $V_{SECOND\text{-}OUTPUT}$ 2418VO on the second output 2418.

In some embodiments of the μC charge pump system 2400, the controller 50 may configure the μC charge pump 2410 such that the first output 2416 operates in a "buck mode" of operation. In the case where the μC charge pump 2410 operates the first output 2416 in the buck mode of operation, the first output 2416 provides a "bucked" output voltage level relative to the battery voltage, $V_{BAT}$, as the first output voltage $V_{FIRST\text{-}OUTPUT}$ 2416VO. As an example, neglecting losses in the signal paths between the battery voltage, $V_{BAT}$, and the first output 2416, when the μC charge pump 2410 is configured to operate the first output 2416 in the buck mode of operation, the first output voltage $V_{FIRST\text{-}OUTPUT}$ 2416VO may have a magnitude that is equal to or less than the battery voltage, $V_{BAT}$. In a similar fashion, in some embodiments of the μC charge pump system 2400, the controller 50 may configure the μC charge pump 2410 such that the second output 2418 operates in a buck mode of operation. In the buck mode of operation, the second output 2418 may provide a bucked output voltage level relative as the second output voltage $V_{SECOND\text{-}OUTPUT}$ 2418VO. As an example, in the buck mode of operation, the second output voltage $V_{SECOND\text{-}OUTPUT}$ 2418VO may have a magnitude that is equal to or less than the battery voltage, $V_{BAT}$.

In other embodiments of the μC charge pump system 2400, the controller 50 may configure the μC charge pump 2410 such that the first output 2416 operates in a "boost mode" of operation. In the boost mode of operation, the first output 2416 may provide a "boosted" output voltage level relative to the battery voltage, $V_{BAT}$, as the first output voltage $V_{FIRST\text{-}OUTPUT}$ 2416VO. As an example in the boost mode of operation, the first output voltage $V_{FIRST\text{-}OUTPUT}$ 2416VO may have a magnitude that is greater than the battery voltage, $V_{BAT}$.

Likewise, in some embodiments of the μC charge pump system 2400, the controller 50 may configure the μC charge pump 2410 to operate the second output 2418 operates in a boost mode of operation. In the boost mode of operation, the second output 2418 may provide the boosted output voltage level as the second output voltage $V_{SECOND\text{-}OUTPUT}$ 2418VO. As an example, in the boost mode of operation, the second output voltage $V_{SECOND\text{-}OUTPUT}$ 2418VO may have a magnitude that is greater than the battery voltage, $V_{BAT}$.

The controller 50 may configure the μC charge pump 2410 to operate in various modes of operation. As a non-limiting example of these modes of operation, the controller 50 may configure the μC charge pump 2410 to operate in a "buck/buck mode" of operation, a "buck/boost mode" of operation, and/or a "boost/buck mode" of operation. As one example, when the controller 50 configures the μC charge pump 2410 to operate in the buck/buck mode of operation, the µC charge pump 2410 operates the first output 2416 in a buck mode of operation and the second output 2418 in a buck mode of operation. As another example, when the controller 50 configures the µC charge pump 2410 to operate in the buck/boost mode of operation, the µC charge pump 2410 operates the first output 2416 in a buck mode of operation and the second output 2418 in a boost mode of operation. As yet another example, when the controller 50 configures the µC charge pump 2410 to operate in the boost/buck mode of operation, the µC charge pump 2410 operates the first output 2416 in a boost mode of operation and the second output 2418 in a buck mode of operation. In still other embodiments, the µC charge pump 2410 may also operated in a boost/boost mode of operation to simultaneously generate two boosted output voltages.

In some embodiments, the controller 50 may be configured to control the modes of operation of the µC charge pump 2410 based upon the measured or estimated voltage of the battery voltage, $V_{BAT}$. Alternatively, the controller 50 may be configured to control the operation of the µC charge pump 2410 based upon an operational mode of a system or an integrated chip in which the µC charge pump system 2400 is being used. For example, the controller 50 may configure the µC charge pump 2410 based on a power level modulation mode, as discussed above with respect to FIGS. 2A-C.

As previously described with respect to the µC charge pump circuit 262, depicted in FIG. 2C, the controller 50 may configure the clock management circuit 260 to provide the µC charge pump clock 276 in various operational modes. As a non-limiting list of examples, the various reference clock sources used to generate the µC charge pump clock 276 may include a frequency locked loop (FLL) circuit, a reference clock from a sub-system of an integrated chip, a power supply system, the switching frequency of the switch mode power supply converter 872 in FIG. 2B. In some embodiments, the µC charge pump clock 276 is derived from the switching frequency of the switch mode power supply converter while the switch mode power supply converter 872 is enabled. In some embodiments, the switching frequency of the switch mode power supply converter 872 is free running and substantially determined by the one or more threshold levels used by the switcher control circuit 880 to determine an operational state of the switcher control circuit 880. As an example, in the free running state of operation, decreasing the shunt level threshold 124 may increase the switching frequency of the switch mode power supply converter 872. Conversely, increasing the shunt threshold level may decrease the switching frequency of the switch mode power supply converter 872. In some embodiments of the switch mode power supply converter 872, the controller 50 may be configure one or more of the shunt level threshold 124, the first buck level threshold 125, the series level threshold 126, the first boost level threshold 128, and the second boost level threshold 130 to obtain a target switching frequency. For example, in some embodiments, the controller 50 may adjust one or more threshold level parameters to obtain a desired switching frequency in order to place harmonics of the switching frequency outside a particular band of operation or receiver channel within a band of operation. Also, the controller 50 may turn on the oscillator 270 to provide the µC charge pump clock 276 when the switch mode power supply converter 872 is disabled. Otherwise, the controller 50 may power down the oscillator 270.

FIG. 4A depicts one of several embodiments of the µC charge pump 2410. For the sake of convenience, and not by way of limitation, the µC charge pump 2410 is described with continuing reference to various elements of the controller 50, control bus 44, the battery level sense circuit 264, the battery voltage, $V_{BAT}$, the battery 20, the clock management circuit 260, and the µC charge pump clock 276, the first flying capacitor 2424, and the second flying capacitor 2426.

The µC charge pump 2410 may include a switching network 2412 and a µC charge pump control circuit 2414A. The µC charge pump control circuit 2414A may communicate with the controller 50 via the control bus 44. The controller 50 may configure the µC charge pump 2410 to operate in various modes of operation via the control bus 44. As a non-limiting example, the µC charge pump 2410 may be configured by the controller 50 to operate in a "buck/buck mode" of operation, a "buck/boost mode" of operation, and/or a "boost/buck mode" of operation. In addition, the µC charge pump control circuit 2414A may be further configured to receive the µC charge pump clock 276. Furthermore, the controller 50 may configure the µC charge pump 2410 to operate in a boost/boost mode of operation.

The switching network 2412 may be configured by the µC charge pump control circuit 2414A to generate the first output voltage $V_{FIRST-OUTPUT}$ 2416VO on the first output 2416 and the second output voltage $V_{SECOND-OUTPUT}$ 2418VO on the second output 2418 based on a selected mode of operation of the µC charge pump 2410.

To simplify the description of the operation of the µC charge pump 2410 and the operation of the switching network 2412, FIG. 4A depicts the first flying capacitor 2424 and the second flying capacitor 2426 as being incorporated into the switching network 2412. Some embodiments of the µC charge pump 2410 may include and use more than two flying capacitors to generate the first output voltage $V_{FIRST-OUTPUT}$ 2416VO on the first output 2416 and the second output voltage $V_{SECOND-OUTPUT}$ 2418VO on the second output 2418. However, advantageously, the µC charge pump 2410 may be configured to simultaneously generate the first output voltage $V_{FIRST-OUTPUT}$ 2416VO on the first output 2416 and the second output voltage $V_{SECOND-OUTPUT}$ 2418VO on the second output 2418 using only the first flying capacitor 2424 and the second flying capacitor 2426.

In other words, as will be described below, some embodiments of the µC charge pump 2410 may generate the variously described output voltage levels corresponding to a "buck/buck mode" of operation, a "buck/boost mode" of operation, a "boost/buck mode" of operation, a "boost/boost" mode of operation, and/or some combination thereof using only the first flying capacitor 2424 and the second flying capacitor 2426. It may be appreciated that those embodiments of the µC charge pump 2410 that only use the first flying capacitor 2424 and the second flying capacitor 2426 to generate the desired output voltage levels on the first output 2416 and the second output 2418 may provide improved technical performance due to reduced complexity and reduced response time verses embodiments that include more than two flying capacitors.

The switching network 2412 may include a first flying capacitor 2424, a second flying capacitor 2426, a first switch 2432, (SW1), a second switch 2436, (SW2), a third switch 2440, (SW3), a fourth switch 2444, (SW4), a fifth switch 2448, (SW5), a sixth switch 2452, (SW6), a seventh switch 2456, (SW7), an eighth switch 2460, (SW8), a ninth switch 2464, (SW9), a tenth switch 2468, (SW10), an eleventh switch 2472, (SW11), a twelfth switch 2476, (SW12), a thirteenth switch 2480, (SW13), a fourteenth switch 2484, (SW14), a fifteenth switch 2488, (SW15), a sixteenth switch 2492, (SW16), and a seventeenth switch 2496, (SW17).

In some embodiments of the switching network 2412, the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17), may be solid state based switches, micro-electromechanical systems (MEMS) contact based switches, or combinations thereof.

Illustratively, as a non-limiting example, solid state based switches may include field effect transistors, insulator-on-semiconductor based transistors, bipolar based transistors, and/or a combination thereof. The example solid state based switches may be fabricated using various semiconductor device fabrication processes, techniques, and materials. As an example, some solid state based switches may be based on a gallium nitride (GaN) process. In some embodiments, gallium nitride metal/oxide semiconductor field-effect transistors may be used to create the solid state switches. In still other embodiments, the gallium nitride metal/oxide semiconductor field-effect transistors may be a gallium nitride field effect transistor. As an example, the gallium nitride field effect transistor may be an enhancement mode gallium nitride metal-oxide-semiconductor field-effect transistor (MOSFET).

Returning to the description of the µC charge pump control circuit 2414A, the µC charge pump control circuit 2414A may further include;
a first switch control configured to provide a first switch control signal 2430 to the first switch 2432, (SW1), to control the operation of the first switch 2432, (SW1);
a second switch control configured to provide a second switch control signal 2434 to the second switch 2436, (SW2), to control the operation of the second switch 2436, (SW2);
a third switch control configured to provide a third switch control signal 2438 to the third switch 2440, (SW3), to control the operation of the third switch 2440, (SW3);
a fourth switch control configured to provide a fourth switch control signal 2442 to the fourth switch 2444, (SW4), to control the operation of the fourth switch 2444, (SW4);
a fifth switch control configured to provide a fifth switch control signal 2446 to the fifth switch 2448, (SW5), to control the operation of the fifth switch 2448, (SW5);
a sixth switch control configured to provide a sixth switch control signal 2450 to the sixth switch 2452, (SW6), to control the operation of the sixth switch 2452, (SW6);
a seventh switch control configured to provide a seventh switch control signal 2454 to the seventh switch 2456, (SW7), to control the operation of the seventh switch 2456, (SW7);
an eighth switch control configured to provide an eighth switch control signal 2458 to the eighth switch 2460, (SW8), to control the operation of the eighth switch 2460, (SW8);
a ninth switch control configured to provide a ninth switch control signal 2462 to the ninth switch 2464, (SW9), to control the operation of the ninth switch 2464, (SW9);
a tenth switch control configured to provide a tenth switch control signal 2466 to the tenth switch 2468, (SW10), to control the operation of the tenth switch 2468, (SW10);
an eleventh switch control configured to provide an eleventh switch control signal 2470 to the eleventh switch 2472, (SW11), to control the operation of the eleventh switch 2472, (SW11);
a twelfth switch control configured to provide a twelfth switch control signal 2474 to the twelfth switch 2476, (SW12), to control the operation of the twelfth switch 2476, (SW12);
a thirteenth switch control configured to provide a thirteenth switch control signal 2478 to the thirteenth switch 2480, (SW13), to control the operation of the thirteenth switch 2480, (SW13);
a fourteenth switch control configured to provide a fourteenth switch control signal 2482 to the fourteenth switch 2484, (SW14), to control the operation of the fourteenth switch 2484, (SW14);
a fifteenth switch control configured to provide a fifteenth switch control signal 2486 to the fifteenth switch 2488, (SW15), to control the operation of the fifteenth switch 2488, (SW15);
a sixteenth switch control configured to provide a sixteenth switch control signal 2490 to the sixteenth switch 2492, (SW16), to control the operation of the sixteenth switch 2492, (SW16); and
a seventeenth switch control configured to provide a seventeenth switch control signal 2494 to the seventeenth switch 2496, (SW17), to control the operation of the seventeenth switch 2496, (SW17).

The first switch 2432, (SW1), may be coupled between the battery voltage, $V_{BAT}$, and the first terminal 2424A of the first flying capacitor 2424. The first switch 2432, (SW1), may include a first switch control input configured to receive the first switch control signal 2430 from the µC charge pump control circuit 2414A. The µC charge pump control circuit 2414A may configure the first switch control signal 2430 to operably open and close the first switch 2432, (SW1), based upon the various modes of operation of the µC charge pump 2410.

The second switch 2436, (SW2), may be coupled between the first terminal 2424A of the first flying capacitor 2424 and the first output 2416. The second switch 2436, (SW2), may include a second switch control input configured to receive the second switch control signal 2434 from the µC charge pump control circuit 2414A. The µC charge pump control circuit 2414A may configure the second switch control signal 2434 to operably open and close the second switch 2436, (SW2), based upon the various modes of operation of the µC charge pump 2410.

The third switch 2440, (SW3), may be coupled between the second terminal 2424B of the first flying capacitor 2424 and ground. The third switch 2440, (SW3), may include a third switch control input configured to receive the third switch control signal 2438 from the µC charge pump control circuit 2414A. The µC charge pump control circuit 2414A may configure the third switch control signal 2438 to operably open and close the third switch 2440, (SW3), based upon the various modes of operation of the µC charge pump 2410.

The fourth switch 2444, (SW4), may be coupled between the second terminal 2424B of the first flying capacitor 2424 and the first output 2416. The fourth switch 2444, (SW4), may include a fourth switch control input configured to receive the fourth switch control signal 2442 from the µC charge pump control circuit 2414A. The µC charge pump control circuit 2414A may configure the fourth switch control signal 2442 to operably open and close the fourth switch 2444, (SW4), based upon the various modes of operation of the µC charge pump 2410.

The fifth switch 2448, (SW5), may be coupled between the second terminal 2424B of the first flying capacitor 2424 and the first terminal 2426A of the second flying capacitor 2426 The fifth switch 2448, (SW5), may include a fifth switch control input configured to receive the fifth switch control signal 2446 from the µC charge pump control circuit 2414A. The µC charge pump control circuit 2414A may configure the fifth switch control signal 2446 to operably open and close the fifth switch 2448, (SW5), based upon the various modes of operation of the µC charge pump 2410.

The sixth switch 2452, (SW6), may be coupled between the first terminal 2426A of the second flying capacitor 2426 and the battery voltage, $V_{BAT}$. The sixth switch 2452, (SW6), may include a sixth switch control input configured to receive the sixth switch control signal 2450 from the µC charge pump control circuit 2414A. The µC charge pump control circuit 2414A may configure the sixth switch control signal 2450 to operably open and close the sixth switch 2452, (SW6), based upon the various modes of operation of the µC charge pump 2410.

The seventh switch 2456, (SW7), may be coupled between the first terminal 2426A of the second flying capacitor 2426 and the first output 2416. The seventh switch 2456, (SW7), may include a seventh switch control input configured to receive the seventh switch control signal 2454 from the µC charge pump control circuit 2414A. The µC charge pump control circuit 2414A may configure the seventh switch control signal 2454 to operably open and close the seventh switch 2456, (SW7), based upon the various modes of operation of the µC charge pump 2410.

The eighth switch 2460, (SW8), may be coupled between the second terminal 2426B of the second flying capacitor 2426 and ground. The eighth switch 2460, (SW8), may include an eighth switch control input configured to receive the eighth switch control signal 2458 from the µC charge pump control circuit 2414A. The µC charge pump control circuit 2414A may configure the eighth switch control signal 2458 to operably open and close the eighth switch 2460, (SW8), based upon the various modes of operation of the µC charge pump 2410.

The ninth switch 2464, (SW9), may be coupled between the second terminal 2426B of the second flying capacitor 2426 and the first output 2416. The ninth switch 2464, (SW9), may include a ninth switch control input configured to receive the ninth switch control signal 2462 from the µC charge pump control circuit 2414A. The µC charge pump control circuit 2414A may configure the ninth switch control signal 2462 to operably open and close the ninth switch 2464, (SW9), based upon the various modes of operation of the µC charge pump 2410.

The tenth switch 2468, (SW10), may be coupled between the first terminal 2424A of the first flying capacitor 2424 and the first terminal 2426A of the second flying capacitor 2426. The tenth switch 2468, (SW10), may include a tenth switch control input configured to receive the tenth switch control signal 2466 from the µC charge pump control circuit 2414A. The µC charge pump control circuit 2414A may configure the tenth switch control signal 2466 to operably open and close the tenth switch 2468, (SW10), based upon the various modes of operation of the µC charge pump 2410.

The eleventh switch 2472, (SW11), may be coupled between the second terminal 2426B of the second flying capacitor 2426 and the battery voltage, $V_{BAT}$. The eleventh switch 2472, (SW11), may include an eleventh switch control input configured to receive the eleventh switch control signal 2470 from the µC charge pump control circuit 2414A. The µC charge pump control circuit 2414A may configure the eleventh switch control signal 2470 to operably open and close the eleventh switch 2472, (SW11), based upon the various modes of operation of the µC charge pump 2410.

The twelfth switch 2476, (SW12), may be coupled between the second terminal 2426B of the second flying capacitor 2426 and the second output 2418. The twelfth switch 2476, (SW12), may include a twelfth switch control input configured to receive the twelfth switch control signal 2474 from the µC charge pump control circuit 2414A. The µC charge pump control circuit 2414A may configure the twelfth switch control signal 2474 to operably open and close the twelfth switch 2476, (SW12), based upon the various modes of operation of the µC charge pump 2410.

The thirteenth switch 2480, (SW13), may be coupled between the first terminal 2426A of the second flying capacitor 2426 and the second output 2418. The thirteenth switch 2480, (SW13), may include a thirteenth switch control input configured to receive the thirteenth switch control signal 2478 from the µC charge pump control circuit 2414A. The µC charge pump control circuit 2414A may configure the thirteenth switch control signal 2478 to operably open and close the thirteenth switch 2480, (SW13), based upon the various modes of operation of the µC charge pump 2410.

The fourteenth switch 2484, (SW14), may be coupled between the second terminal 2424B of the first flying capacitor 2424 and the second output 2418. The fourteenth switch 2484, (SW14), may include a fourteenth switch control input configured to receive the fourteenth switch control signal 2482 from the µC charge pump control circuit 2414A. The µC charge pump control circuit 2414A may configure the fourteenth switch control signal 2482 to operably open and close the fourteenth switch 2484, (SW14), based upon the various modes of operation of the µC charge pump 2410.

The fifteenth switch 2488, (SW15), may be coupled between the second terminal 2424B of the first flying capacitor 2424 and the battery voltage, $V_{BAT}$. The fifteenth switch 2488, (SW15), may include a fifteenth switch control input configured to receive the fifteenth switch control signal 2486 from the µC charge pump control circuit 2414A. The µC charge pump control circuit 2414A may configure the fifteenth switch control signal 2486 to operably open and close the fifteenth switch 2488, (SW15), based upon the various modes of operation of the µC charge pump 2410.

The sixteenth switch 2492, (SW16), may be coupled between the battery voltage, $V_{BAT}$, and the first output 2416. The sixteenth switch 2492, (SW16), may include a sixteenth switch control input configured to receive the sixteenth switch control signal 2490 from the µC charge pump control circuit 2414A. The µC charge pump control circuit 2414A may configure the sixteenth switch control signal 2490 to operably open and close the sixteenth switch 2492, (SW16), based upon the various modes of operation of the µC charge pump 2410.

The seventeenth switch 2496, (SW17), may be coupled between the battery voltage, $V_{BAT}$, and the second output 2418. The seventeenth switch 2496, (SW17), may include a seventeenth switch control input configured to receive the seventeenth switch control signal 2494 from the µC charge pump control circuit 2414A. The µC charge pump control circuit 2414A may configure the seventeenth switch control signal 2494 to operably open and close the seventeenth switch 2496, (SW17), based upon the various modes of operation of the µC charge pump 2410.

Numerous example embodiments of the modes of operation of the µC charge pump 2410 will now be described. These example embodiments of the modes of operation of the µC charge pump 2410 are by illustration and not by way of limitation. For example, various other modes of operation of the µC charge pump 2410 may be used to generate different magnitudes of the first output voltage $V_{FIRST-OUTPUT}$ 2416VO on the first output 2416 and the second output voltage $V_{SECOND-OUTPUT}$ 2418VO on the second output 2418. These additional various other modes of operation of the µC charge pump 2410, as would be evident to one of ordinary skill in the art, are thereby included herein. In addition, for the sake of clarity and brevity, the foregoing description of the modes of operation of the µC charge pump 2410 will be accomplished by describing a configuration where a supply voltage for the µC charge pump 2410 is powered by a battery voltage, $V_{BAT}$, derived from the battery 20.

The description of the modes of operation of the µC charge pump 2410 based on the battery voltage, $V_{BAT}$, is derived from the battery 20 and is not by way of limitation and only meant to aid the understanding of the modes of operation of the µC charge pump 2410 and the ratios between the first output voltage $V_{FIRST-OUTPUT}$ 2416VO to voltage level of the battery voltage, $V_{BAT}$, and the ratios between the second output voltage $V_{SECOND-OUTPUT}$ 2418VO to the voltage level of the battery voltage, $V_{BAT}$.

A non-limiting set of example operational modes of the µC charge pump 2410 will now be discussed with reference to various tables, provided herein. Example operational modes of the µC charge pump 2410 may include one or more buck/buck modes of operation, one or more buck/boost modes of operation, and/or one or more boost/buck modes of operation. In addition, those of ordinary skill in the art may recognize that various other modes of operation may be achieve by the µC charge pump 2410 including a number of boost/boost modes of operation. In addition, additional modes of operation may be achieved such that the first output voltage $V_{FIRST-OUTPUT}$ 2416VO and the second output voltage $V_{SECOND-OUTPUT}$ 2418VO are substantially equal.

TABLE 1A, entitled "MODES OF OPERATION TABLE FOR BUCK/BUCK OPERATION OF A DUAL OUTPUT µC CHARGE PUMP CIRCUIT," describes, in tabulated form, several, non-limiting, example modes of operation of the µC charge pump 2410 configured to operate in a buck/buck mode of operation. The described non-limiting example modes of Buck/Buck modes of operation include: a First ($1^{st}$) Buck/Buck Mode, a Second ($2^{nd}$) Buck/Buck Mode, a Third ($3^{rd}$) Buck/Buck Mode, a Fourth ($4^{th}$) Buck/Buck Mode, a Fifth ($5^{th}$) Buck/Buck Mode, a First ($1^{st}$) Bypass Mode, a Second ($2^{nd}$) Bypass Mode, a Third ($3^{rd}$) Bypass Mode, and an OFF Mode. In addition, although not described in detail below, it will be understood that the µC charge pump 2410 may be further configured to operate in additional buck/buck modes of operation, as described in TABLE 1B, entitled "MODES OF OPERATION TABLE FOR BUCK/BUCK OPERATION OF A DUAL OUTPUT µC CHARGE PUMP CIRCUIT." These addition, non-limiting examples, of Buck/Buck modes of operation may include: a Sixth ($6^{th}$) Buck/Buck Mode, a Seventh ($7^{th}$) Buck/Buck Mode, an Eighth ($8^{th}$) Buck/Buck Mode, a Ninth ($9^{th}$) Buck/Buck Mode, a Tenth ($10^{th}$) Buck/Buck Mode, a Fifth ($5^{th}$) Bypass Mode, a Fifth ($5^{th}$) Bypass Mode, and a Sixth ($6^{th}$) Bypass Mode.

As depicted in TABLE 1A, each example mode of operation corresponds to an operational ratio, ($\mu BB_{RATIO}$), of the µC charge pump 2410, where the operational ratio, ($\mu BB_{RATIO}$), may provide a relationship between the first output voltage $V_{FIRST-OUTPUT}$ 2416VO generated by the first output 2416 and the second output voltage $V_{SECOND-OUTPUT}$ 2418VO generated by the second output 2418. The operational ratio, ($\mu BB_{RATIO}$), may be an operational ratio parameter that is configured by the controller 50 and stored locally in the µC charge pump control circuit 2414A.

As described in Table 1A, the µC charge pump 2410 is configured to generate a first output voltage $V_{FIRST-OUTPUT}$ 2416VO substantially equal to $(\mu BB_{RATIO}) \times V_{BAT}$. In addition, the µC charge pump 2410 is further configured to generate a second output $V_{SECOND-OUTPUT}$ substantially equal to $(1-\mu BB_{RATIO}) \times V_{BAT}$.

Accordingly, in the First Buck/Buck Mode of operation of the µC charge pump 2410, the controller 50 may configure the µC charge pump control circuit 2414A to use an operational ratio, ($\mu BB_{RATIO}$), set to ¼. As a result, the first output 2416 generates a first output voltage $V_{FIRST-OUTPUT}$ 2416VO substantially equal to $¼ \times V_{BAT}$, and the second output 2418 generates a second output voltage $V_{SECOND-OUTPUT}$ 2418VO substantially equal to $¾ \times V_{BAT}$.

In the Second Buck/Buck Mode of operation of the µC charge pump 2410, the controller 50 configures the µC charge pump control circuit 2414A to use an operational ratio, ($\mu BB_{RATIO}$), set to ⅓. As a result, the first output 2416 generates a first output voltage $V_{FIRST-OUTPUT}$ 2416VO substantially equal to $⅓ \times V_{BAT}$, and the second output 2418 generates a second output voltage $V_{SECOND-OUTPUT}$ 2418VO substantially equal to $⅔ \times V_{BAT}$.

In the Third Buck/Buck Mode of operation of the µC charge pump 2410, the controller 50 configures the µC charge pump control circuit 2414A to use an operational ratio, ($\mu BB_{RATIO}$), set to ½. As a result, the first output 2416 generates a first output voltage $V_{FIRST-OUTPUT}$ 2416VO substantially equal to $½ \times V_{BAT}$, and the second output 2418 generates a second output voltage $V_{SECOND-OUTPUT}$ 2418VO substantially equal to $½ \times V_{BAT}$.

In the Fourth Buck/Buck Mode of operation of the µC charge pump 2410, the controller 50 configures the µC charge pump control circuit 2414A to use an operational ratio, ($\mu BB_{RATIO}$), set to ⅔. As a result, the first output 2416 generates a first output voltage $V_{FIRST-OUTPUT}$ 2416VO substantially equal to $⅔ \times V_{BAT}$, and the second output 2418 generates a second output voltage $V_{SECOND-OUTPUT}$ 2418VO substantially equal to $⅓ \times V_{BAT}$.

In the Fifth Buck/Buck Mode of operation of the µC charge pump 2410, the controller 50 configures the µC charge pump control circuit 2414A to use an operational ratio, ($\mu BB_{RATIO}$), set to ¾. As a result, the first output 2416 generates a first output voltage $V_{FIRST-OUTPUT}$ 2416VO substantially equal to $¾ \times V_{BAT}$, and the second output 2418 generates a second output voltage $V_{SECOND-OUTPUT}$ 2418VO substantially equal to $¼ \times V_{BAT}$. In the OFF Mode of operation of the µC charge pump 2410, the controller 50 configures the first output 2416 to float and the second output 2418 to float.

In the First Bypass Mode of operation of the µC charge pump 2410, the controller 50 may configure the µC charge pump control circuit 2414A to use any number of available operational ratios, ($\mu BB_{RATIO}$), to generate the second output voltage $V_{SECOND-OUTPUT}$ 2418VO. The controller 50 further configures the sixteenth switch 2492, (SW16) to be closed. As a result, the first output 2416 generates a first output voltage $V_{FIRST-OUTPUT}$ 2416VO substantially equal to $V_{BAT}$.

The controller 50 may also configure the second switch 2416, (SW2), the fourth switch 2444, (SW4), the seven switch 2456, (SW7), and the ninth switch 2496, (SW9), to be open in order to decouple the second output 2416 from the internal switching of the switching network 2412. Alternatively, in some additional modes of operation, the controller 50 may selectively configure the second switch 2416, (SW2), the fourth switch 2444, (SW4), the seven switch 2456, (SW7), and the ninth switch 2496, (SW9), to be closed during a mode of operation to obtain a desired output voltage level on the second output voltage $V_{SECOND-OUTPUT}$ 2418VO.

For example, because the first flying capacitor 2424 and the second flying capacitor 2426 are not used to generate the first output voltage V$_{FIRST-OUTPUT}$ 2416VO, the controller 50 may at least generate a second output voltage V$_{SECOND-OUTPUT}$ 2418VO substantially equal to $(1-\mu BB_{RATIO}) \times V_{BAT}$, $(\mu B_{RATIO}) \times V_{BAT}$. In addition, as described further below, the controller 50 may at least generate a second output voltage V$_{SECOND-OUTPUT}$ 2418VO substantially equal to $(1+\mu BB_{RATIO}) \times V_{BAT}$.

In the OFF Mode of operation of the μC charge pump 2410, the controller 50 configures the first output 2416 to float and the second output 2418 to float.

2410 into phases of operation. For example, μC charge pump control circuit 2414A may be configured to operate in a first phase, a second phase, a third phase, a fourth phase, and so forth. During each phase of operation of the μC charge pump 2410, the μC charge pump control circuit 2414A may be configured to change the switch state (open or closed) of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8),

TABLE 1A

MODES OF OPERATION TABLE FOR BUCK/BUCK OPERATION OF A μC CHARGE PUMP CIRCUIT

| MODES OF OPERATION | OPERATIONAL RATIOS, ($\mu BB_{RATIO}$) | V$_{FIRST-OUTPUT}$ = ($\mu BB_{RATIO}$) × V$_{BAT}$ | V$_{SECOND-OUTPUT}$ = $(1 - \mu BB_{RATIO}) \times V_{BAT}$ |
|---|---|---|---|
| First Buck/Buck Mode | 1/4 | 1/4 × V$_{BAT}$ | 3/4 × V$_{BAT}$ |
| Second Buck/Buck Mode | 1/3 | 1/3 × V$_{BAT}$ | 2/3 × V$_{BAT}$ |
| Third Buck/Buck Mode | 1/2 | 1/2 × V$_{BAT}$ | 1/2 × V$_{BAT}$ |
| Fourth Buck/Buck Mode | 2/3 | 2/3 × V$_{BAT}$ | 1/3 × V$_{BAT}$ |
| Fifth Buck/Buck Mode | 3/4 | 3/4 × V$_{BAT}$ | 1/4 × V$_{BAT}$ |
| First Bypass Mode | $\mu BB_{RATIO}$ | V$_{BAT}$ | $(1 - \mu BB_{RATIO}) \times V_{BAT}$ or FLOATING |
| Second Bypass Mode | $\mu BB_{RATIO}$ | $(\mu BB_{RATIO}) \times V_{BAT}$ or FLOATING | V$_{BAT}$ |
| Third Bypass Mode | $\mu BB_{RATIO}$ | V$_{BAT}$ | V$_{BAT}$ |
| OFF Mode | OFF | FLOATING | FLOATING |

TABLE 1B

MODES OF OPERATION TABLE FOR BUCK/BUCK OPERATION OF A μC CHARGE PUMP CIRCUIT

| MODES OF OPERATION | OPERATIONAL RATIOS, ($\mu BB_{RATIO}$) | V$_{FIRST-OUTPUT}$ = $(1 - \mu BB_{RATIO}) \times V_{BAT}$ | V$_{SECOND-OUTPUT}$ = ($\mu BB_{RATIO}$) × V$_{BAT}$ |
|---|---|---|---|
| Sixth Buck/Buck Mode | 1/4 | 3/4 × V$_{BAT}$ | 1/4 × V$_{BAT}$ |
| Seventh Buck/Buck Mode | 1/3 | 2/3 × V$_{BAT}$ | 1/3 × V$_{BAT}$ |
| Eighth Buck/Buck Mode | 1/2 | 1/2 × V$_{BAT}$ | 1/2 × V$_{BAT}$ |
| Ninth Buck/Buck Mode | 2/3 | 1/3 × V$_{BAT}$ | 2/3 × V$_{BAT}$ |
| Tenth Buck/Buck Mode | 3/4 | 1/4 × V$_{BAT}$ | 3/4 × V$_{BAT}$ |
| Fourth Bypass Mode | $\mu BB_{RATIO}$ | V$_{BAT}$ | $(\mu BB_{RATIO}) \times V_{BAT}$ or FLOATING |
| Third Bypass Mode | $\mu BB_{RATIO}$ | $(1 - \mu BB_{RATIO}) \times V_{BAT}$ or FLOATING | V$_{BAT}$ |
| Foruth Bypass Mode | $\mu BB_{RATIO}$ | V$_{BAT}$ | V$_{BAT}$ |
| OFF MODE | 0 | FLOATING | FLOATING |

Based on the mode of operation of the μC charge pump 2410, the controller 50 may configure the μC charge pump control circuit 2414A to control the switch state (open or closed) of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17) based upon the μC charge pump clock 68.

For example, in some embodiments of the μC charge pump 2410, the μC charge pump control circuit 2414A may be configured to divide the operation of the μC charge pump 2410 into phases of operation. For example, μC charge pump control circuit 2414A may be configured to operate in a first phase, a second phase, a third phase, a fourth phase, and so forth. During each phase of operation of the μC charge pump 2410, the μC charge pump control circuit 2414A may be configured to change the switch state (open or closed) of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17), for a period of time.

In some embodiments of the μC charge pump 2410, depicted in FIG. 4A, the μC charge pump control circuit 2414A may configure the period of time for each phase of operation of the μC charge pump 2410 to be substantially equal. For example, the μC charge pump 2410 may remain in each phase of operation for the same number of clock cycles of the μC charge pump clock 68.

In other embodiments of the μC charge pump 2410, depicted in FIG. 4A, the μC charge pump control circuit 2414A may configure the period of time for each phase of operation of the μC charge pump 2410 to be different to optimize the efficiency of the μC charge pump 2410 when operating in a particular mode of operation. For example, in some modes of operation, the μC charge pump control circuit 2414A may configure the μC charge pump 2410 to remain in a first phase of operation for a first number of clock cycles of the μC charge pump clock 68 and remain in a second phase of operation for a second number of clock cycles of the μC charge pump clock 68. The period of time for each phase of operation may be based upon one or more of the various factors including, but not limited to, the size of each of the μC charge pump switches, the current load associated with each of the first output 2416 and the second output 2418, the combination of the first output voltage $V_{FIRST-OUTPUT}$ 2416VO and the second output voltage $V_{SECOND-OUTPUT}$ 2418VO generated at the respective first output 2416 and the second output 2418.

The maximum switching frequency between the phases of operation may be a function of the setting times of the first output voltage $V_{FIRST-OUTPUT}$ 2416VO and the second output voltage $V_{SECOND-OUTPUT}$ 2418VO generated at the respective first output 2416 and the second output 2418. The settling times may be a function of the series resistance of the μC charge pump switches used to generate each of the first output voltage $V_{FIRST-OUTPUT}$ 2416VO and the second output voltage $V_{SECOND-OUTPUT}$ 2418VO. The setting time may also depend on the capacitance values of the first output capacitor 2420 and the second output capacitor 2422.

In addition, to minimize switching noise and interference signals, in some embodiments of the μC charge pump 2410, the μC charge pump control circuit 2414A may align the phases of operation of the μC charge pump 2410 such that the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17), may switch states based on or in alignment with the switching frequency of the switch mode power supply converter 872.

Continuing with the description of the various example embodiments of the modes of operation of the μC charge pump 2410 described in TABLE 1A, TABLE 1B-1, TABLE 1B-2, and TABLE 1B-3, entitled "SWITCH OPERATION TABLES FOR BUCK/BUCK OPERATION OF A μC CHARGE PUMP," describe the switch state (open or closed) of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17), of the μC charge pump 2410 when the μC charge pump 2410 is configured to operate in an identifed buck/buck mode of operation. In addition, TABLE 1B-1 and TABLE 1B-2 also provide the corresponding operational ratio, ($\mu BB_{RATIO}$), of the μC charge pump 2410, used in the identified buck/buck mode of operation. Also, TABLE 1B-1, TABLE 1B-2, and Table 1B-3 describe the switch state of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17), relative to a particular phase of operation of the μC charge pump 2410.

As used in TABLE 1B-1, TABLE 1B-2, and TABLE 1B-3, "PHASE 1" indicates that the μC charge pump 2410 is configured to operate in a first phase of operation, where the μC charge pump control circuit 2414A configures the switch state (open or closed) of the identified μC charge pump switch to be closed during the time period of the first phase of operation. "PHASE 2" indicates that the μC charge pump 2410 is configured to operate in a second phase of operation, where the μC charge pump control circuit 2414A configures the switch state (open or closed) of the identified μC charge pump switch to be closed during the time period of the second phase of operation. "PHASE 3" indicates that the μC charge pump 2410 is configured to operate in a third phase of operation, where the μC charge pump control circuit 2414A configures the switch state (open or closed) of the identified μC charge pump switch to be closed during the time period of the third phase of operation. "PHASE 4" indicates that the μC charge pump 2410 is configured to operate in a fourth phase of operation, where the μC charge pump control circuit 2414A configures the switch state (open or closed) of the identified μC charge pump switch to be closed during the time period of the fourth phase of operation. "OPEN" indicates that the μC charge pump control circuit 2414A configures the switch state (open or closed) of the identified switch to be closed during all the phases of operation of the μC charge pump 2410.

TABLE 1B-1

SWITCH OPERATION TABLE FOR BUCK/BUCK MODE OF OPERATION OF A μC CHARGE PUMP

MODES OF OPERATION FOR BUCK/BUCK OPERATION OF DUAL OUTPUT μC CHARGE PUMP WITH CORRESPONDING OPERATIONAL RATIOS, ($\mu BB_{RATIO}$)

| See, TABLE 1A μC CHARGE PUMP SWITCHES | First Buck/Buck Mode, ($\mu BB_{RATIO}$ = 1/4), where $V_{FIRST-OUTPUT}$ = 1/4 × $V_{BAT}$ and $V_{SECOND-OUTPUT}$ = 3/4 × $V_{BAT}$ | Second Buck/Buck Mode, ($\mu BB_{RATIO}$ = 1/3), where $V_{FIRST-OUTPUT}$ = 1/3 × $V_{BAT}$, and $V_{SECOND-OUTPUT}$ = 2/3 × $V_{BAT}$ | Third Buck/Buck Mode, ($\mu BB_{RATIO}$ = 1/2), where $V_{FIRST-OUTPUT}$ = 1/2 × $V_{BAT}$, and $V_{SECOND-OUTPUT}$ = 1/2 × $V_{BAT}$ |
|---|---|---|---|
| SW1 | Phase 1 | Phase 1 and Phase 3 | Phase 1 and Phase 3 |
| SW2 | OPEN | Phase 2 | Phase 2 |
| SW3 | Phase 3 | Phase 2 | Phase 2 |
| SW4 | OPEN | OPEN | Phase 1 |
| SW5 | Phase 1 | Phase 1 | OPEN |

TABLE 1B-1-continued

SWITCH OPERATION TABLE FOR BUCK/BUCK MODE OF OPERATION OF A μC CHARGE PUMP

MODES OF OPERATION FOR BUCK/BUCK OPERATION OF DUAL OUTPUT μC CHARGE PUMP WITH CORRESPONDING OPERATIONAL RATIOS, (μBB$_{RATIO}$)

| See, TABLE 1A μC CHARGE PUMP SWITCHES | First Buck/Buck Mode, (μBB$_{RATIO}$ = 1/4), where V$_{FIRST-OUTPUT}$ = 1/4 × V$_{BAT}$, and V$_{SECOND-OUTPUT}$ = 3/4 × V$_{BAT}$ | Second Buck/Buck Mode, (μBB$_{RATIO}$ = 1/3), where V$_{FIRST-OUTPUT}$ = 1/3 × V$_{BAT}$, and V$_{SECOND-OUTPUT}$ = 2/3 × V$_{BAT}$ | Third Buck/Buck Mode, (μBB$_{RATIO}$ = 1/2), where V$_{FIRST-OUTPUT}$ = 1/2 × V$_{BAT}$, and V$_{SECOND-OUTPUT}$ = 1/2 × V$_{BAT}$ |
|---|---|---|---|
| SW6 | OPEN | Phase 3 | Phase 1 |
| SW7 | Phase 2 | Phase 2 | Phase 2 |
| SW8 | Phase 2 | Phase 2 | Phase 2 |
| SW9 | Phase 1 and Phase 3 | Phase 1 | Phase 1 |
| SW10 | Phase 3 and Phase 4 | OPEN | Phase 3 |
| SW11 | Phase 4 | OPEN | OPEN |
| SW12 | OPEN | Phase 3 | Phase 3 |
| SW13 | OPEN | OPEN | OPEN |
| SW14 | Phase 4 | Phase 3 | Phase 3 |
| SW15 | OPEN | OPEN | OPEN |
| SW16 | OPEN | OPEN | OPEN |
| SW17 | OPEN | OPEN | OPEN |

TABLE 1B-2

SWITCH OPERATION TABLE FOR BUCK/BUCK MODE OF OPERATION OF A μC CHARGE PUMP

MODES OF OPERATION FOR BUCK/BUCK OPERATION OF DUAL OUTPUT μC CHARGE PUMP WITH CORRESPONDING OPERATIONAL RATIOS, (μBB$_{RATIO}$)

| See, TABLE 1A μC CHARGE PUMP SWITCHES | Fourth Buck/Buck Mode, (μBB$_{RATIO}$ = 2/3), where V$_{FIRST-OUTPUT}$ = 2/3 × V$_{BAT}$, and V$_{SECOND-OUTPUT}$ = 1/3 × V$_{BAT}$ | Fifth Buck/Buck Mode, (μBB$_{RATIO}$ = 3/4), where V$_{FIRST-OUTPUT}$ = 3/4 × V$_{BAT}$, and V$_{SECOND-OUTPUT}$ = 1/4 × V$_{BAT}$ | OFF Mode where V$_{FIRST-OUTPUT}$ = FLOAT V$_{SECOND-OUTPUT}$ = FLOAT |
|---|---|---|---|
| SW1 | Phase 1 and Phase 3 | Phase 4 | OPEN |
| SW2 | Phase 2 | Phase 3 | OPEN |
| SW3 | OPEN | OPEN | OPEN |
| SW4 | Phase 1 | Phase 1 | OPEN |
| SW5 | Phase 2 and Phase 3 | Phase 3 and Phase 4 | OPEN |
| SW6 | Phase 1 | Phase 2 | OPEN |
| SW7 | OPEN | OPEN | OPEN |
| SW8 | Phase 2 | Phase 3 | OPEN |
| SW9 | Phase 1 | Phase 2 | OPEN |
| SW10 | OPEN | Phase 1 | OPEN |
| SW11 | OPEN | Phase 1 | OPEN |
| SW12 | Phase 3 | Phase 4 | OPEN |
| SW13 | OPEN | OPEN | OPEN |
| SW14 | OPEN | OPEN | OPEN |
| SW15 | OPEN | OPEN | OPEN |
| SW16 | OPEN | OPEN | OPEN |
| SW17 | OPEN | OPEN | OPEN |

TABLE 1B-3

SWITCH OPERATION TABLE FOR BUCK/BUCK MODE OF OPERATION OF A μC CHARGE PUMP

MODES OF OPERATION FOR BUCK/BUCK OPERATION OF DUAL OUTPUT μC CHARGE PUMP WITH CORRESPONDING OPERATIONAL RATIOS, (μBB$_{RATIO}$)

| See, TABLE 1A μC CHARGE PUMP SWITCHES | First Bypass Mode, (μBB$_{RATIO}$ = permissible value), where V$_{FIRST-OUTPUT}$ = V$_{BAT}$, and V$_{SECOND-OUTPUT}$ = μBB$_{RATIO}$ × V$_{BAT}$ | Second Bypass Mode, (μBB$_{RATIO}$ = permissible value), where V$_{FIRST-OUTPUT}$ = μBB$_{RATIO}$ × V$_{BAT}$, and V$_{SECOND-OUTPUT}$ = μBB$_{RATIO}$ × V$_{BAT}$ | Third Bypass Mode where V$_{FIRST-OUTPUT}$ = V$_{BAT}$ V$_{SECOND-OUTPUT}$ = V$_{BAT}$ |
|---|---|---|---|
| SW1 | X | X | CLOSED ALL PHASES |
| SW2 | OPEN | X | CLOSED ALL PHASES |
| SW3 | X | X | OPEN |
| SW4 | OPEN | X | OPEN |
| SW5 | X | X | OPEN |
| SW6 | X | X | CLOSED ALL PHASES |

TABLE 1B-3-continued

SWITCH OPERATION TABLE FOR BUCK/BUCK MODE OF OPERATION OF A μC CHARGE PUMP

MODES OF OPERATION FOR BUCK/BUCK OPERATION OF DUAL OUTPUT μC CHARGE PUMP WITH CORRESPONDING OPERATIONAL RATIOS, ($\mu BB_{RATIO}$)

| See, TABLE 1A μC CHARGE PUMP SWITCHES | First Bypass Mode, ($\mu BB_{RATIO}$ = permissible value), where $V_{FIRST\text{-}OUTPUT} = V_{BAT}$, and $V_{SECOND\text{-}OUTPUT} = \mu BB_{RATIO} \times V_{BAT}$ | Second Bypass Mode, ($\mu BB_{RATIO}$ = permissible value), where $V_{FIRST\text{-}OUTPUT} = \mu BB_{RATIO} \times V_{BAT}$, and $V_{SECOND\text{-}OUTPUT} = \mu BB_{RATIO} \times V_{BAT}$ | Third Bypass Mode where $V_{FIRST\text{-}OUTPUT} = V_{BAT}$ $V_{SECOND\text{-}OUTPUT} = V_{BAT}$ |
|---|---|---|---|
| SW7  | OPEN              | X                 | CLOSED ALL PHASES |
| SW8  | X                 | X                 | OPEN              |
| SW9  | OPEN              | X                 | OPEN              |
| SW10 | X                 | X                 | OPEN              |
| SW11 | X                 | X                 | OPEN              |
| SW12 | X                 | OPEN              | OPEN              |
| SW13 | X                 | OPEN              | CLOSED ALL PHASES |
| SW14 | X                 | OPEN              | OPEN              |
| SW15 | X                 | OPEN              | OPEN              |
| SW16 | CLOSED ALL PHASES | X                 | CLOSED ALL PHASES |
| SW17 | X                 | CLOSED ALL PHASES | CLOSED ALL PHASES |

TABLE 1B-1 describes the operation of the μC charge pump 2410 when the controller 50 configures the μC charge pump 2410 to operate in the First (1$^{st}$) Buck/Buck Mode. The controller 50 configures the μC charge pump control circuit 2414A to use an operational ratio, ($\mu BB_{RATIO}$), set to ¼. The μC charge pump control circuit 2414A operably divides the operation of the μC charge pump 2410 into four phases of operation. The μC charge pump control circuit 2414A operably configures the switching network 2412 such that first output 2416 generates a first output voltage $V_{FIRST\text{-}OUTPUT}$ 2416VO substantially equal to $¼ \times V_{BAT}$, and the second output 2418 generates a second output voltage $V_{SECOND\text{-}OUTPUT}$ 2418VO substantially equal to $¾ \times V_{BAT}$.

In the first phase of operation, (Phase 1), the μC charge pump control circuit 2414A operably closes the first switch 2432, (SW1), the fifth switch 2448, (SW5), and the ninth switch 2464, (SW9), to place the first flying capacitor 2424 and the second flying capacitor 2426 in series between the battery voltage, $V_{BAT}$, and the first output 2416. Charge is transferred from the battery voltage, $V_{BAT}$, ($V_{BAT}$), to the first output capacitor 2420 via the first flying capacitor 2424 and the second flying capacitor 2426. The first flying capacitor voltage $V_{FIRST\text{-}FLYCAP}$ 2424FC and the second flying capacitor voltage $V_{SECOND\text{-}FLYCAP}$ 2426FC are subtracted from the battery voltage, $V_{BAT}$, to provide a first output voltage $V_{FIRST\text{-}OUTPUT}$ 2416VO substantially equal to $¼ \times V_{BAT}$, on the first output 2416. Also, during the first phase of operation, (Phase 1), the μC charge pump control circuit 2414A configures the remaining μC charge pump switches to be open, which disconnects the second output 2418 from the first flying capacitor 2424 and the second flying capacitor 2426. In this case, the second output 2418 provides a second output voltage $V_{SECOND\text{-}OUTPUT}$ 2418VO substantially equal to $¾ \times V_{BAT}$, from the charge already stored on the second output capacitor 2422.

In the second phase of operation, (Phase 2), the μC charge pump control circuit 2414A operably closes the seventh switch 2456, (SW7), and the eighth switch 2460, (SW8), to place the second flying capacitor 2426 between the first output 2416 and ground. The charge stored on the second flying capacitor 2426 and first output capacitor 2420 is sourced to the first output 2416 to provide the first output voltage $V_{FIRST\text{-}OUTPUT}$ 2416VO substantially equal to $¼ \times V_{BAT}$. Similar to the first phase of operation, (Phase 1), the second output 2418 continues to provide the second output voltage $V_{SECOND\text{-}OUTPUT}$ 2418VO substantially equal to $¾ \times V_{BAT}$, from the charge already stored on the second output capacitor 2422.

In the third phase of operation, (Phase 3), the μC charge pump control circuit 2414A operably closes the third switch 2440, (SW3), the ninth switch 2464, (SW9), and the tenth switch 2468, (SW10). As a result, the second terminal 2424B of the first flying capacitor 2424 is tied to ground, the first terminal 2424A of the first flying capacitor 2424 is coupled to the first terminal 2426A of the second flying capacitor 2426 and the second terminal 2426B of the second flying capacitor 2426 is coupled to the first output 2416.

Accordingly, charge stored on the first flying capacitor 2424 and the second flying capacitor 2426 is sourced to the first output 2416 to maintain the first output voltage $V_{FIRST\text{-}OUTPUT}$ 2416VO at a voltage level substantially equal to $¼ \times V_{BAT}$. The a first output voltage $V_{FIRST\text{-}OUTPUT}$ 2416VO remains substantially equal to $¼ \times V_{BAT}$, where the magnitude of the first output voltage $V_{FIRST\text{-}OUTPUT}$ 2416VO is determined by subtracting the second flying capacitor voltage $V_{SECOND\text{-}FLYCAP}$ 2426FC from the first flying capacitor voltage $V_{FIRST\text{-}FLYCAP}$ 2424FC. Similar to the first phase of operation, (Phase 1), and the second phase of operation, (Phase 2), the second output 2418 continues to provide the second output voltage $V_{SECOND\text{-}OUTPUT}$ 2418VO substantially equal to $¾ \times V_{BAT}$, from the charge previously stored on the second output capacitor 2422.

In the fourth phase of operation, (Phase 4), the μC charge pump control circuit 2414A operably closes the tenth switch 2468, (SW10), the eleventh switch 2472, (SW11), and the fourteenth switch 2484, (SW14). During the fourth phase of operation, (Phase 4), charge is transferred from the battery voltage, $V_{BAT}$, to the second output capacitor 2422 via the first flying capacitor 2424 and the second flying capacitor 2426. The magnitude of the second output voltage $V_{SECOND\text{-}OUTPUT}$ 2418VO is determined by subtracting the second flying capacitor voltage $V_{SECOND\text{-}FLYCAP}$ 2426FC from the first flying capacitor voltage $V_{FIRST\text{-}FLYCAP}$ 2424FC and the battery voltage, $V_{BAT}$, ($V_{BAT}$). Accordingly, the second output 2418 provides a second output voltage $V_{SECOND\text{-}OUTPUT}$ 2418VO substantially equal to $¾ \times V_{BAT}$. During the fourth phase of operation, (Phase 4), the μC charge pump control circuit 2414A configures the remaining μC charge pump switches to be open, which disconnects the first output 2416 from the first flying capacitor 2424 and the second flying capacitor 2426. As a result, the first output 2416 provides the first output voltage $V_{FIRST\text{-}OUTPUT}$ 2416VO substantially equal to $¼ \times V_{BAT}$, from the charge stored on the first output capacitor 2420 during the other phases of operation.

Otherwise, the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17), remain open while the μC charge pump 2410 is configured to operate in the First (1$^{st}$) Buck/Buck Mode.

Having described the basic operation of the μC charge pump control circuit 2414A and the phases of operation of the μC charge pump 2410 in detail with respect to the case where the μC charge pump 2410 is configured to operate in the First (1st) Buck/Buck Mode, the remaining modes of operation of the μC charge pump 2410 will now be briefly described.

TABLE 1B-1 describes, and FIG. 4 depicts, the operation of the μC charge pump 2410 when the controller 50 configures the μC charge pump 2410 to operate in the Second (2$^{nd}$) Buck/Buck Mode. The controller 50 configures the μC charge pump control circuit 2414A to use an operational ratio, (μBB$_{RATIO}$), set to ⅓. The μC charge pump control circuit 2414A operably divides the operation of the μC charge pump 2410 into three phases of operation. The μC charge pump control circuit 2414A operably configures the switching network 2412 such that first output 2416 generates a first output voltage V$_{FIRST-OUTPUT}$ 2416VO substantially equal to ⅓×V$_{BAT}$, and the second output 2418 generates a second output voltage V$_{SECOND-OUTPUT}$ 2418VO substantially equal to ⅔×V$_{BAT}$.

As described in TABLE 1B-1 in the first phase of operation, (Phase 1), the μC charge pump control circuit 2414A operably closes the first switch 2432, (SW1), the fifth switch 2448, (SW5), and the ninth switch 2464, (SW9). In the second phase of operation, (Phase 2), the μC charge pump control circuit 2414A operably closes the second switch 2436, (SW2), the third switch 2440, (SW3), the seventh switch 2456, (SW7), and the eighth switch 2460, (SW8). In the third phase of operation, (Phase 3), the μC charge pump control circuit 2414A operably closes the first switch 2432, (SW1), the sixth switch 2452, (SW6), the twelfth switch 2476, (SW12), and the fourteenth switch 2484, (SW14). Otherwise, the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17), remain open while the μC charge pump 2410 is configured to operate in the Second (2$^{nd}$) Buck/Buck Mode.

As a result, the first flying capacitor 2424 develops a first flying capacitor voltage V$_{FIRST-FLYCAP}$ 2424FC substantially equal to ⅓×V$_{BAT}$, and the second flying capacitor 2426 develops a second flying capacitor voltage V$_{SECOND-FLYCAP}$ 2426FC substantially equal to ⅓×V$_{BAT}$. Accordingly, first output 2416 generates a first output voltage V$_{FIRST-OUTPUT}$ 2416VO substantially equal to ⅓×V$_{BAT}$, and the second output 2418 generates a second output voltage V$_{SECOND-OUTPUT}$ 2418VO substantially equal to ⅔×V$_{BAT}$.

TABLE 1B-1 describes the operation of the μC charge pump 2410 when the controller 50 configures the μC charge pump 2410 to operate in the Third (3$^{rd}$) Buck/Buck Mode. The controller 50 configures the μC charge pump control circuit 2414A to use an operational ratio, (μBB$_{RATIO}$), set to ½. The μC charge pump control circuit 2414A operably divides the operation of the μC charge pump 2410 into three phases of operation. The μC charge pump control circuit 2414A operably configures the switching network 2412 such that first output 2416 generates a first output voltage V$_{FIRST-OUTPUT}$ 2416VO substantially equal to ½×V$_{BAT}$, and the second output 2418 generates a second output voltage V$_{SECOND-OUTPUT}$ 2418VO substantially equal to ½×V$_{BAT}$.

As described in TABLE 1B-1, in the first phase of operation, (Phase 1), the μC charge pump control circuit 2414A operably closes the first switch 2432, (SW1), the fourth switch 2444, (SW4), the sixth switch 2452, (SW6), and the ninth switch 2464, (SW9). In the second phase of operation, (Phase 2), the μC charge pump control circuit 2414A operably closes the second switch 2436, (SW2), the third switch 2440, (SW3), the seventh switch 2456, (SW7), and the eighth switch 2460, (SW8). In the third phase of operation, (Phase 3), the μC charge pump control circuit 2414A operably closes the first switch 2432, (SW1), tenth switch 2468, (SW10), the twelfth switch 2476, (SW12), and the fourteenth switch 2484, (SW14). As a result, the first flying capacitor 2424 develops a first flying capacitor voltage V$_{FIRST-FLYCAP}$ 2424FC substantially equal to ½×V$_{BAT}$, and the second flying capacitor 2426 develops a second flying capacitor voltage V$_{SECOND-FLYCAP}$ 2426FC substantially equal to ½×V$_{BAT}$. Accordingly, first output 2416 generates a first output voltage V$_{FIRST-OUTPUT}$ 2416VO substantially equal to ½×V$_{BAT}$, on the first output capacitor 2420 and the second output 2418 generates a second output voltage V$_{SECOND-OUTPUT}$ 2418VO substantially equal to ½×V$_{BAT}$ on the second output capacitor 2422.

TABLE 1B-2 describes the operation of the μC charge pump 2410 when the controller 50 configures the μC charge pump 2410 to operate in the Fourth (4$^{th}$) Buck/Buck Mode. The controller 50 configures the μC charge pump control circuit 2414A to use an operational ratio, (μBB$_{RATIO}$), set to ⅔. The μC charge pump control circuit 2414A operably divides the operation of the μC charge pump 2410 into three phases of operation. The μC charge pump control circuit 2414A operably configures the switching network 2412 such that first output 2416 generates a first output voltage V$_{FIRST-OUTPUT}$ 2416VO substantially equal to ⅔×V$_{BAT}$, and the second output 2418 generates a second output voltage V$_{SECOND-OUTPUT}$ 2418VO substantially equal to ⅓×V$_{BAT}$.

As described in TABLE 1B-2, in the first phase of operation, (Phase 1), the μC charge pump control circuit 2414A operably closes the first switch 2432, (SW1), the fourth switch 2444, (SW4), the sixth switch 2452, (SW6), and the ninth switch 2464, (SW9). In the second phase of operation, (Phase 2), the μC charge pump control circuit 2414A operably closes the second switch 2436, (SW2), the fifth switch 2448, (SW5), and the eighth switch 2460, (SW8). In the third phase of operation, (Phase 3), the μC charge pump control circuit 2414A operably closes the first switch 2432, (SW1), the fifth switch 2448, (SW5), and the twelfth switch 2476, (SW12).

As a result, the first flying capacitor 2424 develops a first flying capacitor voltage V$_{FIRST-FLYCAP}$ 2424FC substantially equal to ⅓×V$_{BAT}$, and the second flying capacitor 2426 develops a second flying capacitor voltage V$_{SECOND-FLYCAP}$ 2426FC substantially equal to ⅓×V$_{BAT}$. Accordingly, first output 2416 generates a first output voltage V$_{FIRST-OUTPUT}$ 2416VO substantially equal to ⅔×V$_{BAT}$, on the first output capacitor 2420 and the second output 2418 generates a second output voltage V$_{SECOND-OUTPUT}$ 2418VO substantially equal to ⅓×V$_{BAT}$ on the second output capacitor 2422.

TABLE 1B-2 describes the operation of the μC charge pump 2410 when the controller 50 configures the μC charge pump 2410 to operate in the Fifth (5$^{th}$) Buck/Buck Mode. The controller 50 configures the μC charge pump control circuit 2414A to use an operational ratio, (μBB$_{RATIO}$), set to ¾. The μC charge pump control circuit 2414A operably divides the operation of the μC charge pump 2410 into four phases of operation. The μC charge pump control circuit 2414A operably configures the switching network 2412 such that first output 2416 generates a first output voltage V$_{FIRST-OUTPUT}$ 2416VO substantially equal to ¾×V$_{BAT}$, and the second output 2418 generates a second output voltage V$_{SECOND-OUTPUT}$ 2418VO substantially equal to ¼×V$_{BAT}$.

As described in TABLE 1B-2, in the first phase of operation, (Phase 1), the μC charge pump control circuit 2414A operably closes the fourth switch 2444, (SW4), the tenth switch 2468, (SW10), and the eleventh switch 2472, (SW11). In the second phase of operation, (Phase 2), the μC charge pump control circuit 2414A operably closes the sixth switch 2452, (SW6), and the ninth switch 2464, (SW9). As further described in TABLE 1B-2, in the third phase of operation, (Phase 3), the μC charge pump control circuit 2414A operably closes the second switch 2436, (SW2), the fifth switch 2448, (SW5), and the eighth switch 2460, (SW8). In the fourth phase of operation, (Phase 4), the μC charge pump control circuit 2414A operably closes the first switch 2432, (SW1), the fifth switch 2448, (SW5), and the twelfth switch 2476, (SW12).

As a result, the first flying capacitor 2424 develops a first flying capacitor voltage V$_{FIRST-FLYCAP}$ 2424FC substantially equal to ¾×V$_{BAT}$, and the second flying capacitor 2426 develops a second flying capacitor voltage V$_{SECOND-FLYCAP}$ 2426FC substantially equal to ¼×V$_{BAT}$. Accordingly, first output 2416 generates a first output voltage V$_{FIRST-OUTPUT}$ 2416VO substantially equal to ¾×V$_{BAT}$, on the first output capacitor 2420 and the second output 2418 generates a second output voltage V$_{SECOND-OUTPUT}$ 2418VO substantially equal to ¼× V$_{BAT}$ on the second output capacitor 2422.

As further described in TABLE 1B-2, the controller 50 may also configure the μC charge pump 2410 to operate in the OFF Mode of operation. As described in Table 1A, when the μC charge pump 2410 is configured in the OFF Mode of operation, both the first output 2416 and second output 2418 float. As described in TABLE 1B-2, when the controller 50 configures the μC charge pump 2410 to be in the OFF Mode of operation, the μC charge pump control circuit 2414A may operablely open the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17). As a result, the first output voltage V$_{FIRST-OUTPUT}$ 2416VO on the first output 2416 floats relative to ground.

Likewise, the second output voltage V$_{SECOND-OUTPUT}$ 2418VO on the second output 2418 floats relative to ground. It will be appreciated, by those skilled in the art, that the configurations and phases of operation of the μC charge pump 2410 to achieve the additional buck/buck modes of operation, as described in TABLE 1B, including the Sixth (6$^{th}$) Buck/Buck Mode, the Seventh (7$^{th}$) Buck/Buck Mode, the Eighth (8$^{th}$) Buck/Buck Mode, the Ninth (9$^{th}$) Buck/Buck Mode, and the Tenth (10$^{th}$) Buck/Buck Mode, may be understood based on the foregoing description of the operation of the μC charge pump 2410 to operate in either a buck/boost mode of operation or a boost/buck mode of operation, as described below. Accordingly, a detailed description of the configurations and phases of operation of the μC charge pump 2410 to achieve the additional buck/buck modes of operation, as described in TABLE 1 B, are omitted for the sake of brevity and not by way of limitation. In addition, as previously described with respect to the First Bypass Mode, the Second Bypass Mode, the Third Bypass Mode, the Fourth Bypass Mode, the Fifth Bypass Mode, and the Sixth Bypass Mode, the μC charge pump 2410 may buck or boost the battery voltage, (V$_{BAT}$), to obtain either a buck voltage output level or a boost output voltage level on the non-bypassed output; the bypassed output may have an output voltage substantially equal to the battery voltage, (V$_{BAT}$).

A non-limiting set of example operational modes of the μC charge pump 2410 configured to operate in a buck/boost mode of operation will now be discussed. As an example, TABLE 2A-1 and TABLE 2A-2, entitled "MODES OF OPERATION TABLE FOR BUCK/BOOST OPERATION OF A DUAL OUTPUT μC CHARGE PUMP CIRCUIT," describe, in tabulated form, several, non-limiting, example modes of operation of the μC charge pump 2410 configured to operate in a buck/boost mode of operation. As an example, the non-limiting example modes of buck/boost modes of operation described in TABLE 2A-1 include: a First (1$^{st}$) Buck/Boost Mode, a Second (2$^{nd}$) Buck/Boost Mode, a Third (3$^{rd}$) Buck/Boost Mode, a Fourth (4$^{th}$) Buck/Boost Mode, a Fifth (5$^{th}$) Buck/Boost Mode, and an OFF Mode. As another example, the non-limiting example modes of buck/boost modes of operation described in TABLE 2A-2 include: a Sixth (6$^{th}$) Buck/Boost Mode, a Seventh (7$^{th}$) Buck/Boost Mode, an Eighth (8$^{th}$) Buck/Boost Mode, a Ninth (9$^{th}$) Buck/Boost Mode, a Tenth (10$^{th}$) Buck/Boost Mode, and an OFF Mode. Additional bypass modes are not described for the sake of brevity, but fall within the scope of the operation of the described embodiment of the μC charge pump 2410.

As depicted in TABLE 2A-1 and TABLE 2A-2, each example buck/boost mode of operation of the μC charge pump 2410 corresponds to an operational ratio, (μBB$_{RATIO}$), where the operational ratio, (μBB$_{RATIO}$), may provide a relationship between the first output voltage V$_{FIRST-OUTPUT}$ 2416VO generated by the first output 2416 and the second output voltage V$_{SECOND-OUTPUT}$ 2418VO generated by the second output 2418. The operational ratio, (μBB$_{RATIO}$), may be an operational ratio parameter that is configured by the controller 50 and stored locally in the μC charge pump control circuit 2414A.

For example, TABLE 2A-1 describes example buck/boost modes of operation of the μC charge pump 2410 where the first output 2416 is configured to generate a first output voltage V$_{FIRST-OUTPUT}$ 2416VO such that V$_{FIRST-OUTPUT}$= (μBB$_{RATIO}$)×V$_{BAT}$. The second output 2418 is configured to generate a second output voltage V$_{SECOND-OUTPUT}$ 2418VO such that V$_{SECOND-OUTPUT}$=(1+μBB$_{RATIO}$)×V$_{BAT}$, where V$_{BAT}$ is used to represent the magnitude of the voltage on the battery voltage, V$_{BAT}$.

Accordingly, as described in TABLE 2A-1, in the First Buck/Boost Mode of operation of the μC charge pump 2410, the controller 50 configures the μC charge pump control circuit 2414A to use an operational ratio, (μBB$_{RATIO}$), set to ¼. As a result, the first output 2416 generates a first output voltage V$_{FIRST-OUTPUT}$ 2416VO substantially equal to ¼×V$_{BAT}$, and the second output 2418 generates a second output voltage V$_{SECOND-OUTPUT}$ 2418VO substantially equal to 5/4×V$_{BAT}$.

In the Second Buck/Boost Mode of operation of the µC charge pump 2410, the controller 50 configures the µC charge pump control circuit 2414A to use an operational ratio, (µBB$_{RATIO}$), set to ⅓. As a result, the first output 2416 generates a first output voltage V$_{FIRST-OUTPUT}$ 2416VO substantially equal to ⅓×V$_{BAT}$, and the second output 2418 generates a second output voltage V$_{SECOND-OUTPUT}$ 2418VO substantially equal to 4/3×V$_{BAT}$.

In the Third Buck/Boost Mode of operation of the µC charge pump 2410, the controller 50 configures the µC charge pump control circuit 2414A to use an operational ratio, (µBB$_{RATIO}$), set to ½. As a result, the first output 2416 generates a first output voltage V$_{FIRST-OUTPUT}$ 2416VO substantially equal to ½×V$_{BAT}$, and the second output 2418 generates a second output voltage V$_{SECOND-OUTPUT}$ 2418VO substantially equal to 3/2×V$_{BAT}$.

In the Fourth Buck/Boost Mode of operation of the µC charge pump 2410, the controller 50 configures the µC charge pump control circuit 2414A to use an operational ratio, (µBB$_{RATIO}$), set to ⅔. As a result, the first output 2416 generates a first output voltage V$_{FIRST-OUTPUT}$ 2416VO substantially equal to ⅔×V$_{BAT}$, and the second output 2418 generates a second output voltage V$_{SECOND-OUTPUT}$ 2418VO substantially equal to 5/3×V$_{BAT}$.

In the Fifth Buck/Boost Mode of operation of the µC charge pump 2410, the controller 50 configures the µC charge pump control circuit 2414A to use an operational ratio, (µBB$_{RATIO}$), set to ¾. As a result, the first output 2416 generates a first output voltage V$_{FIRST-OUTPUT}$ 2416VO substantially equal to ¾×V$_{BAT}$, and the second output 2418 generates a second output voltage V$_{SECOND-OUTPUT}$ 2418VO substantially equal to 7/4×V$_{BAT}$.

In the OFF Mode of operation of the µC charge pump 2410, the controller 50 configures the first output 2416 to float and the second output 2418 to float.

In contrast, TABLE 2A-2 describes other example buck/boost modes of operation of the µC charge pump 2410 where the first output 2416 is configured to generate a first output voltage V$_{FIRST-OUTPUT}$ 2416VO such that V$_{FIRST-OUTPUT}$=(1−µBB$_{RATIO}$)×V$_{BAT}$. The second output 2418 is configured generates a second output voltage V$_{SECOND-OUTPUT}$ 2418VO such that V$_{SECOND-OUTPUT}$=(1+µBB$_{RATIO}$)×V$_{BAT}$.

Accordingly, as described in TABLE 2A-2, in the Sixth Buck/Boost Mode of operation of the µC charge pump 2410, the controller 50 configures the µC charge pump control circuit 2414A to use an operational ratio, (µBB$_{RATIO}$), set to ¼. As a result, the first output 2416 generates a first output voltage V$_{FIRST-OUTPUT}$ 2416VO substantially equal to ¾×V$_{BAT}$, and the second output 2418 generates a second output voltage V$_{SECOND-OUTPUT}$ 2418VO substantially equal to 5/4×V$_{BAT}$.

In the Seventh Buck/Boost Mode of operation of the µC charge pump 2410, the controller 50 configures the µC charge pump control circuit 2414A to use an operational ratio, (µBB$_{RATIO}$), set to ⅓. As a result, the first output 2416 generates a first output voltage V$_{FIRST-OUTPUT}$ 2416VO substantially equal to ⅔×V$_{BAT}$, and the second output 2418 generates a second output voltage V$_{SECOND-OUTPUT}$ 2418VO substantially equal to 4/3×V$_{BAT}$.

In the Eighth Buck/Boost Mode of operation of the µC charge pump 2410, the controller 50 configures the µC charge pump control circuit 2414A to use an operational ratio, (µBB$_{RATIO}$), set to ½. As a result, the first output 2416 generates a first output voltage V$_{FIRST-OUTPUT}$ 2416VO substantially equal to ½×V$_{BAT}$, and the second output 2418 generates a second output voltage V$_{SECOND-OUTPUT}$ 2418VO substantially equal to 3/2×V$_{BAT}$.

In the Ninth Buck/Boost Mode of operation of the µC charge pump 2410, the controller 50 configures the µC charge pump control circuit 2414A to use an operational ratio, (µBB$_{RATIO}$), set to ⅔. As a result, the first output 2416 generates a first output voltage V$_{FIRST-OUTPUT}$ 2416VO substantially equal to ⅓×V$_{BAT}$, and the second output 2418 generates a second output voltage V$_{SECOND-OUTPUT}$ 2418VO substantially equal to 5/3×V$_{BAT}$.

In the Tenth Buck/Boost Mode of operation of the µC charge pump 2410, the controller 50 configures the µC charge pump control circuit 2414A to use an operational ratio, (µBB$_{RATIO}$), set to ¾. As a result, the first output 2416 generates a first output voltage V$_{FIRST-OUTPUT}$ 2416VO substantially equal to ¼×V$_{BAT}$, and the second output 2418 generates a second output voltage V$_{SECOND-OUTPUT}$ 2418VO substantially equal to 7/4×V$_{BAT}$.

In the OFF Mode of operation of the µC charge pump 2410, the controller 50 configures the first output 2416 to float and the second output 2418 to float.

TABLE 2B-1A and TABLE 2B-1B, entitled "SWITCH OPERATION TABLES FOR BUCK/BOOST OPERATION OF A µC CHARGE PUMP," describe the switch state (open or closed) of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17) of the µC charge pump 2410 when the µC charge pump 2410 is configured to operate in the buck/boost modes of operation described in TABLE 2A-1. In addition, TABLE 2B-1A and TABLE 2B-1B also provide the corresponding operational ratio, (µBB$_{RATIO}$), used by the µC charge pump 2410 when operating in the buck/boost modes of operation described in TABLE 2A-1. TABLE 2B-1A and TABLE 2B-1B further describe the switch state of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17) relative to the particular phases of operation used by the µC charge pump 2410 when operating in the buck/boost modes of operation described in TABLE 2A-1.

TABLE 2B-2A and TABLE 2B-2B, also entitled "SWITCH OPERATION TABLES FOR BUCK/BOOST OPERATION OF A µC CHARGE PUMP," describe the switch state (open or closed) of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17) of the µC charge pump 2410 when the µC charge pump 2410 is configured to operate in the buck/boost modes of operation described in TABLE 2A-2.

In addition, TABLE 2B-2A and TABLE 2B-2B also provide the corresponding operational ratio, ($\mu BB_{RATIO}$), used by the $\mu C$ charge pump 2410 when operating in the buck/boost modes of operation described in TABLE 2A-2. TABLE 2B-2A and TABLE 2B-2B further describe the switch state of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17) relative to the particular phases of operation used by the $\mu C$ charge pump 2410 when operating in the buck/boost modes of operation described in TABLE 2A-2.

As used in TABLE 2B-1A, TABLE 2B-1B, TABLE 2B-2A, and TABLE 2B-2A, "PHASE 1" indicates that the $\mu C$ charge pump 2410 is configured to operate in a first phase of operation, where the $\mu C$ charge pump control circuit 2414A configures the switch state (open or closed) of the identified $\mu C$ charge pump switch to be closed during the time period of the first phase of operation. "PHASE 2" indicates that the $\mu C$ charge pump 2410 is configured to operate in a second phase of operation, where the $\mu C$ charge pump control circuit 2414A configures the switch state (open or closed) of the identified $\mu C$ charge pump switch to be closed during the time period of the second phase of operation. "PHASE 3" indicates that the $\mu C$ charge pump 2410 is configured to operate in a third phase of operation, where the $\mu C$ charge pump control circuit 2414A configures the switch state (open or closed) of the identified $\mu C$ charge pump switch to be closed during the time period of the third phase of operation. "PHASE 4" indicates that the $\mu C$ charge pump 2410 is configured to operate in a fourth phase of operation, where the $\mu C$ charge pump control circuit 2414A configures the switch state (open or closed) of the identified $\mu C$ charge pump switch to be closed during the time period of the fourth phase of operation. "OPEN" indicates that the $\mu C$ charge pump control circuit 2414A configures the switch state (open or closed) of the identified switch to be closed during all the phases of operation of the $\mu C$ charge pump 2410.

TABLE 2A-1

MODES OF OPERATION TABLE FOR BUCK/BOOST OPERATION OF A DUAL OUTPUT $\mu C$ CHARGE PUMP CIRCUIT

| MODES OF OPERATION | OPERATIONAL RATIOS, ($\mu BB_{RATIO}$) | $V_{FIRST\text{-}OUTPUT}=$ ($\mu BB_{RATIO}$) × $V_{BAT}$ | $V_{SECOND\text{-}OUTPUT}=$ (1 + $\mu BB_{RATIO}$) × $V_{BAT}$ |
|---|---|---|---|
| First Buck/Boost Mode | 1/4 | 1/4 × $V_{BAT}$ | 5/4 × $V_{BAT}$ |
| Second Buck/Boost Mode | 1/3 | 1/3 × $V_{BAT}$ | 4/3 × $V_{BAT}$ |
| Third Buck/Boost Mode | 1/2 | 1/2 × $V_{BAT}$ | 3/2 × $V_{BAT}$ |
| Fourth Buck/Boost Mode | 2/3 | 2/3 × $V_{BAT}$ | 5/3 × $V_{BAT}$ |
| Fifth Buck/Boost Mode | 3/4 | 3/4 × $V_{BAT}$ | 7/4 × $V_{BAT}$ |
| OFF Mode | OFF | FLOATING | FLOATING |

TABLE 2A-2

MODES OF OPERATION TABLE FOR BUCK/BOOST OPERATION OF A DUAL OUTPUT $\mu C$ CHARGE PUMP CIRCUIT

| MODES OF OPERATION | OPERATIONAL RATIOS, ($\mu BB_{RATIO}$) | $V_{FIRST\text{-}OUTPUT}=$ (1 − $\mu BB_{RATIO}$) × $V_{BAT}$ | $V_{SECOND\text{-}OUTPUT}=$ (1 + $\mu BB_{RATIO}$) × $V_{BAT}$ |
|---|---|---|---|
| Sixth Buck/Boost Mode | 1/4 | 3/4 × $V_{BAT}$ | 5/4 × $V_{BAT}$ |
| Seventh Buck/Boost Mode | 1/3 | 2/3 × $V_{BAT}$ | 4/3 × $V_{BAT}$ |
| Eighth Buck/Boost Mode | 1/2 | 1/2 × $V_{BAT}$ | 3/2 × $V_{BAT}$ |
| Ninth Buck/Boost Mode | 2/3 | 1/3 × $V_{BAT}$ | 5/3 × $V_{BAT}$ |
| Tenth Buck/Boost Mode | 3/4 | 1/4 × $V_{BAT}$ | 7/4 × $V_{BAT}$ |
| OFF Mode | OFF | FLOATING | FLOATING |

TABLE 2B-1A

SWITCH OPERATION TABLE FOR BUCK/BOOST MODE OF OPERATION OF DUAL OUTPUT $\mu C$ CHARGE PUMP

MODES OF OPERATION FOR BUCK/BOOST OPERATION OF DUAL OUTPUT $\mu C$ CHARGE PUMP WITH CORRESPONDING OPERATIONAL RATIOS, ($\mu BB_{RATIO}$)

| | First Buck/Boost Mode, ($\mu BB_{RATIO}$ = 1/4), where Vfirst-output = 1/4 × $V_{BAT}$ and $V_{SECOND\text{-}OUTPUT}$ = 5/4 × $V_{BAT}$ | Second Buck/Boost Mode, ($\mu BB_{RATIO}$ = 1/3), where $V_{FIRST\text{-}OUTPUT}$ = 1/3 × $V_{BAT}$, and $V_{SECOND\text{-}OUTPUT}$ = 4/3 × $V_{BAT}$ | Third Buck/Boost Mode, ($\mu BB_{RATIO}$ = 1/2), where $V_{FIRST\text{-}OUTPUT}$ = 1/2 × $V_{BAT}$, and $V_{SECOND\text{-}OUTPUT}$ = 3/2 × $V_{BAT}$ |
|---|---|---|---|
| See, TABLE 2A-1 $\mu C$ CHARGE PUMP SWITCHES | | | |
| SW1 | Phase 1 | Phase 1 | Phase 1 |
| SW2 | OPEN | Phase 2 | Phase 2 |

TABLE 2B-1A-continued

SWITCH OPERATION TABLE FOR BUCK/BOOST MODE OF OPERATION OF DUAL OUTPUT μC CHARGE PUMP

MODES OF OPERATION FOR BUCK/BOOST OPERATION OF DUAL OUTPUT μC CHARGE PUMP WITH CORRESPONDING OPERATIONAL RATIOS, (μBB$_{RATIO}$)

| See, TABLE 2A-1 μC CHARGE PUMP SWITCHES | First Buck/Boost Mode, (μBB$_{RATIO}$ = 1/4), where V$_{first-output}$ = 1/4 × V$_{BAT}$ and V$_{SECOND-OUTPUT}$ = 5/4 × V$_{BAT}$ | Second Buck/Boost Mode, (μBB$_{RATIO}$ = 1/3), where V$_{FIRST-OUTPUT}$ = 1/3 × V$_{BAT}$, and V$_{SECOND-OUTPUT}$ = 4/3 × V$_{BAT}$ | Third Buck/Boost Mode, (μBB$_{RATIO}$ = 1/2), where V$_{FIRST-OUTPUT}$ = 1/2 × V$_{BAT}$, and V$_{SECOND-OUTPUT}$ = 3/2 × V$_{BAT}$ |
|---|---|---|---|
| SW3 | Phase 3 | Phase 2 | Phase 2 |
| SW4 | OPEN | OPEN | Phase 1 |
| SW5 | Phase 1 | Phase 1 | OPEN |
| SW6 | OPEN | OPEN | Phase 1 |
| SW7 | Phase 2 | Phase 2 | Phase 2 |
| SW8 | Phase 2 | Phase 2 | Phase 2 |
| SW9 | Phase 1 and Phase 3 | Phase 1 | Phase 1 |
| SW10 | Phase 3 and Phase 4 | Phase 3 | Phase 3 |
| SW11 | OPEN | Phase 3 | Phase 3 |
| SW12 | Phase 4 | OPEN | OPEN |
| SW13 | OPEN | Phase 3 | Phase 3 |
| SW14 | OPEN | OPEN | OPEN |
| SW15 | Phase 4 | Phase 3 | Phase 3 |
| SW16 | OPEN | OPEN | OPEN |
| SW17 | OPEN | OPEN | OPEN |

TABLE 2B-1B

SWITCH OPERATION TABLE FOR BUCK/BOOST MODE OF OPERATION OF DUAL OUTPUT μC CHARGE PUMP

MODES OF OPERATION FOR BUCK/BOOST OPERATION OF DUAL OUTPUT μC CHARGE PUMP WITH CORRESPONDING OPERATIONAL RATIOS, (μBB$_{RATIO}$)

| See, TABLE 2A-1 μC CHARGE PUMP SWITCHES | Fourth Buck/Boost Mode, (μBB$_{RATIO}$ = 2/3), where V$_{FIRST-OUTPUT}$ = 2/3 × V$_{BAT}$ and V$_{SECOND-OUTPUT}$ = 5/3 × V$_{BAT}$ | Fifth Buck/Boost Mode, (μBB$_{RATIO}$ = 3/4), where V$_{FIRST-OUTPUT}$ = 3/4 × V$_{BAT}$, and V$_{SECOND-OUTPUT}$ = 7/4 × V$_{BAT}$ | OFF Mode where V$_{FIRST-OUTPUT}$ = FLOAT V$_{SECOND-OUTPUT}$ = FLOAT |
|---|---|---|---|
| SW1 | Phase 1 | OPEN | OPEN |
| SW2 | Phase 2 | Phase 3 | OPEN |
| SW3 | OPEN | OPEN | OPEN |
| SW4 | Phase 1 | Phase 1 | OPEN |
| SW5 | Phase 2 and Phase 3 | Phase 3 and Phase 4 | OPEN |
| SW6 | Phase 1 | Phase 2 | OPEN |
| SW7 | OPEN | OPEN | OPEN |
| SW8 | Phase 2 | Phase 3 | OPEN |
| SW9 | Phase 1 | Phase 2 | OPEN |
| SW10 | Phase 3 | Phase 1 and Phase 4 | OPEN |
| SW11 | Phase 3 | Phase 1 and Phase 4 | OPEN |
| SW12 | OPEN | OPEN | OPEN |
| SW13 | Phase 3 | Phase 4 | OPEN |
| SW14 | OPEN | OPEN | OPEN |
| SW15 | OPEN | OPEN | OPEN |
| SW16 | OPEN | OPEN | OPEN |
| SW17 | OPEN | OPEN | OPEN |

TABLE 2B-2A

SWITCH OPERATION TABLE FOR BUCK/BOOST MODE OF OPERATION OF DUAL OUTPUT μC CHARGE PUMP

MODES OF OPERATION FOR BUCK/BOOST OPERATION OF DUAL OUTPUT μC CHARGE PUMP WITH CORRESPONDING OPERATIONAL RATIOS, (μBB$_{RATIO}$)

| See, TABLE 2A-2 μC CHARGE PUMP SWITCHES | Sixth Buck/Boost Mode, (μBB$_{RATIO}$ = 1/4), where V$_{FIRST-OUTPUT}$ = 3/4 × V$_{BAT}$ and V$_{SECOND-OUTPUT}$ = 5/4 × V$_{BAT}$ | Seventh Buck/Boost Mode, (μBB$_{RATIO}$ = 1/3), where V$_{FIRST-OUTPUT}$ = 2/3 × V$_{BAT}$, and V$_{SECOND-OUTPUT}$ = 4/3 × V$_{BAT}$ | Eighth Buck/Boost Mode, (μBB$_{RATIO}$ = 1/2), where V$_{FIRST-OUTPUT}$ = 1/2 × V$_{BAT}$, and V$_{SECOND-OUTPUT}$ = 3/2 × V$_{BAT}$ |
|---|---|---|---|
| SW1 | OPEN | Phase 1 | Phase 1 |
| SW2 | Phase 3 | Phase 2 | Phase 2 |

TABLE 2B-2A-continued

SWITCH OPERATION TABLE FOR BUCK/BOOST MODE OF OPERATION OF DUAL OUTPUT µC CHARGE PUMP

MODES OF OPERATION FOR BUCK/BOOST OPERATION OF DUAL OUTPUT µC CHARGE PUMP WITH CORRESPONDING OPERATIONAL RATIOS, (µBB$_{RATIO}$)

| See, TABLE 2A-2 µC CHARGE PUMP SWITCHES | Sixth Buck/Boost Mode, (µBB$_{RATIO}$ = 1/4), where V$_{FIRST-OUTPUT}$ = 3/4 × V$_{BAT}$ and V$_{SECOND-OUTPUT}$ = 5/4 × V$_{BAT}$ | Seventh Buck/Boost Mode, (µBB$_{RATIO}$ = 1/3), where V$_{FIRST-OUTPUT}$ = 2/3 × V$_{BAT}$, and V$_{SECOND-OUTPUT}$ = 4/3 × V$_{BAT}$ | Eighth Buck/Boost Mode, (µBB$_{RATIO}$ = 1/2), where V$_{FIRST-OUTPUT}$ = 1/2 × V$_{BAT}$, and V$_{SECOND-OUTPUT}$ = 3/2 × V$_{BAT}$ |
|---|---|---|---|
| SW3 | OPEN | OPEN | Phase 2 |
| SW4 | Phase 1 | Phase 1 | Phase 1 |
| SW5 | Phase 3 | Phase 2 | OPEN |
| SW6 | Phase 2 | Phase 1 | Phase 1 |
| SW7 | OPEN | OPEN | Phase 2 |
| SW8 | Phase 3 | Phase 2 | Phase 2 |
| SW9 | Phase 2 | Phase 1 | Phase 1 |
| SW10 | Phase 1 and Phase 4 | Phase 3 | Phase 3 |
| SW11 | Phase 1 | Phase 3 | Phase 3 |
| SW12 | Phase 4 | OPEN | OPEN |
| SW13 | OPEN | Phase 3 | Phase 3 |
| SW14 | OPEN | OPEN | OPEN |
| SW15 | Phase 4 | Phase 3 | Phase 3 |
| SW16 | OPEN | OPEN | OPEN |
| SW17 | OPEN | OPEN | OPEN |

TABLE 2B-2B

SWITCH OPERATION TABLE FOR BUCK/BOOST MODE OF OPERATION OF DUAL OUTPUT µC CHARGE PUMP

MODES OF OPERATION FOR BUCK/BOOST OPERATION OF DUAL OUTPUT µC CHARGE PUMP WITH CORRESPONDING OPERATIONAL RATIOS, (µBB$_{RATIO}$)

| See, TABLE 2A-2 µC CHARGE PUMP SWITCHES | Ninth Buck/Boost Mode, (µBB$_{RATIO}$ = 2/3), where V$_{FIRST-OUTPUT}$ = 1/3 × V$_{BAT}$ and V$_{SECOND-OUTPUT}$ = 5/3 × V$_{BAT}$ | Tenth Buck/Boost Mode, (µBB$_{RATIO}$ = 3/4), where V$_{FIRST-OUTPUT}$ = 1/4 × V$_{BAT}$, and V$_{SECOND-OUTPUT}$ = 7/4 × V$_{BAT}$ | OFF Mode where V$_{FIRST-OUTPUT}$ = FLOAT V$_{SECOND-OUTPUT}$ = FLOAT |
|---|---|---|---|
| SW1 | Phase 1 | Phase 1 | OPEN |
| SW2 | Phase 2 | OPEN | OPEN |
| SW3 | Phase 2 | Phase 3 | OPEN |
| SW4 | OPEN | OPEN | OPEN |
| SW5 | Phase 1 and Phase 3 | Phase 1 and Phase 4 | OPEN |
| SW6 | OPEN | OPEN | OPEN |
| SW7 | Phase 2 | Phase 2 | OPEN |
| SW8 | Phase 2 | Phase 2 | OPEN |
| SW9 | Phase 1 | Phase 1 and Phase 3 | OPEN |
| SW10 | Phase 3 | Phase 3 and Phase 4 | OPEN |
| SW11 | Phase 3 | Phase 4 | OPEN |
| SW12 | OPEN | OPEN | OPEN |
| SW13 | Phase 3 | Phase 4 | OPEN |
| SW14 | OPEN | OPEN | OPEN |
| SW15 | OPEN | OPEN | OPEN |
| SW16 | OPEN | OPEN | OPEN |
| SW17 | OPEN | OPEN | OPEN |

The configurations and operations of the µC charge pump 2410 when the µC charge pump 2410 operates in the various buck/boost modes, described in the TABLE 2A-1 and the TABLE 2A-2, will now be discussed with reference to the TABLE 2B-1A, the TABLE 2B-1B, the TABLE 2B-2A, and the TABLE 2B-2B.

TABLE 2B-1A describes, and FIGS. 8A-B depicts, the operation of the µC charge pump 2410 when the controller 50 configures the µC charge pump 2410 to operate in the First Buck/Boost Mode. The controller 50 configures the µC charge pump control circuit 2414A to use an operational ratio, (µBB$_{RATIO}$), set to ¼. The µC charge pump control circuit 2414A operably divides the operation of the µC charge pump 2410 into four phases of operation. The µC charge pump control circuit 2414A operably configures the switching network 2412 such that first output 2416 generates a first output voltage V$_{FIRST-OUTPUT}$ 2416VO substantially equal to ¼×V$_{BAT}$, and the second output 2418 generates a second output voltage V$_{SECOND-OUTPUT}$ 2418VO substantially equal to 5/4×V$_{BAT}$.

As described in TABLE 2B-1A, in the first phase of operation, (Phase 1), the µC charge pump control circuit 2414A operably closes the first switch 2432, (SW1), the fifth switch 2448, (SW5), and the ninth switch 2464, (SW9). In the second phase of operation, (Phase 2), the µC charge pump control circuit 2414A operably closes the seventh switch 2456, (SW7), and the eighth switch 2460, (SW8). In the third phase of operation, (Phase 3), the µC charge pump control circuit 2414A operably closes the third switch 2440, (SW3), the ninth switch 2464, (SW9), and the tenth switch 2468, (SW10). In the fourth phase of operation, (Phase 4), the µC charge pump control circuit 2414A operably closes the tenth switch 2468, (SW10), the twelfth switch 2476, (SW12), and the fifteenth switch 2488, (SW15).

As a result, the first flying capacitor 2424 develops a first flying capacitor voltage $V_{FIRST-FLYCAP}$ 2424FC substantially equal to $\frac{1}{2} \times V_{BAT}$, and the second flying capacitor 2426 develops a second flying capacitor voltage $V_{SECOND-FLYCAP}$ 2426FC substantially equal to $\frac{1}{4} \times V_{BAT}$. Accordingly, first output 2416 generates a first output voltage $V_{FIRST-OUTPUT}$ 2416VO substantially equal to $\frac{1}{4} \times V_{BAT}$, on the first output capacitor 2420 and the second output 2418 generates a second output voltage $V_{SECOND-OUTPUT}$ 2418VO substantially equal to $5/4 \times V_{BAT}$ on the second output capacitor 2422.

TABLE 2B-1A describes the operation of the µC charge pump 2410 when the controller 50 configures the µC charge pump 2410 to operate in the Second Buck/Boost Mode. The controller 50 configures the µC charge pump control circuit 2414A to use an operational ratio, ($\mu BB_{RATIO}$), set to $\frac{1}{3}$. The µC charge pump control circuit 2414A operably divides the operation of the µC charge pump 2410 into three phases of operation. The µC charge pump control circuit 2414A operably configures the switching network 2412 such that first output 2416 generates a first output voltage $V_{FIRST-OUTPUT}$ 2416VO substantially equal to $\frac{1}{3} \times V_{BAT}$, and the second output 2418 generates a second output voltage $V_{SECOND-OUTPUT}$ 2418VO substantially equal to $4/3 \times V_{BAT}$.

As described in TABLE 2B-1A, in the first phase of operation, (Phase 1), the µC charge pump control circuit 2414A operably closes the first switch 2432, (SW1), the fifth switch 2448, (SW5), and the ninth switch 2464, (SW9). In the second phase of operation, (Phase 2), the µC charge pump control circuit 2414A operably closes the second switch 2436, (SW2), the third switch 2440, (SW3), the seventh switch 2456, (SW7), and the eighth switch 2460, (SW8). In the third phase of operation, (Phase 3), the µC charge pump control circuit 2414A operably closes the tenth switch 2468, (SW10), the eleventh switch 2472, (SW11), the thirteenth switch 2480, (SW13), and the fifteenth switch 2488, (SW15).

As a result, the first flying capacitor 2424 develops a first flying capacitor voltage $V_{FIRST-FLYCAP}$ 2424FC substantially equal to $\frac{1}{3} \times V_{BAT}$, and the second flying capacitor 2426 develops a second flying capacitor voltage $V_{SECOND-FLYCAP}$ 2426FC substantially equal to $\frac{1}{3} \times V_{BAT}$. Accordingly, first output 2416 generates a first output voltage $V_{FIRST-OUTPUT}$ 2416VO substantially equal to $\frac{1}{3} \times V_{BAT}$, on the first output capacitor 2420 and the second output 2418 generates a second output voltage $V_{SECOND-OUTPUT}$ 2418VO substantially equal to $4/3 \times V_{BAT}$ on the second output capacitor 2422.

TABLE 2B-1A describes the operation of the µC charge pump 2410 when the controller 50 configures the µC charge pump 2410 to operate in the Third Buck/Boost Mode. The controller 50 configures the µC charge pump control circuit 2414A to use an operational ratio, ($\mu BB_{RATIO}$), set to $\frac{1}{2}$. The µC charge pump control circuit 2414A operably divides the operation of the µC charge pump 2410 into three phases of operation. The µC charge pump control circuit 2414A operably configures the switching network 2412 such that first output 2416 generates a first output voltage $V_{FIRST-OUTPUT}$ 2416VO substantially equal to $\frac{1}{2} \times V_{BAT}$, and the second output 2418 generates a second output voltage $V_{SECOND-OUTPUT}$ 2418VO substantially equal to $3/2 \times V_{BAT}$.

As further described in TABLE 2B-1A, in the first phase of operation, (Phase 1), the µC charge pump control circuit 2414A operably closes the first switch 2432, (SW1), the fourth switch 2444, (SW4), the fifth switch 2448, (SW5), the sixth switch 2452, (SW6), and the ninth switch 2464, (SW9). In the second phase of operation, (Phase 2), the µC charge pump control circuit 2414A operably closes the second switch 2436, (SW2), the third switch 2440, (SW3), the seventh switch 2456, (SW7), and the eighth switch 2460, (SW8). In the third phase of operation, (Phase 3), the µC charge pump control circuit 2414A operably closes the tenth switch 2468, (SW10), the eleventh switch 2472, (SW11), the thirteenth switch 2480, (SW13), and the fifteenth switch 2488, (SW15).

As a result, the first flying capacitor 2424 develops a first flying capacitor voltage $V_{FIRST-FLYCAP}$ 2424FC substantially equal to $\frac{1}{2} \times V_{BAT}$, and the second flying capacitor 2426 develops a second flying capacitor voltage $V_{SECOND-FLYCAP}$ 2426FC substantially equal to $\frac{1}{2} \times V_{BAT}$. Accordingly, first output 2416 generates a first output voltage $V_{FIRST-OUTPUT}$ 2416VO substantially equal to $\frac{1}{2} \times V_{BAT}$, on the first output capacitor 2420 and the second output 2418 generates a second output voltage $V_{SECOND-OUTPUT}$ 2418VO substantially equal to $3/2 \times V_{BAT}$ on the second output capacitor 2422.

TABLE 2B-1B describes the operation of the µC charge pump 2410 when the controller 50 configures the µC charge pump 2410 to operate in the Fourth Buck/Boost Mode. The controller 50 configures the µC charge pump control circuit 2414A to use an operational ratio, ($\mu BB_{RATIO}$), set to $\frac{2}{3}$. The µC charge pump control circuit 2414A operably divides the operation of the µC charge pump 2410 into three phases of operation. The µC charge pump control circuit 2414A operably configures the switching network 2412 such that first output 2416 generates a first output voltage $V_{FIRST-OUTPUT}$ 2416VO substantially equal to $\frac{2}{3} \times V_{BAT}$, and the second output 2418 generates a second output voltage $V_{SECOND-OUTPUT}$ 2418VO substantially equal to $5/3 \times V_{BAT}$.

As further described in TABLE 2B-1B, in the first phase of operation, (Phase 1), the µC charge pump control circuit 2414A operably closes the first switch 2432, (SW1), the fourth switch 2444, (SW4), the sixth switch 2452, (SW6), and the ninth switch 2464, (SW9). In the second phase of operation, (Phase 2), the µC charge pump control circuit 2414A operably closes the second switch 2436, (SW2), the fifth switch 2448, (SW5), and the eighth switch 2460, (SW8). In the third phase of operation, (Phase 3), the µC charge pump control circuit 2414A operably closes the fifth switch 2448, (SW5), the tenth switch 2468, (SW10), the eleventh switch 2472, (SW11), and the thirteenth switch 2480, (SW13).

As a result, the first flying capacitor 2424 develops a first flying capacitor voltage $V_{FIRST-FLYCAP}$ 2424FC substantially equal to $\frac{1}{3} \times V_{BAT}$, and the second flying capacitor 2426 develops a second flying capacitor voltage $V_{SECOND-FLYCAP}$ 2426FC substantially equal to $\frac{1}{3} \times V_{BAT}$. Accordingly, first output 2416 generates a first output voltage $V_{FIRST-OUTPUT}$ 2416VO substantially equal to $\frac{2}{3} \times V_{BAT}$, on the first output capacitor 2420 and the second output 2418 generates a second output voltage $V_{SECOND-OUTPUT}$ 2418VO substantially equal to $5/3 \times V_{BAT}$ on the second output capacitor 2422.

TABLE 2B-1B describes the operation of the µC charge pump 2410 when the controller 50 configures the µC charge pump 2410 to operate in the Fifth Buck/Boost Mode. The controller 50 configures the µC charge pump control circuit 2414A to use an operational ratio, ($\mu BB_{RATIO}$), set to $\frac{3}{4}$. The µC charge pump control circuit 2414A operably divides the operation of the µC charge pump 2410 into four phases of operation. The µC charge pump control circuit 2414A operably configures the switching network 2412 such that first output 2416 generates a first output voltage $V_{FIRST-OUTPUT}$ 2416VO substantially equal to $\frac{3}{4} \times V_{BAT}$, and the second output 2418 generates a second output voltage $V_{SECOND-OUTPUT}$ 2418VO substantially equal to $7/4 \times V_{BAT}$.

As further described in TABLE 2B-1B, in the first phase of operation, (Phase 1), the µC charge pump control circuit 2414A operably closes the fourth switch 2444, (SW4), the tenth switch 2468, (SW10), and the eleventh switch 2472, (SW11). In the second phase of operation, (Phase 2), the µC charge pump control circuit 2414A operably closes the sixth switch 2452, (SW6), and the ninth switch 2464, (SW9). As further depicted, in the third phase of operation, (Phase 3), the µC charge pump control circuit 2414A operably closes the second switch 2436, (SW2), the fifth switch 2448, (SW5), and the eighth switch 2460, (SW8). In the fourth phase of operation, (Phase 4), the µC charge pump control circuit 2414A operably closes the fifth switch 2448, (SW5), the tenth switch 2468, (SW10), the eleventh switch 2472, (SW11), and the thirteenth switch 2480, (SW13).

As a result, the first flying capacitor 2424 develops a first flying capacitor voltage $V_{FIRST-FLYCAP}$ 2424FC substantially equal to $1/2 \times V_{BAT}$, and the second flying capacitor 2426 develops a second flying capacitor voltage $V_{SECOND-FLYCAP}$ 2426FC substantially equal to $1/4 \times V_{BAT}$. Accordingly, first output 2416 generates a first output voltage $V_{FIRST-OUTPUT}$ 2416VO substantially equal to $3/4 \times V_{BAT}$, on the first output capacitor 2420 and the second output 2418 generates a second output voltage $V_{SECOND-OUTPUT}$ 2418VO substantially equal to $7/4 \times V_{BAT}$ on the second output capacitor 2422.

TABLE 2B-2A describes the operation of the µC charge pump 2410 when the controller 50 configures the µC charge pump 2410 to operate in the Sixth Buck/Boost Mode. The controller 50 configures the µC charge pump control circuit 2414A to use an operational ratio, ($\mu BB_{RATIO}$), set to $1/4$. The µC charge pump control circuit 2414A operably divides the operation of the µC charge pump 2410 into four phases of operation. The µC charge pump control circuit 2414A operably configures the switching network 2412 such that first output 2416 generates a first output voltage $V_{FIRST-OUTPUT}$ 2416VO substantially equal to $3/4 \times V_{BAT}$, and the second output 2418 generates a second output voltage $V_{SECOND-OUTPUT}$ 2418VO substantially equal to $5/4 \times V_{BAT}$.

As described in TABLE 2B-2A, in the first phase of operation, (Phase 1), the µC charge pump control circuit 2414A operably closes the fourth switch 2444, (SW4), the tenth switch 2468, (SW10), and the eleventh switch 2472, (SW11). In the second phase of operation, (Phase 2), the µC charge pump control circuit 2414A operably closes the sixth switch 2452, (SW6), and the ninth switch 2464, (SW9). As further depicted, in the third phase of operation, (Phase 3), the µC charge pump control circuit 2414A operably closes the second switch 2436, (SW2), the fifth switch 2448, (SW5), and the eighth switch 2460, (SW8). In the fourth phase of operation, (Phase 4), the µC charge pump control circuit 2414A operably closes the tenth switch 2468, (SW10), the twelfth switch 2476, (SW12), and the fifteenth switch 2488, (SW15).

As a result, the first flying capacitor 2424 develops a first flying capacitor voltage $V_{FIRST-FLYCAP}$ 2424FC substantially equal to $1/2 \times V_{BAT}$, and the second flying capacitor 2426 develops a second flying capacitor voltage $V_{SECOND-FLYCAP}$ 2426FC substantially equal to $1/4 \times V_{BAT}$. Accordingly, first output 2416 generates a first output voltage $V_{FIRST-OUTPUT}$ 2416VO substantially equal to $3/4 \times V_{BAT}$, on the first output capacitor 2420 and the second output 2418 generates a second output voltage $V_{SECOND-OUTPUT}$ 2418VO substantially equal to $5/4 \times V_{BAT}$ on the second output capacitor 2422.

TABLE 2B-2A describes the operation of the µC charge pump 2410 when the controller 50 configures the µC charge pump 2410 to operate in the Seventh Buck/Boost Mode. The controller 50 configures the µC charge pump control circuit 2414A to use an operational ratio, ($\mu BB_{RATIO}$), set to $1/3$. The µC charge pump control circuit 2414A operably divides the operation of the µC charge pump 2410 into three phases of operation. The µC charge pump control circuit 2414A operably configures the switching network 2412 such that first output 2416 generates a first output voltage $V_{FIRST-OUTPUT}$ 2416VO substantially equal to $2/3 \times V_{BAT}$, and the second output 2418 generates a second output voltage $V_{SECOND-OUTPUT}$ 2418VO substantially equal to $4/3 \times V_{BAT}$.

As described in TABLE 2B-2A, in the first phase of operation, (Phase 1), the µC charge pump control circuit 2414A operably closes the first switch 2432, (SW1), the fourth switch 2444, (SW4), the sixth switch 2452, (SW6), and the ninth switch 2464, (SW9). In the second phase of operation, (Phase 2), the µC charge pump control circuit 2414A operably closes the second switch 2436, (SW2), the fifth switch 2448, (SW5), and the eighth switch 2460, (SW8). In the third phase of operation, (Phase 3), the µC charge pump control circuit 2414A operably closes the tenth switch 2468, (SW10), the eleventh switch 2472, (SW11), the thirteenth switch 2480, (SW13), and the fifteenth switch 2488, (SW15).

As a result, the first flying capacitor 2424 develops a first flying capacitor voltage $V_{FIRST-FLYCAP}$ 2424FC substantially equal to $1/3 \times V_{BAT}$, and the second flying capacitor 2426 develops a second flying capacitor voltage $V_{SECOND-FLYCAP}$ 2426FC substantially equal to $1/3 \times V_{BAT}$. Accordingly, first output 2416 generates a first output voltage $V_{FIRST-OUTPUT}$ 2416VO substantially equal to $2/3 \times V_{BAT}$, on the first output capacitor 2420 and the second output 2418 generates a second output voltage $V_{SECOND-OUTPUT}$ 2418VO substantially equal to $4/3 \times V_{BAT}$ on the second output capacitor 2422.

TABLE 2B-2A describes the operation of the µC charge pump 2410 when the controller 50 configures the µC charge pump 2410 to operate in the Eighth Buck/Boost Mode. The controller 50 configures the µC charge pump control circuit 2414A to use an operational ratio, ($\mu BB_{RATIO}$), set to $1/2$. The µC charge pump control circuit 2414A operably divides the operation of the µC charge pump 2410 into three phases of operation. The µC charge pump control circuit 2414A operably configures the switching network 2412 such that first output 2416 generates a first output voltage $V_{FIRST-OUTPUT}$ 2416VO substantially equal to $1/2 \times V_{BAT}$, and the second output 2418 generates a second output voltage $V_{SECOND-OUTPUT}$ 2418VO substantially equal to $3/2 \times V_{BAT}$.

As further described in TABLE 2B-2A, in the first phase of operation, (Phase 1), the µC charge pump control circuit 2414A operably closes the first switch 2432, (SW1), the fourth switch 2444, (SW4), the fifth switch 2448, (SW5), the sixth switch 2452, (SW6), and the ninth switch 2464, (SW9). In the second phase of operation, (Phase 2), the µC charge pump control circuit 2414A operably closes the second switch 2436, (SW2), the third switch 2440, (SW3), the seventh switch 2456, (SW7), and the eighth switch 2460, (SW8). In the third phase of operation, (Phase 3), the µC charge pump control circuit 2414A operably closes the tenth switch 2468, (SW10), the eleventh switch 2472, (SW11), the thirteenth switch 2480, (SW13), and the fifteenth switch 2488, (SW15).

As a result, the first flying capacitor 2424 develops a first flying capacitor voltage $V_{FIRST-FLYCAP}$ 2424FC substantially equal to $1/2 \times V_{BAT}$, and the second flying capacitor 2426 develops a second flying capacitor voltage $V_{SECOND-FLYCAP}$ 2426FC substantially equal to $1/2 \times V_{BAT}$. Accordingly, first output 2416 generates a first output voltage $V_{FIRST-OUTPUT}$ 2416VO substantially equal to $1/2 \times V_{BAT}$, on the first output capacitor 2420 and the second output 2418 generates a second output voltage $V_{SECOND-OUTPUT}$ 2418VO substantially equal to $3/2 \times V_{BAT}$ on the second output capacitor 2422.

TABLE 2B-2B describes the operation of the μC charge pump 2410 when the controller 50 configures the μC charge pump 2410 to operate in the Ninth Buck/Boost Mode. The controller 50 configures the μC charge pump control circuit 2414A to use an operational ratio, (μBB$_{RATIO}$), set to ⅔. The μC charge pump control circuit 2414A operably divides the operation of the μC charge pump 2410 into three phases of operation. The μC charge pump control circuit 2414A operably configures the switching network 2412 such that first output 2416 generates a first output voltage V$_{FIRST-OUTPUT}$ 2416VO substantially equal to ⅓×V$_{BAT}$, and the second output 2418 generates a second output voltage V$_{SECOND-OUTPUT}$ 2418VO substantially equal to 5/3×V$_{BAT}$.

As further described in TABLE 2B-2B, in the first phase of operation, (Phase 1), the μC charge pump control circuit 2414A operably closes the first switch 2432, (SW1), the fifth switch 2448, (SW5), and the ninth switch 2464, (SW9). In the second phase of operation, (Phase 2), the μC charge pump control circuit 2414A operably closes the second switch 2436, (SW2), the third switch 2440, (SW3), the seventh switch 2456, (SW7), and the eighth switch 2460, (SW8). In the third phase of operation, (Phase 3), the μC charge pump control circuit 2414A operably closes the fifth switch 2448, (SW5), the tenth switch 2468, (SW10), the eleventh switch 2472, (SW11), and the thirteenth switch 2480, (SW13).

As a result, the first flying capacitor 2424 develops a first flying capacitor voltage V$_{FIRST-FLYCAP}$ 2424FC substantially equal to ⅓×V$_{BAT}$, and the second flying capacitor 2426 develops a second flying capacitor voltage V$_{SECOND-FLYCAP}$ 2426FC substantially equal to ⅓×V$_{BAT}$. Accordingly, first output 2416 generates a first output voltage V$_{FIRST-OUTPUT}$ 2416VO substantially equal to ⅓×V$_{BAT}$, on the first output capacitor 2420 and the second output 2418 generates a second output voltage V$_{SECOND-OUTPUT}$ 2418VO substantially equal to 5/3×V$_{BAT}$ on the second output capacitor 2422.

TABLE 2B-2B describes the operation of the μC charge pump 2410 when the controller 50 configures the μC charge pump 2410 to operate in the Tenth Buck/Boost Mode. The controller 50 configures the μC charge pump control circuit 2414A to use an operational ratio, (μBB$_{RATIO}$), set to ¾. The μC charge pump control circuit 2414A operably divides the operation of the μC charge pump 2410 into four phases of operation. The μC charge pump control circuit 2414A operably configures the switching network 2412 such that first output 2416 generates a first output voltage V$_{FIRST-OUTPUT}$ 2416VO substantially equal to ¼×V$_{BAT}$, and the second output 2418 generates a second output voltage V$_{SECOND-OUTPUT}$ 2418VO substantially equal to 7/4×V$_{BAT}$.

As further described in TABLE 2B-2B, in the first phase of operation, (Phase 1), the μC charge pump control circuit 2414A operably closes the first switch 2432, (SW1), the fifth switch 2448, (SW5), and the ninth switch 2464, (SW9). In the second phase of operation, (Phase 2), the μC charge pump control circuit 2414A operably closes the seventh switch 2456, (SW7), and the eighth switch 2460, (SW8). As further depicted, in the third phase of operation, (Phase 3), the μC charge pump control circuit 2414A operably closes the third switch 2440, (SW3), the ninth switch 2464, (SW9), and the tenth switch 2468, (SW10). In the fourth phase of operation, (Phase 4), the μC charge pump control circuit 2414A operably closes the fifth switch 2448, (SW5), the tenth switch 2468, (SW10), the eleventh switch 2472, (SW11), and the thirteenth switch 2480, (SW13).

As a result, the first flying capacitor 2424 develops a first flying capacitor voltage V$_{FIRST-FLYCAP}$ 2424FC substantially equal to ½×V$_{BAT}$, and the second flying capacitor 2426 develops a second flying capacitor voltage V$_{SECOND-FLYCAP}$ 2426FC substantially equal to ¼×V$_{BAT}$. Accordingly, first output 2416 generates a first output voltage V$_{FIRST-OUTPUT}$ 2416VO substantially equal to ¼×V$_{BAT}$, on the first output capacitor 2420 and the second output 2418 generates a second output voltage V$_{SECOND-OUTPUT}$ 2418VO substantially equal to 7/4×V$_{BAT}$ on the second output capacitor 2422.

Both the TABLE 2B-1B and the TABLE 2B-2B describe the operation of the μC charge pump 2410 when the controller 50 configures the μC charge pump 2410 to operate in the OFF Mode. As described in both the TABLE 2B-1B and the TABLE 2B-2B, when the controller 50 configures the μC charge pump 2410 to be in the OFF Mode of operation, the μC charge pump control circuit 2414A may operablely open the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), and the fifteenth switch 2488, (SW15). As a result, the first output voltage V$_{FIRST-OUTPUT}$ 2416VO on the first output 2416 floats relative to ground. Likewise, the second output voltage V$_{SECOND-OUTPUT}$ 2418VO on the second output 2418 floats relative to ground.

A non-limiting set of example operational modes of the μC charge pump 2410 configured to operate in a boost/buck mode of operation will now be discussed. As an example, TABLE 3A-1 and TABLE 3A-2, entitled "MODES OF OPERATION TABLE FOR BOOST/BUCK OPERATION OF A DUAL OUTPUT μC CHARGE PUMP CIRCUIT," describe, in tabulated form, several, non-limiting, example modes of operation of the μC charge pump 2410 configured to operate in a boost/buck mode of operation. As an example, the non-limiting example modes of boost/buck modes of operation described in TABLE 3A-1 include: a First (1$^{st}$) Boost/Buck Mode, a Second (2$^{nd}$) Boost/Buck Mode, a Third (3$^{rd}$) Boost/Buck Mode, a Fourth (4$^{th}$) Boost/Buck Mode, a Fifth (5$^{th}$) Boost/Buck Mode, and an OFF Mode. As another example, the non-limiting example modes of boost/buck modes of operation described in TABLE 3A-2 include: a Sixth (6$^{th}$) Boost/Buck Mode, a Seventh (7$^{th}$) Boost/Buck Mode, an Eighth (8$^{th}$) Boost/Buck Mode, a Ninth (9$^{th}$) Boost/Buck Mode, a Tenth (10$^{th}$) Boost/Buck Mode, and an OFF Mode.

As depicted in TABLE 3A-1 and TABLE 3A-2, each example boost/buck mode of operation of the μC charge pump 2410 corresponds to an operational ratio, (μBB$_{RATIO}$), where the operational ratio, (μBB$_{RATIO}$), may provide a relationship between the first output voltage V$_{FIRST-OUTPUT}$ 2416VO generated by the first output 2416 and the second output voltage V$_{SECOND-OUTPUT}$ 2418VO generated by the second output 2418. The operational ratio, (μBB$_{RATIO}$), may be an operational ratio parameter that is configured by the controller 50 and stored locally in the μC charge pump control circuit 2414A.

For example, TABLE 3A-1 describes example boost/buck modes of operation of the μC charge pump 2410 where the first output 2416 is configured to generate a first output voltage V$_{FIRST-OUTPUT}$ 2416VO such that V$_{FIRST-OUTPUT}$=(1+μBB$_{RATIO}$)×V$_{BAT}$. The second output 2418 is configured to generate a second output voltage V$_{SECOND-OUTPUT}$ 2418VO such that V$_{SECOND-OUTPUT}$=(μBB$_{RATIO}$)×V$_{BAT}$.

Accordingly, as described in TABLE 3A-1, in the First Boost/Buck Mode of operation of the μC charge pump 2410, the controller 50 configures the μC charge pump control circuit 2414A to use an operational ratio, (μBB$_{RATIO}$), set to ¼. As a result, the first output 2416 generates a first output voltage V$_{FIRST-OUTPUT}$ 2416VO substantially equal to 5/4×V$_{BAT}$, and the second output 2418 generates a second output voltage V$_{SECOND-OUTPUT}$ 2418VO substantially equal to ¼×V$_{BAT}$.

In the Second Boost/Buck Mode of operation of the µC charge pump 2410, the controller 50 configures the µC charge pump control circuit 2414A to use an operational ratio, (µBB$_{RATIO}$), set to ⅓. As a result, the first output 2416 generates a first output voltage V$_{FIRST-OUTPUT}$ 2416VO substantially equal to 4/3×V$_{BAT}$, and the second output 2418 generates a second output voltage V$_{SECOND-OUTPUT}$ 2418VO substantially equal to ⅓×V$_{BAT}$.

In the Third Boost/Buck Mode of operation of the µC charge pump 2410, the controller 50 configures the µC charge pump control circuit 2414A to use an operational ratio, (µBB$_{RATIO}$), set to ½. As a result, the first output 2416 generates a first output voltage V$_{FIRST-OUTPUT}$ 2416VO substantially equal to 3/2×V$_{BAT}$, and the second output 2418 generates a second output voltage V$_{SECOND-OUTPUT}$ 2418VO substantially equal to ½×V$_{BAT}$.

In the Fourth Boost/Buck Mode of operation of the µC charge pump 2410, the controller 50 configures the µC charge pump control circuit 2414A to use an operational ratio, (µBB$_{RATIO}$), set to ⅔. As a result, the first output 2416 generates a first output voltage V$_{FIRST-OUTPUT}$ 2416VO substantially equal to 5/3×V$_{BAT}$, and the second output 2418 generates a second output voltage V$_{SECOND-OUTPUT}$ 2418VO substantially equal to ⅔×V$_{BAT}$.

In the Fifth Boost/Buck Mode of operation of the µC charge pump 2410, the controller 50 configures the µC charge pump control circuit 2414A to use an operational ratio, (µBB$_{RATIO}$), set to ¾. As a result, the first output 2416 generates a first output voltage V$_{FIRST-OUTPUT}$ 2416VO substantially equal to 7/4×V$_{BAT}$, and the second output 2418 generates a second output voltage V$_{SECOND-OUTPUT}$ 2418VO substantially equal to ¾×V$_{BAT}$.

In the OFF Mode of operation of the µC charge pump 2410, the controller 50 configures the first output 2416 to float and the second output 2418 to float.

In contrast, TABLE 3A-2 describes other example boost/buck modes of operation of the µC charge pump 2410 where the first output 2416 is configured to generate a first output voltage V$_{FIRST-OUTPUT}$ 2416VO such that V$_{FIRST-OUTPUT}$=(1+µBB$_{RATIO}$)×V$_{BAT}$. The second output 2418 is configured to generate a second output voltage V$_{SECOND-OUTPUT}$ 2418VO such that V$_{SECOND-OUTPUT}$=(1−µBB$_{RATIO}$)×V$_{BAT}$.

Accordingly, as described in TABLE 3A-2, in the Sixth Boost/Buck Mode of operation of the µC charge pump 2410, the controller 50 configures the µC charge pump control circuit 2414A to use an operational ratio, (µBB$_{RATIO}$), set to ¼. As a result, the first output 2416 generates a first output voltage V$_{FIRST-OUTPUT}$ 2416VO substantially equal to 5/4×V$_{BAT}$, and the second output 2418 generates a second output voltage V$_{SECOND-OUTPUT}$ 2418VO substantially equal to ¾×V$_{BAT}$. In the Seventh Boost/Buck Mode of operation of the µC charge pump 2410, the controller 50 configures the µC charge pump control circuit 2414A to use an operational ratio, (µBB$_{RATIO}$), set to ⅓. As a result, the first output 2416 generates a first output voltage V$_{FIRST-OUTPUT}$ 2416VO substantially equal to 4/3×V$_{BAT}$, and the second output 2418 generates a second output voltage V$_{SECOND-OUTPUT}$ 2418VO substantially equal to ⅔×V$_{BAT}$. In the Eighth Boost/Buck Mode of operation of the µC charge pump 2410, the controller 50 configures the µC charge pump control circuit 2414A to use an operational ratio, (µBB$_{RATIO}$), set to ½. As a result, the first output 2416 generates a first output voltage V$_{FIRST-OUTPUT}$ 2416VO substantially equal to 3/2×V$_{BAT}$, and the second output 2418 generates a second output voltage V$_{SECOND-OUTPUT}$ 2418VO substantially equal to ½×V$_{BAT}$. In the Ninth Boost/Buck Mode of operation of the µC charge pump 2410, the controller 50 configures the µC charge pump control circuit 2414A to use an operational ratio, (µBB$_{RATIO}$), set to ⅔. As a result, the first output 2416 generates a first output voltage V$_{FIRST-OUTPUT}$ 2416VO substantially equal to 5/3×V$_{BAT}$, and the second output 2418 generates a second output voltage V$_{SECOND-OUTPUT}$ 2418VO substantially equal to ⅓×V$_{BAT}$. In the Tenth Boost/Buck Mode of operation of the µC charge pump 2410, the controller 50 configures the µC charge pump control circuit 2414A to use an operational ratio, (µBB$_{RATIO}$), set to ¾. As a result, the first output 2416 generates a first output voltage V$_{FIRST-OUTPUT}$ 2416VO substantially equal to 7/4×V$_{BAT}$, and the second output 2418 generates a second output voltage V$_{SECOND-OUTPUT}$ 2418VO substantially equal to ¼×V$_{BAT}$. In the OFF Mode of operation of the µC charge pump 2410, the controller 50 configures the first output 2416 to float and the second output 2418 to float.

TABLE 3B-1A and TABLE 3B-1B, entitled "SWITCH OPERATION TABLE FOR BUCK/BOOST OPERATION OF DUAL OUTPUT µC CHARGE PUMP," describe, in tabular form, the switch state (open or closed) of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), and the fifteenth switch 2488, (SW15), of the µC charge pump 2410 when the µC charge pump 2410 is configured to operate in the boost/buck modes of operation described in TABLE 3A-1. In addition, TABLE 3B-1A and TABLE 3B-1B also provide the corresponding operational ratio, (µBB$_{RATIO}$), used by the µC charge pump 2410 when operating in the boost/buck modes of operation described in TABLE 3A-1. TABLE 3B-1A and TABLE 3B-1B further describe the switch state of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), and the fifteenth switch 2488, (SW15), relative to the particular phases of operation used by the µC charge pump 2410 when operating in the boost/buck modes of operation described in TABLE 3A-1.

TABLE 3B-2A and TABLE 3B-2B, also entitled "SWITCH OPERATION TABLE FOR BUCK/BOOST OPERATION OF A µC CHARGE PUMP," describe the switch state (open or closed) of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17) of the µC charge pump 2410 when the µC charge pump 2410 is configured to operate in the boost/buck modes of operation described in TABLE 3A-2. In addition, TABLE 3B-2A and TABLE 3B-2B also provide the corresponding operational ratio, ($\mu BB_{RATIO}$), used by the $\mu C$ charge pump 2410 when operating in the boost/buck modes of operation described in TABLE 3A-2. TABLE 3B-2A and TABLE 3B-2B further describe the switch state of each of the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15), the sixteenth switch 2492, (SW16), and the seventeenth switch 2496, (SW17) relative to the particular phases of operation used by the $\mu C$ charge pump 2410 when operating in the boost/buck modes of operation described in TABLE 3A-2.

As used in TABLE 3B-1A, TABLE 3B-1B, TABLE 3B-2A, and TABLE 3B-2A, "PHASE 1" indicates that the $\mu C$ charge pump 2410 is configured to operate in a first phase of operation, where the $\mu C$ charge pump control circuit 2414A configures the switch state (open or closed) of the identified $\mu C$ charge pump switch to be closed during the time period of the first phase of operation. "PHASE 2" indicates that the $\mu C$ charge pump 2410 is configured to operate in a second phase of operation, where the $\mu C$ charge pump control circuit 2414A configures the switch state (open or closed) of the identified $\mu C$ charge pump switch to be closed during the time period of the second phase of operation. "PHASE 3" indicates that the $\mu C$ charge pump 2410 is configured to operate in a third phase of operation, where the $\mu C$ charge pump control circuit 2414A configures the switch state (open or closed) of the identified $\mu C$ charge pump switch to be closed during the time period of the third phase of operation. "PHASE 4" indicates that the $\mu C$ charge pump 2410 is configured to operate in a fourth phase of operation, where the $\mu C$ charge pump control circuit 2414A configures the switch state (open or closed) of the identified $\mu C$ charge pump switch to be closed during the time period of the fourth phase of operation. "OPEN" indicates that the $\mu C$ charge pump control circuit 2414A configures the switch state (open or closed) of the identified switch to be closed during all the phases of operation of the $\mu C$ charge pump 2410.

TABLE 3A-1

MODES OF OPERATION TABLE FOR BOOST/BUCK OPERATION OF A $\mu C$ CHARGE PUMP CIRCUIT

| MODES OF OPERATION | OPERATIONAL RATIOS, ($\mu BB_{RATIO}$) | $V_{FIRST-OUTPUT} =$ $(1 + \mu BB_{RATIO}) \times V_{BAT}$ | $V_{SECOND-OUTPUT} =$ $(\mu BB_{RATIO}) \times V_{BAT}$ |
|---|---|---|---|
| First Boost/Buck Mode | 1/4 | $5/4 \times V_{BAT}$ | $1/4 \times V_{BAT}$ |
| Second Boost/Buck Mode | 1/3 | $4/3 \times V_{BAT}$ | $1/3 \times V_{BAT}$ |
| Third Boost/Buck Mode | 1/2 | $3/2 \times V_{BAT}$ | $1/2 \times V_{BAT}$ |
| Fourth Boost/Buck Mode | 2/3 | $5/3 \times V_{BAT}$ | $2/3 \times V_{BAT}$ |
| Fifth Boost/Buck Mode | 3/4 | $7/4 \times V_{BAT}$ | $3/4 \times V_{BAT}$ |
| OFF Mode | OFF | FLOATING | FLOATING |

TABLE 3A-2

MODES OF OPERATION TABLE FOR BOOST/BUCK OPERATION OF A $\mu C$ CHARGE PUMP CIRCUIT

| MODES OF OPERATION | OPERATIONAL RATIOS, ($\mu BB_{RATIO}$) | $V_{FIRST-OUTPUT} =$ $(1 + \mu BB_{RATIO}) \times V_{BAT}$ | $V_{SECOND-OUTPUT} =$ $(1 - \mu BB_{RATIO}) \times V_{BAT}$ |
|---|---|---|---|
| Sixth Boost/Buck Mode | 1/4 | $5/4 \times V_{BAT}$ | $3/4 \times V_{BAT}$ |
| Seventh Boost/Buck Mode | 1/3 | $4/3 \times V_{BAT}$ | $2/3 \times V_{BAT}$ |
| Eighth Boost/Buck Mode | 1/2 | $3/2 \times V_{BAT}$ | $1/2 \times V_{BAT}$ |
| Ninth Boost/Buck Mode | 2/3 | $5/3 \times V_{BAT}$ | $1/3 \times V_{BAT}$ |
| Tenth Boost/Buck Mode | 3/4 | $7/4 \times V_{BAT}$ | $1/4 \times V_{BAT}$ |
| OFF Mode | OFF | FLOATING | FLOATING |

TABLE 3B-1A

SWITCH OPERATION TABLE FOR BOOST/BUCK MODE OF OPERATION OF A $\mu C$ CHARGE PUMP

MODES OF OPERATION FOR BOOST/BUCK OPERATION OF DUAL OUTPUT $\mu C$ CHARGE PUMP WITH CORRESPONDING OPERATIONAL RATIOS, ($\mu BB_{RATIO}$)

| See, TABLE 3A-1 $\mu C$ CHARGE PUMP SWITCHES | First Boost/Buck Mode, ($\mu BB_{RATIO} = 1/4$), where $V_{FIRST-OUTPUT} = 5/4 \times V_{BAT}$ and $V_{SECOND-OUTPUT} = 1/4 \times V_{BAT}$ | Second Boost/Buck Mode, ($\mu BB_{RATIO} = 1/3$), where $V_{FIRST-OUTPUT} = 4/3 \times V_{BAT}$, and $V_{SECOND-OUTPUT} = 1/3 \times V_{BAT}$ | Third Boost/Buck Mode, ($\mu BB_{RATIO} = 1/2$), where $V_{FIRST-OUTPUT} = 3/2 \times V_{BAT}$, and $V_{SECOND-OUTPUT} = 1/2 \times V_{BAT}$ |
|---|---|---|---|
| SW1 | Phase 1 | Phase 1 | Phase 1 |
| SW2 | OPEN | Phase 3 | Phase 3 |
| SW3 | Phase 3 | Phase 2 | Phase 2 |
| SW4 | OPEN | OPEN | OPEN |

TABLE 3B-1A-continued

SWITCH OPERATION TABLE FOR BOOST/BUCK MODE OF OPERATION OF A μC CHARGE PUMP

MODES OF OPERATION FOR BOOST/BUCK OPERATION OF DUAL OUTPUT μC
CHARGE PUMP WITH CORRESPONDING OPERATIONAL RATIOS, ($\mu BB_{RATIO}$)

| See, TABLE 3A-1 μC CHARGE PUMP SWITCHES | First Boost/Buck Mode, ($\mu BB_{RATIO} = 1/4$), where $V_{FIRST-OUTPUT} = 5/4 \times V_{BAT}$ and $V_{SECOND-OUTPUT} = 1/4 \times V_{BAT}$ | Second Boost/Buck Mode, ($\mu BB_{RATIO} = 1/3$), where $V_{FIRST-OUTPUT} = 4/3 \times V_{BAT}$, and $V_{SECOND-OUTPUT} = 1/3 \times V_{BAT}$ | Third Boost/Buck Mode, ($\mu BB_{RATIO} = 1/2$), where $V_{FIRST-OUTPUT} = 3/2 \times V_{BAT}$, and $V_{SECOND-OUTPUT} = 1/2 \times V_{BAT}$ |
|---|---|---|---|
| SW5 | Phase 1 | Phase 1 | OPEN |
| SW6 | OPEN | OPEN | Phase 1 |
| SW7 | OPEN | Phase 3 | Phase 3 |
| SW8 | Phase 2 | Phase 2 | Phase 2 |
| SW9 | Phase 4 | OPEN | OPEN |
| SW10 | Phase 3 and Phase 4 | Phase 2 | Phase 2 |
| SW11 | OPEN | Phase 3 | Phase 3 |
| SW12 | Phase 1 and Phase 3 | Phase 1 | Phase 1 |
| SW13 | Phase 2 | Phase 2 | Phase 2 |
| SW14 | OPEN | OPEN | Phase 1 |
| SW15 | Phase 4 | Phase 3 | Phase 3 |
| SW16 | OPEN | OPEN | OPEN |
| SW17 | OPEN | OPEN | OPEN |

TABLE 3B-1B

SWITCH OPERATION TABLE FOR BOOST/BUCK MODE OF OPERATION OF A μC CHARGE PUMP

MODES OF OPERATION FOR BOOST/BUCK OPERATION OF DUAL OUTPUT μC
CHARGE PUMP WITH CORRESPONDING OPERATIONAL RATIOS, ($\mu BB_{RATIO}$)

| See, TABLE 3A-1 μC CHARGE PUMP SWITCHES | Fourth Boost/Buck Mode, ($\mu BB_{RATIO} = 2/3$), where $V_{FIRST-OUTPUT} = 5/3 \times V_{BAT}$ and $V_{SECOND-OUTPUT} = 2/3 \times V_{BAT}$ | Fifth Boost/Buck Mode, ($\mu BB_{RATIO} = 3/4$), where $V_{FIRST-OUTPUT} = 7/4 \times V_{BAT}$, and $V_{SECOND-OUTPUT} = 3/4 \times V_{BAT}$ | OFF Mode where $V_{FIRST-OUTPUT} =$ FLOAT $V_{SECOND-OUTPUT} =$ FLOAT |
|---|---|---|---|
| SW1 | Phase 1 | OPEN | OPEN |
| SW2 | Phase 3 | Phase 4 | OPEN |
| SW3 | OPEN | OPEN | OPEN |
| SW4 | OPEN | OPEN | OPEN |
| SW5 | Phase 2 and Phase 3 | Phase 3 and Phase 4 | OPEN |
| SW6 | Phase 1 | Phase 2 | OPEN |
| SW7 | OPEN | OPEN | OPEN |
| SW8 | Phase 2 | Phase 3 | OPEN |
| SW9 | OPEN | OPEN | OPEN |
| SW10 | Phase 2 | Phase 1 and Phase 3 | OPEN |
| SW11 | Phase 3 | Phase 1 and Phase 4 | OPEN |
| SW12 | Phase 1 | Phase 2 | OPEN |
| SW13 | Phase 2 | Phase 3 | OPEN |
| SW14 | Phase 1 | Phase 1 | OPEN |
| SW15 | OPEN | OPEN | OPEN |
| SW16 | OPEN | OPEN | OPEN |
| SW17 | OPEN | OPEN | OPEN |

TABLE 3B-2A

SWITCH OPERATION TABLE FOR BOOST/BUCK MODE OF OPERATION OF A μC CHARGE PUMP

MODES OF OPERATION FOR BOOST/BUCK OPERATION OF DUAL OUTPUT μC
CHARGE PUMP WITH CORRESPONDING OPERATIONAL RATIOS, ($\mu BB_{RATIO}$)

| See, TABLE 3A-2 μC CHARGE PUMP SWITCHES | Sixth Boost/Buck Mode, ($\mu BB_{RATIO} = 1/4$), where $V_{FIRST-OUTPUT} = 5/4 \times V_{BAT}$ and $V_{SECOND-OUTPUT} = 3/4 \times V_{BAT}$ | Seventh Boost/Buck Mode, ($\mu BB_{RATIO} = 1/3$), where $V_{FIRST-OUTPUT} = 4/3 \times V_{BAT}$, and $V_{SECOND-OUTPUT} = 2/3 \times V_{BAT}$ | Eighth Boost/Buck Mode, ($\mu BB_{RATIO} = 1/2$), where $V_{FIRST-OUTPUT} = 1/2 \times V_{BAT}$, and $V_{SECOND-OUTPUT} = 3/2 \times V_{BAT}$ |
|---|---|---|---|
| SW1 | OPEN | Phase 1 | Phase 1 |
| SW2 | OPEN | Phase 3 | Phase 3 |
| SW3 | OPEN | OPEN | Phase 2 |
| SW4 | OPEN | OPEN | OPEN |
| SW5 | Phase 3 | Phase 2 | OPEN |

TABLE 3B-2A-continued

SWITCH OPERATION TABLE FOR BOOST/BUCK MODE OF OPERATION OF A μC CHARGE PUMP

MODES OF OPERATION FOR BOOST/BUCK OPERATION OF DUAL OUTPUT μC
CHARGE PUMP WITH CORRESPONDING OPERATIONAL RATIOS, (μBB$_{RATIO}$)

| See, TABLE 3A-2 μC CHARGE PUMP SWITCHES | Sixth Boost/Buck Mode, (μBB$_{RATIO}$ = 1/4), where V$_{FIRST-OUTPUT}$ = 5/4 × V$_{BAT}$ and V$_{SECOND-OUTPUT}$ = 3/4 × V$_{BAT}$ | Seventh Boost/Buck Mode, (μBB$_{RATIO}$ = 1/3), where V$_{FIRST-OUTPUT}$ = 4/3 × V$_{BAT}$, and V$_{SECOND-OUTPUT}$ = 2/3 × V$_{BAT}$ | Eighth Boost/Buck Mode, (μBB$_{RATIO}$ = 1/2), where V$_{FIRST-OUTPUT}$ = 1/2 × V$_{BAT}$, and V$_{SECOND-OUTPUT}$ = 3/2 × V$_{BAT}$ |
|---|---|---|---|
| SW6 | Phase 2 | Phase 1 | Phase 1 |
| SW7 | OPEN | Phase 3 | Phase 3 |
| SW8 | Phase 3 | Phase 2 | Phase 2 |
| SW9 | Phase 4 | OPEN | OPEN |
| SW10 | Phase 1, Phase 3 and Phase 4 | Phase 2 | Phase 2 |
| SW11 | Phase 1 | Phase 3 | Phase 3 |
| SW12 | Phase 2 | Phase 1 | Phase 1 |
| SW13 | Phase 3 | Phase 2 | Phase 2 |
| SW14 | Phase 1 | Phase 1 | Phase 1 |
| SW15 | Phase 4 | Phase 3 | Phase 3 |
| SW16 | OPEN | OPEN | OPEN |
| SW17 | OPEN | OPEN | OPEN |

TABLE 3B-2B

SWITCH OPERATION TABLE FOR BOOST/BUCK MODE OF OPERATION OF A μC CHARGE PUMP

MODES OF OPERATION FOR BOOST/BUCK OPERATION OF DUAL OUTPUT μC
CHARGE PUMP WITH CORRESPONDING OPERATIONAL RATIOS, (μBB$_{RATIO}$)

| See, TABLE 3A-2 μC CHARGE PUMP SWITCHES | Ninth Boost/Buck Mode, (μBB$_{RATIO}$ = 2/3), where V$_{FIRST-OUTPUT}$ = 5/3 × V$_{BAT}$ and V$_{SECOND-OUTPUT}$ = 1/3 × V$_{BAT}$ | Tenth Boost/Buck Mode, (μBB$_{RATIO}$ = 3/4), where V$_{FIRST-OUTPUT}$ = 7/4 × V$_{BAT}$, and V$_{SECOND-OUTPUT}$ = 1/4 × V$_{BAT}$ | OFF Mode where V$_{FIRST-OUTPUT}$ = FLOAT V$_{SECOND-OUTPUT}$ = FLOAT |
|---|---|---|---|
| SW1 | Phase 1 | Phase 1 | OPEN |
| SW2 | Phase 3 | Phase 4 | OPEN |
| SW3 | Phase 2 | Phase 3 | OPEN |
| SW4 | OPEN | OPEN | OPEN |
| SW5 | Phase 1 and Phase 3 | Phase 1 and Phase 4 | OPEN |
| SW6 | OPEN | OPEN | OPEN |
| SW7 | OPEN | OPEN | OPEN |
| SW8 | Phase 2 | Phase 2 | OPEN |
| SW9 | OPEN | OPEN | OPEN |
| SW10 | Phase 2 | Phase 3 | OPEN |
| SW11 | Phase 3 | Phase 4 | OPEN |
| SW12 | Phase 1 | Phase 1 and Phase 3 | OPEN |
| SW13 | Phase 2 | Phase 2 | OPEN |
| SW14 | OPEN | OPEN | OPEN |
| SW15 | OPEN | OPEN | OPEN |
| SW16 | OPEN | OPEN | OPEN |
| SW17 | OPEN | OPEN | OPEN |

The configurations and operations of the μC charge pump 2410 when the μC charge pump 2410 operates in the various boost/buck modes, described in the TABLE 3A-1 and the TABLE 3A-2, will now be discussed with reference to the TABLE 3B-1A, the TABLE 3B-1B, the TABLE 3B-2A, and the TABLE 3B-2B.

TABLE 3B-1A describes the operation of the μC charge pump 2410 when the controller 50 configures the μC charge pump 2410 to operate in the First Boost/Buck Mode. The controller 50 configures the μC charge pump control circuit 2414A to use an operational ratio, (μBB$_{RATIO}$), set to ¼. The μC charge pump control circuit 2414A operably divides the operation of the μC charge pump 2410 into four phases of operation. The μC charge pump control circuit 2414A operably configures the switching network 2412 such that first output 2416 generates a first output voltage V$_{FIRST-OUTPUT}$ 2416VO substantially equal to 5/4×V$_{BAT}$, and the second output 2418 generates a second output voltage V$_{SECOND-OUTPUT}$ 2418VO substantially equal to ¼×V$_{BAT}$.

As described in TABLE 3B-1A, in the first phase of operation, (Phase 1), the μC charge pump control circuit 2414A operably closes the first switch 2432, (SW1), the fifth switch 2448, (SW5), and the twelfth switch 2476, (SW12). In the second phase of operation, (Phase 2), the μC charge pump control circuit 2414A operably closes the eighth switch 2460, (SW8) and the thirteenth switch 2480, (SW13). As further depicted in FIG. 17B, in the third phase of operation, (Phase 3), the μC charge pump control circuit 2414A operably closes the third switch 2440, (SW3), the tenth switch 2468, (SW10), and the twelfth switch 2476, (SW12). In the fourth phase of operation, (Phase 4), the μC charge pump control circuit 2414A operably closes the ninth switch 2464, (SW9), the tenth switch 2468, (SW10), and the fifteenth switch 2488, (SW15).

As a result, the first flying capacitor 2424 develops a first flying capacitor voltage V$_{FIRST-FLYCAP}$ 2424FC substantially equal to ½×V$_{BAT}$, and the second flying capacitor 2426 develops a second flying capacitor voltage V$_{SECOND-FLYCAP}$ 2426FC substantially equal to ¼×V$_{BAT}$. Accordingly, first output 2416 generates a first output voltage V$_{FIRST-OUTPUT}$ 2416VO substantially equal to 5/4×V$_{BAT}$, on the first output capacitor 2420 and the second output 2418 generates a second output voltage V$_{SECOND-OUTPUT}$ 2418VO substantially equal to ¼× V$_{BAT}$ on the second output capacitor 2422.

TABLE 3B-1A describes the operation of the μC charge pump 2410 when the controller 50 configures the μC charge pump 2410 to operate in the Second Boost/Buck Mode. The controller 50 configures the μC charge pump control circuit 2414A to use an operational ratio, (μBB$_{RATIO}$), set to ⅓. The μC charge pump control circuit 2414A operably divides the operation of the μC charge pump 2410 into three phases of operation. The μC charge pump control circuit 2414A operably configures the switching network 2412 such that first output 2416 generates a first output voltage V$_{FIRST-OUTPUT}$ 2416VO substantially equal to 4/3×V$_{BAT}$, and the second output 2418 generates a second output voltage V$_{SECOND-OUTPUT}$ 2418VO substantially equal to ⅓×V$_{BAT}$.

As described in TABLE 3B-1A, in the first phase of operation, (Phase 1), the μC charge pump control circuit 2414A operably closes the first switch 2432, (SW1), the fifth switch 2448, (SW5), and the tenth switch 2468, (SW10). In the second phase of operation, (Phase 2), the μC charge pump control circuit 2414A operably closes the third switch 2440, (SW3), the eighth switch 2460, (SW8), the tenth switch 2468, (SW10), and the thirteenth switch 2480, (SW13). In the third phase of operation, (Phase 3), the μC charge pump control circuit 2414A operably closes the second switch 2436, (SW2), the seventh switch 2456, (SW7), the eleventh switch 2472, (SW11), and the fifteenth switch 2488, (SW15).

As a result, the first flying capacitor 2424 develops a first flying capacitor voltage V$_{FIRST-FLYCAP}$ 2424FC substantially equal to ⅓×V$_{BAT}$, and the second flying capacitor 2426 develops a second flying capacitor voltage V$_{SECOND-FLYCAP}$ 2426FC substantially equal to ⅓×V$_{BAT}$. Accordingly, first output 2416 generates a first output voltage V$_{FIRST-OUTPUT}$ 2416VO substantially equal to 4/3×V$_{BAT}$, on the first output capacitor 2420 and the second output 2418 generates a second output voltage V$_{SECOND-OUTPUT}$ 2418VO substantially equal to ⅓× V$_{BAT}$ on the second output capacitor 2422.

TABLE 3B-1A describes the operation of the μC charge pump 2410 when the controller 50 configures the μC charge pump 2410 to operate in the Third Boost/Buck Mode. The controller 50 configures the μC charge pump control circuit 2414A to use an operational ratio, (μBB$_{RATIO}$), set to ½. The μC charge pump control circuit 2414A operably divides the operation of the μC charge pump 2410 into three phases of operation. The μC charge pump control circuit 2414A operably configures the switching network 2412 such that first output 2416 generates a first output voltage V$_{FIRST-OUTPUT}$ 2416VO substantially equal to 3/2×V$_{BAT}$, and the second output 2418 generates a second output voltage V$_{SECOND-OUTPUT}$ 2418VO substantially equal to ½×V$_{BAT}$.

As further described in TABLE 3B-1A, in the first phase of operation, (Phase 1), the μC charge pump control circuit 2414A operably closes the first switch 2432, (SW1), the sixth switch 2452, (SW6), the twelfth switch 2476, (SW12), and the fourteenth switch 2484, (SW14). In the second phase of operation, (Phase 2), the μC charge pump control circuit 2414A operably closes the third switch 2440, (SW3), the eighth switch 2460, (SW8), the tenth switch 2468, (SW10), and the thirteenth switch 2480, (SW13). In the third phase of operation, (Phase 3), the μC charge pump control circuit 2414A operably closes the second switch 2436, (SW2), the seventh switch 2456, (SW7), the eleventh switch 2472, (SW11), and the fifteenth switch 2488, (SW15).

As a result, the first flying capacitor 2424 develops a first flying capacitor voltage V$_{FIRST-FLYCAP}$ 2424FC substantially equal to ½×V$_{BAT}$, and the second flying capacitor 2426 develops a second flying capacitor voltage V$_{SECOND-FLYCAP}$ 2426FC substantially equal to ½×V$_{BAT}$. Accordingly, first output 2416 generates a first output voltage V$_{FIRST-OUTPUT}$ 2416VO substantially equal to 3/2×V$_{BAT}$, on the first output capacitor 2420 and the second output 2418 generates a second output voltage V$_{SECOND-OUTPUT}$ 2418VO substantially equal to ½× V$_{BAT}$ on the second output capacitor 2422.

TABLE 3B-1B describes the operation of the μC charge pump 2410 when the controller 50 configures the μC charge pump 2410 to operate in the Fourth Boost/Buck Mode. The controller 50 configures the μC charge pump control circuit 2414A to use an operational ratio, (μBB$_{RATIO}$), set to ⅔. The μC charge pump control circuit 2414A operably divides the operation of the μC charge pump 2410 into three phases of operation. The μC charge pump control circuit 2414A operably configures the switching network 2412 such that first output 2416 generates a first output voltage V$_{FIRST-OUTPUT}$ 2416VO substantially equal to 5/3×V$_{BAT}$, and the second output 2418 generates a second output voltage V$_{SECOND-OUTPUT}$ 2418VO substantially equal to ⅔×V$_{BAT}$.

As further described in TABLE 3B-1B, in the first phase of operation, (Phase 1), the μC charge pump control circuit 2414A operably closes the first switch 2432, (SW1), the sixth switch 2452, (SW6), the twelfth switch 2476, (SW12), and the fourteenth switch 2484, (SW14). In the second phase of operation, (Phase 2), the μC charge pump control circuit 2414A operably closes the fifth switch 2448, (SW5), the eighth switch 2460, (SW8), the tenth switch 2468, (SW10), and the thirteenth switch 2480, (SW13). In the third phase of operation, (Phase 3), the μC charge pump control circuit 2414A operably closes the second switch 2436, (SW2), the fifth switch 2448, (SW5), and the eleventh switch 2472, (SW11).

As a result, the first flying capacitor 2424 develops a first flying capacitor voltage V$_{FIRST-FLYCAP}$ 2424FC substantially equal to ⅓×V$_{BAT}$, and the second flying capacitor 2426 develops a second flying capacitor voltage V$_{SECOND-FLYCAP}$ 2426FC substantially equal to ⅓×V$_{BAT}$. Accordingly, first output 2416 generates a first output voltage V$_{FIRST-OUTPUT}$ 2416VO substantially equal to 5/3×V$_{BAT}$, on the first output capacitor 2420 and the second output 2418 generates a second output voltage V$_{SECOND-OUTPUT}$ 2418VO substantially equal to ⅔× V$_{BAT}$ on the second output capacitor 2422.

TABLE 3B-1B describes the operation of the μC charge pump 2410 when the controller 50 configures the μC charge pump 2410 to operate in the Fifth Boost/Buck Mode. The controller 50 configures the μC charge pump control circuit 2414A to use an operational ratio, (μBB$_{RATIO}$), set to ¾. The μC charge pump control circuit 2414A operably divides the operation of the μC charge pump 2410 into four phases of operation. The μC charge pump control circuit 2414A operably configures the switching network 2412 such that first output 2416 generates a first output voltage V$_{FIRST-OUTPUT}$ 2416VO substantially equal to 7/4×V$_{BAT}$, and the second output 2418 generates a second output voltage V$_{SECOND-OUTPUT}$ 2418VO substantially equal to ¾×V$_{BAT}$.

As further described in TABLE 3B-1B, in the first phase of operation, (Phase 1), the μC charge pump control circuit 2414A operably closes the tenth switch 2468, (SW10), the eleventh switch 2472, (SW11), and the fourteenth switch 2484, (SW14). In the second phase of operation, (Phase 2), the μC charge pump control circuit 2414A operably closes the sixth switch 2452, (SW6), and the twelfth switch 2476, (SW12). In the third phase of operation, (Phase 3), the μC charge pump control circuit 2414A operably closes the fifth switch 2448, (SW5), the eighth switch 2460, (SW8), the tenth switch 2468, (SW10), and the thirteenth switch 2480, (SW13). In the fourth phase of operation, (Phase 4), the μC charge pump control circuit 2414A operably closes the second switch 2436, (SW2), the fifth switch 2448, (SW5), and the eleventh switch 2472, (SW11).

As a result, the first flying capacitor 2424 develops a first flying capacitor voltage $V_{FIRST-FLYCAP}$ 2424FC substantially equal to $1/2 \times V_{BAT}$, and the second flying capacitor 2426 develops a second flying capacitor voltage $V_{SECOND-FLYCAP}$ 2426FC substantially equal to $1/4 \times V_{BAT}$. Accordingly, first output 2416 generates a first output voltage $V_{FIRST-OUTPUT}$ 2416VO substantially equal to $7/4 \times V_{BAT}$, on the first output capacitor 2420 and the second output 2418 generates a second output voltage $V_{SECOND-OUTPUT}$ 2418VO substantially equal to $3/4 \times V_{BAT}$ on the second output capacitor 2422.

TABLE 3B-2A describes the operation of the μC charge pump 2410 when the controller 50 configures the μC charge pump 2410 to operate in the Sixth Boost/Buck Mode. The controller 50 configures the μC charge pump control circuit 2414A to use an operational ratio, ($\mu BB_{RATIO}$), set to $1/4$. The μC charge pump control circuit 2414A operably divides the operation of the μC charge pump 2410 into four phases of operation. The μC charge pump control circuit 2414A operably configures the switching network 2412 such that first output 2416 generates a first output voltage $V_{FIRST-OUTPUT}$ 2416VO substantially equal to $5/4 \times V_{BAT}$, and the second output 2418 generates a second output voltage $V_{SECOND-OUTPUT}$ 2418VO substantially equal to $3/4 \times V_{BAT}$.

As described in TABLE 3B-2A, in the first phase of operation, (Phase 1), the μC charge pump control circuit 2414A operably closes the tenth switch 2468, (SW10), the eleventh switch 2472, (SW11), and the fourteenth switch 2484, (SW14). In the second phase of operation, (Phase 2), the μC charge pump control circuit 2414A operably closes the sixth switch 2452, (SW6), and the twelfth switch 2476, (SW12). As further depicted, in the third phase of operation, (Phase 3), the μC charge pump control circuit 2414A operably closes the fifth switch 2448, (SW5), the eighth switch 2460, (SW8), the tenth switch 2468, (SW10), and the thirteenth switch 2480, (SW13). In the fourth phase of operation, (Phase 4), the μC charge pump control circuit 2414A operably closes the ninth switch 2464, (SW9), the tenth switch 2468, (SW10), and the fifteenth switch 2488, (SW15).

As a result, the first flying capacitor 2424 develops a first flying capacitor voltage $V_{FIRST-FLYCAP}$ 2424FC substantially equal to $1/2 \times V_{BAT}$, and the second flying capacitor 2426 develops a second flying capacitor voltage $V_{SECOND-FLYCAP}$ 2426FC substantially equal to $1/4 \times V_{BAT}$. Accordingly, first output 2416 generates a first output voltage $V_{FIRST-OUTPUT}$ 2416VO substantially equal to $5/4 \times V_{BAT}$, on the first output capacitor 2420 and the second output 2418 generates a second output voltage $V_{SECOND-OUTPUT}$ 2418VO substantially equal to $3/4 \times V_{BAT}$ on the second output capacitor 2422.

TABLE 3B-2A describes the operation of the μC charge pump 2410 when the controller 50 configures the μC charge pump 2410 to operate in the Seventh Boost/Buck Mode. The controller 50 configures the μC charge pump control circuit 2414A to use an operational ratio, ($\mu BB_{RATIO}$), set to $1/3$. The μC charge pump control circuit 2414A operably divides the operation of the μC charge pump 2410 into three phases of operation. The μC charge pump control circuit 2414A operably configures the switching network 2412 such that first output 2416 generates a first output voltage $V_{FIRST-OUTPUT}$ 2416VO substantially equal to $4/3 \times V_{BAT}$, and the second output 2418 generates a second output voltage $V_{SECOND-OUTPUT}$ 2418VO substantially equal to $2/3 \times V_{BAT}$.

As described in TABLE 3B-2A, in the first phase of operation, (Phase 1), the μC charge pump control circuit 2414A operably closes the first switch 2432, (SW1), the sixth switch 2452, (SW6), the twelfth switch 2476, (SW12), and the fourteenth switch 2484, (SW14). In the second phase of operation, (Phase 2), the μC charge pump control circuit 2414A operably closes the fifth switch 2448, (SW5), the eighth switch 2460, (SW8), the tenth switch 2468, (SW10), and the thirteenth switch 2480, (SW13). In the third phase of operation, (Phase 3), the μC charge pump control circuit 2414A operably closes the second switch 2436, (SW2), the seventh switch 2456, (SW7), the eleventh switch 2472, (SW11), and the fifteenth switch 2488, (SW15).

As a result, the first flying capacitor 2424 develops a first flying capacitor voltage $V_{FIRST-FLYCAP}$ 2424FC substantially equal to $1/3 \times V_{BAT}$, and the second flying capacitor 2426 develops a second flying capacitor voltage $V_{SECOND-FLYCAP}$ 2426FC substantially equal to $1/3 \times V_{BAT}$. Accordingly, first output 2416 generates a first output voltage $V_{FIRST-OUTPUT}$ 2416VO substantially equal to $4/3 \times V_{BAT}$, on the first output capacitor 2420 and the second output 2418 generates a second output voltage $V_{SECOND-OUTPUT}$ 2418VO substantially equal to $2/3 \times V_{BAT}$ on the second output capacitor 2422.

TABLE 3B-2A describes the operation of the μC charge pump 2410 when the controller 50 configures the μC charge pump 2410 to operate in the Eighth Boost/Buck Mode. The controller 50 configures the μC charge pump control circuit 2414A to use an operational ratio, ($\mu BB_{RATIO}$), set to $1/2$. The μC charge pump control circuit 2414A operably divides the operation of the μC charge pump 2410 into three phases of operation. The μC charge pump control circuit 2414A operably configures the switching network 2412 such that first output 2416 generates a first output voltage $V_{FIRST-OUTPUT}$ 2416VO substantially equal to $3/2 \times V_{BAT}$, and the second output 2418 generates a second output voltage $V_{SECOND-OUTPUT}$ 2418VO substantially equal to $1/2 \times V_{BAT}$.

As further described in TABLE 3B-2A, in the first phase of operation, (Phase 1), the μC charge pump control circuit 2414A operably closes the first switch 2432, (SW1), the sixth switch 2452, (SW6), the twelfth switch 2476, (SW12), and the fourteenth switch 2484, (SW14). In the second phase of operation, (Phase 2), the μC charge pump control circuit 2414A operably closes the third switch 2440, (SW3), the eighth switch 2460, (SW8), the tenth switch 2468, (SW10), and the thirteenth switch 2480, (SW13). In the third phase of operation, (Phase 3), the μC charge pump control circuit 2414A operably closes the second switch 2436, (SW2), the seventh switch 2456, (SW7), the eleventh switch 2472, (SW11), and the fifteenth switch 2488, (SW15).

As a result, the first flying capacitor 2424 develops a first flying capacitor voltage $V_{FIRST-FLYCAP}$ 2424FC substantially equal to $1/2 \times V_{BAT}$, and the second flying capacitor 2426 develops a second flying capacitor voltage $V_{SECOND-FLYCAP}$ 2426FC substantially equal to $1/2 \times V_{BAT}$. Accordingly, first output 2416 generates a first output voltage $V_{FIRST-OUTPUT}$ 2416VO substantially equal to $3/2 \times V_{BAT}$, on the first output capacitor 2420 and the second output 2418 generates a second output voltage $V_{SECOND-OUTPUT}$ 2418VO substantially equal to $1/2 \times V_{BAT}$ on the second output capacitor 2422.

TABLE 3B-2B describes the operation of the μC charge pump 2410 when the controller 50 configures the μC charge pump 2410 to operate in the Ninth Boost/Buck Mode. The controller 50 configures the μC charge pump control circuit 2414A to use an operational ratio, (μBB$_{RATIO}$), set to ⅔. The μC charge pump control circuit 2414A operably divides the operation of the μC charge pump 2410 into three phases of operation. The μC charge pump control circuit 2414A operably configures the switching network 2412 such that first output 2416 generates a first output voltage V$_{FIRST-OUTPUT}$ 2416VO substantially equal to 5/3×V$_{BAT}$, and the second output 2418 generates a second output voltage V$_{SECOND-OUTPUT}$ 2418VO substantially equal to ⅓×V$_{BAT}$.

As further described in TABLE 3B-2B, in the first phase of operation, (Phase 1), the μC charge pump control circuit 2414A operably closes the first switch 2432, (SW1), the fifth switch 2448, (SW5), and the twelfth switch 2476, (SW12). In the second phase of operation, (Phase 2), the μC charge pump control circuit 2414A operably closes the third switch 2440, (SW3), the eighth switch 2460, (SW8), the tenth switch 2468, (SW10), and the thirteenth switch 2480, (SW13). In the third phase of operation, (Phase 3), the μC charge pump control circuit 2414A operably closes the second switch 2436, (SW2), the fifth switch 2448, (SW5), and the eleventh switch 2472, (SW11).

As a result, the first flying capacitor 2424 develops a first flying capacitor voltage V$_{FIRST-FLYCAP}$ 2424FC substantially equal to ⅓×V$_{BAT}$, and the second flying capacitor 2426 develops a second flying capacitor voltage V$_{SECOND-FLYCAP}$ 2426FC substantially equal to ⅓×V$_{BAT}$. Accordingly, first output 2416 generates a first output voltage V$_{FIRST-OUTPUT}$ 2416VO substantially equal to 5/3×V$_{BAT}$, on the first output capacitor 2420 and the second output 2418 generates a second output voltage V$_{SECOND-OUTPUT}$ 2418VO substantially equal to ⅓×V$_{BAT}$ on the second output capacitor 2422.

TABLE 3B-2B describes the operation of the μC charge pump 2410 when the controller 50 configures the μC charge pump 2410 to operate in the Tenth Boost/Buck Mode. The controller 50 configures the μC charge pump control circuit 2414A to use an operational ratio, (μBB$_{RATIO}$), set to ¾. The μC charge pump control circuit 2414A operably divides the operation of the μC charge pump 2410 into four phases of operation. The μC charge pump control circuit 2414A operably configures the switching network 2412 such that first output 2416 generates a first output voltage V$_{FIRST-OUTPUT}$ 2416VO substantially equal to 7/4×V$_{BAT}$, and the second output 2418 generates a second output voltage V$_{SECOND-OUTPUT}$ 2418VO substantially equal to ¼×V$_{BAT}$.

As further described in TABLE 3B-2B, in the first phase of operation, (Phase 1), the μC charge pump control circuit 2414A operably closes the first switch 2432, (SW1), the fifth switch 2448, (SW5), and the twelfth switch 2476, (SW12). In the second phase of operation, (Phase 2), the μC charge pump control circuit 2414A operably closes the eighth switch 2460, (SW8), and the thirteenth switch 2480, (SW13). In the third phase of operation, (Phase 3), the μC charge pump control circuit 2414A operably closes the third switch 2440, (SW3), the tenth switch 2468, (SW10), and the twelfth switch 2476, (SW12). In the fourth phase of operation, (Phase 4), the μC charge pump control circuit 2414A operably closes the second switch 2436, (SW2), the fifth switch 2448, (SW5), and the eleventh switch 2472, (SW11).

As a result, the first flying capacitor 2424 develops a first flying capacitor voltage V$_{FIRST-FLYCAP}$ 2424FC substantially equal to ½×V$_{BAT}$, and the second flying capacitor 2426 develops a second flying capacitor voltage V$_{SECOND-FLYCAP}$ 2426FC substantially equal to ¼×V$_{BAT}$. Accordingly, first output 2416 generates a first output voltage V$_{FIRST-OUTPUT}$ 2416VO substantially equal to 7/4×V$_{BAT}$, on the first output capacitor 2420 and the second output 2418 generates a second output voltage V$_{SECOND-OUTPUT}$ 2418VO substantially equal to ¼×V$_{BAT}$ on the second output capacitor 2422.

Both the TABLE 3B-1B and the TABLE 3B-2B describe the operation of the μC charge pump 2410 when the controller 50 configures the μC charge pump 2410 to operate in the OFF Mode. As described in both the TABLE 3B-1B and the TABLE 3B-2B, when the controller 50 configures the μC charge pump 2410 to be in the OFF Mode of operation, the μC charge pump control circuit 2414A may operably open the first switch 2432, (SW1), the second switch 2436, (SW2), the third switch 2440, (SW3), the fourth switch 2444, (SW4), the fifth switch 2448, (SW5), the sixth switch 2452, (SW6), the seventh switch 2456, (SW7), the eighth switch 2460, (SW8), the ninth switch 2464, (SW9), the tenth switch 2468, (SW10), the eleventh switch 2472, (SW11), the twelfth switch 2476, (SW12), the thirteenth switch 2480, (SW13), the fourteenth switch 2484, (SW14), the fifteenth switch 2488, (SW15) the sixteenth switch 2492, (SW16), and the seventeenth switch 2496, (SW17). As a result, the first output voltage V$_{FIRST-OUTPUT}$ 2416VO on the first output 2416 floats relative to ground. Likewise, the second output voltage V$_{SECOND-OUTPUT}$ 2418VO on the second output 2418 floats relative to ground.

Returning briefly to FIG. 4A, in some operational modes of the μC charge pump system 2400, the μC charge pump 2410 may be configured to provide various "floating" modes of operation, as depicted in TABLE 5.

TABLE 5

FLOATING MODES OF OPERATION FOR A MULTIPLE OUTPUT μC CHARGE PUMP

| MODES OF OPERATION | V$_{FIRST-OUTPUT}$ | V$_{SECOND-OUTPUT}$ |
|---|---|---|
| OFF Mode | V$_{FIRST-OUTPUT}$ = FLOATING (PRESENTS HIGH IMPEDANCE PATH TO GROUND) | V$_{SECOND-OUTPUT}$ = FLOATING (PRESENTS HIGH IMPEDANCE PATH TO GROUND) |
| 1$^{st}$ Floating Mode | V$_{FIRST-OUTPUT}$ = FLOATING | Permissible Modes of Operation |
| 2$^{nd}$ Floating Mode | Permissible Mode of Operation | V$_{SECOND-OUTPUT}$ = FLOATING |

Figure 4B:
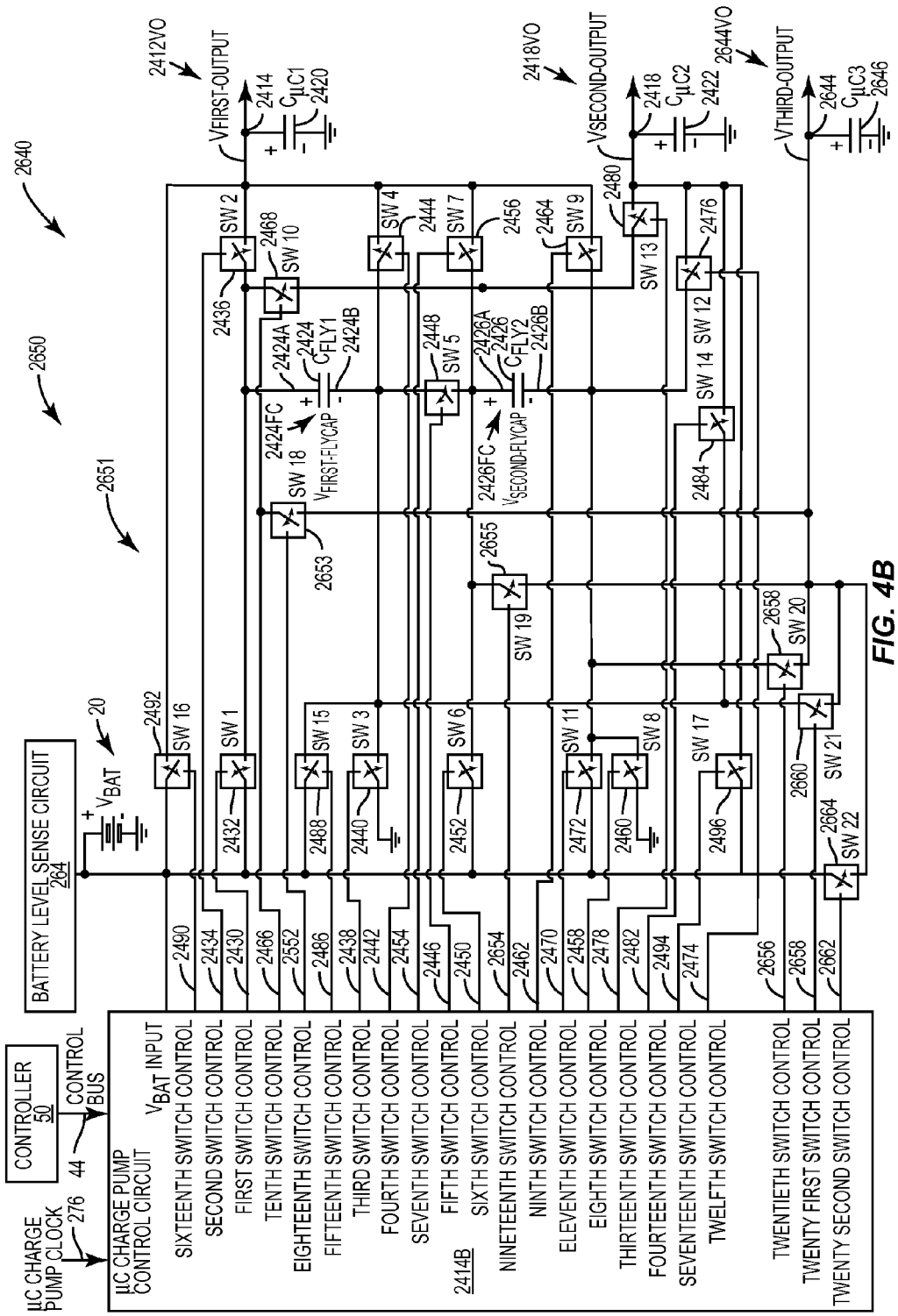

FIG. 4B depicts an embodiment of a μC charge pump system 2640 configured to generated the charge a first output voltage V$_{FIRST-OUTPUT}$ 2412VO at the first output 2414, a second output voltage V$_{SECOND-OUTPUT}$ 2418VO at the second output 2418, and a third output voltage V$_{THIRD-OUTPUT}$ 2644VO at the third output 2544. The μC charge pump system 2640 may be substantially the same in form and function as the μC charge pump system 2400 depicted in FIG. 4A. However, the μC charge pump system 2640 includes a μC charge pump 2650. The μC charge pump 2650 is substantially similar in form and function as the μC charge pump 2410 except the μC charge pump 2650 includes a μC charge pump control circuit 2414A configured to cooperatively operate with a switching network 2651 to generate the third output voltage V$_{THIRD-OUTPUT}$ 2644VO at the third output 2644. As depicted in FIG. 4B, the third output voltage V$_{THIRD-OUTPUT}$ 2644VO at the third output 2644 may be implemented by the μC charge pump control circuit 2414A further including of an eighteenth switch control configured to generate an eighteenth switch control signal 2652 to control an eighteenth switch 2653 of the switching network 2651. The eighteenth switch 2653 may be coupled between the first terminal 2424A of the first flying capacitor 2424 and the third output 2644. In addition, the μC charge pump control circuit 2414A may further include a nineteenth switch control configured to generate an nineteenth switch control signal 2654 to control a nineteenth switch 2655 of the switching network 2651. The nineteenth switch 2655 may be coupled between the second terminal 2424B of the first flying capacitor 2424 and the third output 2644. In addition, the μC charge pump control circuit 2414A may further include a twentieth switch control configured to generate a twentieth switch control signal 2656 to control a twentieth switch 2658. The twentieth switch 2658 may be coupled between the first terminal 2426A of the second flying capacitor 2426 and the third output 2644. In addition, the μC charge pump control circuit 2414A may further include a twenty first switch control configured to generate a twenty first switch control signal 2658 to control a twenty first switch 2660. The twenty first switch 2660 may be coupled between the second terminal 2426B of the second flying capacitor 2426 and the third output 2644. Also, the μC charge pump control circuit 2414A may further include a twenty second switch control configured to generate a twenty second switch control signal 2662 to control a twenty second switch 2664. The twenty second switch 2664 may be coupled between the battery voltage, $V_{BAT}$, and third output 2644 to provide a bypass mode. In the bypass mode, the third output provides a third output voltage $V_{THIRD-OUTPUT}$ 2644VO substantially equal to the battery voltage, VBAT.

The μC charge pump 2650 may be configured to generate various combinations of buck output voltages and boost put voltage as a function of the combinations of the first flying capacitor voltage $V_{FIRST-FLYCAP}$ 2424FC and the second flying capacitor voltage $V_{SECOND-FLYCAP}$ 2426FC with the battery voltage, $V_{BAT}$. In addition, the μC charge pump 2650 may be further configured to generate various buck output voltage as a function of the combinations of the first flying capacitor voltage $V_{FIRST-FLYCAP}$ 2424FC and the second flying capacitor voltage $V_{SECOND-FLYCAP}$ 2426FC with the ground voltage.

For example, the third output 2424 may be coupled to the first terminal 2424A of the first flying capacitor 2424 by closing the eighteenth switch 2653. The third output 2424 may be coupled to the second terminal 2424B of the first flying capacitor 2424 by closing the twenty first switch 2660. The third output 2424 may be coupled to the first terminal 2426B of the second flying capacitor 2426 by closing the nineteenth switch 2655. The third output 2424 may be coupled to the second terminal 2426B of the second flying capacitor 2426 by closing the twentieth switch 2658. The third output 2644 maybe couple to the battery voltage, $V_{BAT}$, by closing the twenty second switch 2664 in order to provide a bypass mode. In addition, the third output 2644 may be coupled to ground by selectively closing the twenty first switch 2660 and the third switch 2440.

Thus, the μC charge pump 2650 may operate in a similar fashion as the μC charge pump 2510 except an extra phase of operation may be added to provide a charge to the third output capacitor 2646 coupled between the third output 2424 and ground. Accordingly, the third output voltage $V_{THIRD-OUTPUT}$ 2644VO may be configure to have the following output voltages by charging the third output capacitor 2646 during an extra phase of operation substantially similar to the operation of the a similar fashion as the μC charge pump 2510:

One embodiment of the pseudo-envelope tracking modulated power supply system 868 illustrated in FIGS. 2A, 2B, 2C, 3A, 3B, 3C, 3D, 4A, and 4B is presented in the following paragraphs. The pseudo-envelope tracking modulated power supply system 868 includes the switch mode power supply converter 872 and the parallel amplifier 2300A. The switch mode power supply converter 872 is coupled to the modulated power supply output 876. The parallel amplifier 2300A has the parallel amplifier output 2306, which is coupled to the modulated power supply output 876.

In a first embodiment of the parallel amplifier 2300A, the parallel amplifier 2300A has the first push-pull output stage 2346 and the second push-pull output stage 2348. In a second embodiment of the parallel amplifier 2300A, the parallel amplifier 2300A has the first push-pull output stage 2346, the second push-pull output stage 2348, and the third push-pull output stage 2350. In a third embodiment of the parallel amplifier 2300A, the parallel amplifier 2300A has the first push-pull output stage 2346, the second push-pull output stage 2348, the third push-pull output stage 2350, and a fourth push-pull output stage (not shown), which is similar to the first push-pull output stage 2346, the second push-pull output stage 2348, and the third push-pull output stage 2350. In general, the parallel amplifier 2300A has a group of output stages 2346, 2348, 2350. Each of the group of output stages 2346, 2348, 2350 is directly coupled to the parallel amplifier output 2306. In one embodiment of the group of output stages 2346, 2348, 2350, each of the group of output stages 2346, 2348, 2350 is a push-pull output stage. In one embodiment of the group of output stages 2346, 2348, 2350, the group of output stages 2346, 2348, 2350 includes and shares the shared NFET transistor 2382, which is coupled between the parallel amplifier output 2306 and a ground. Each of the group of output stages 2346, 2348, 2350 receives a corresponding one of a group of supply voltages.

The switch mode power supply converter 872 cooperatively operates with the parallel amplifier 2300A to provide the power amplifier supply voltage, $V_{CC}$, to the radio frequency power amplifier 869 via the modulated power supply output 876. In one embodiment of the power amplifier supply voltage, $V_{CC}$, the power amplifier supply voltage, $V_{CC}$, is a modulated supply voltage. The switch mode power supply converter 872 has the switching voltage output 26. The power inductor 16 is coupled between the switching voltage output 26 and the modulated power supply output 876. The coupling capacitor 18A is coupled between the parallel amplifier output 2306 and the modulated power supply output 876.

In a first embodiment of the group of supply voltages, the group of supply voltages includes the first supply voltage 2376 and the battery voltage, $V_{BAT}$. In a second embodiment of the group of supply voltages, the group of supply voltages includes the first supply voltage 2376 and the second supply voltage 2378. In a third embodiment of the group of supply voltages, the group of supply voltages includes the first supply voltage 2376, the second supply voltage 2378, and the battery voltage, $V_{BAT}$. In a fourth embodiment of the group of supply voltages, the group of supply voltages includes the first supply voltage 2376, the second supply voltage 2378, and the third supply voltage 2380. In a fifth embodiment of the group of supply voltages, the group of supply voltages includes the first supply voltage 2376, the second supply voltage 2378, the third supply voltage 2380, and the battery voltage, $V_{BAT}$.

In general, each of the group of output stages 2346, 2348, 2350 receives a corresponding one of the group of supply voltages. As such, the power amplifier supply voltage, $V_{CC}$, is based on the group of supply voltages.

In general, in one embodiment of the group of supply voltages, each of the group of supply voltages is not equal to any other of the group of supply voltages. As such, in the case of the first embodiment of the group of supply voltages, the first supply voltage 2376 is not equal to the battery voltage, $V_{BAT}$. In the case of the second embodiment of the group of supply voltages, the first supply voltage 2376 is not equal to the second supply voltage 2378. In the case of the third embodiment of the group of supply voltages, the first supply voltage 2376 is not equal to either the second supply voltage 2378 or the battery voltage, $V_{BAT}$, and the second supply voltage 2378 is not equal to the battery voltage, $V_{BAT}$. In the case of the fourth embodiment of the group of supply voltages, the first supply voltage 2376 is not equal to either the second supply voltage 2378 or the third supply voltage 2380, and the second supply voltage 2378 is not equal to the third supply voltage 2380. In the case of the fifth embodiment of the group of supply voltages, the first supply voltage 2376 is not equal to the second supply voltage 2378, the third supply voltage 2380, or the battery voltage, $V_{BAT}$; the second supply voltage 2378 is not equal to either the third supply voltage 2380 or the battery voltage, $V_{BAT}$; and the third supply voltage 2380 is not equal to the battery voltage, $V_{BAT}$.

In one embodiment of the pseudo-envelope tracking modulated power supply system 868, the pseudo-envelope tracking modulated power supply system 868 further includes the charge pump 2390A, such that the charge pump 2390A provides at least one of the group of supply voltages. In one embodiment of the charge pump 2390A, the charge pump 2390A has at least the first output 2416, such that each of the at least one of the group of supply voltages is provided via a corresponding one of the at least the first output 2416. In one embodiment of the charge pump 2390A, each of at least a first output capacitor 2420 is coupled between a corresponding one of the at least the first output 2416 and a ground.

In one embodiment of the group of supply voltages, the group of supply voltages consists of the battery voltage, $V_{BAT}$, and the first supply voltage 2376. In one embodiment of the charge pump 2390A, the charge pump 2390A provides the first supply voltage 2376. In one embodiment of the charge pump 2390A, the charge pump 2390A is the μC charge pump 2410, such that the first supply voltage 2376 is based on the first flying capacitor 2424 and the second flying capacitor 2426. In one embodiment of the μC charge pump 2410 the first supply voltage 2376 is about equal to any of 5/4 times a battery voltage, 4/3 times the battery voltage, 3/2 times the battery voltage, ¼ times the battery voltage, ⅓ times the battery voltage, ½ times the battery voltage, ⅔ times the battery voltage, and ¾ times the battery voltage.

In one embodiment of the group of supply voltages, the group of supply voltages consists of the first supply voltage 2376 and the second supply voltage 2378. In one embodiment of the charge pump 2390A, the charge pump 2390A provides the first supply voltage 2376 and the second supply voltage 2378. In one embodiment of the charge pump 2390A, the charge pump 2390A is the μC charge pump 2410, such that the first supply voltage 2376 and the second supply voltage 2378 are based on the first flying capacitor 2424 and the second flying capacitor 2426. In one embodiment of the μC charge pump 2410, the first supply voltage 2376 is about equal to any of 5/4 times a battery voltage, 4/3 times the battery voltage, and 3/2 times the battery voltage. The second supply voltage 2378 is about equal to any of ¼ times the battery voltage, ⅓ times the battery voltage, ½ times the battery voltage, ⅔ times the battery voltage, and ¾ times the battery voltage.

In one embodiment of the charge pump 2390A, when the first supply voltage 2376 is greater than both the battery voltage, $V_{BAT}$, and the second supply voltage 2378, and when the first supply voltage 2376 and at least one of the battery voltage, $V_{BAT}$, and the second supply voltage 2378 are greater than a maximum voltage at the parallel amplifier output 2306, the charge pump 2390A disables the first supply voltage 2376. Also, when the second supply voltage 2378 is greater than both the battery voltage, $V_{BAT}$, and the first supply voltage 2376, and when the second supply voltage 2378 and at least one of the battery voltage, $V_{BAT}$, and the first supply voltage 2376 are greater than a maximum voltage at the parallel amplifier output 2306, the charge pump 2390A disables the second supply voltage 2378.

In one embodiment of the group of supply voltages, the group of supply voltages consists of the first supply voltage 2376, the second supply voltage 2378, and the third supply voltage 2380. In one embodiment of the charge pump 2390A, the charge pump 2390A provides the first supply voltage 2376, the second supply voltage 2378, and the third supply voltage 2380. In one embodiment of the charge pump 2390A, the charge pump 2390A is the μC charge pump 2410, such that the first supply voltage 2376, the second supply voltage 2378, and the third supply voltage 2380 are based on the first flying capacitor 2424 and the second flying capacitor 2426. In one embodiment of the μC charge pump 2410, the first supply voltage 2376 is about equal to any of 5/4 times a battery voltage, 4/3 times the battery voltage, and 3/2 times the battery voltage. The second supply voltage 2378 is about equal to any of ¼ times the battery voltage, ⅓ times the battery voltage, and ½ times the battery voltage. The third supply voltage 2380 is about equal to any of ½ times the battery voltage, ⅔ times the battery voltage, and ¾ times the battery voltage.

In one embodiment of the charge pump 2390A, when the first supply voltage 2376 is greater than both the second supply voltage 2378 and the third supply voltage 2380, and when the first supply voltage 2376 and at least one of the second supply voltage 2378 and the third supply voltage 2380 are greater than a maximum voltage at the parallel amplifier output 2306, the charge pump 2390A disables the first supply voltage 2376. Also, when the second supply voltage 2378 is greater than both the first supply voltage 2376 and the third supply voltage 2380, and when the second supply voltage 2378 and at least one of the first supply voltage 2376 and the third supply voltage 2380 are greater than a maximum voltage at the parallel amplifier output 2306, the charge pump 2390A disables the second supply voltage 2378. Further, when the third supply voltage 2380 is greater than both the first supply voltage 2376 and the second supply voltage 2378, and when the third supply voltage 2380 and at least one of the first supply voltage 2376 and the second supply voltage 2378 are greater than the maximum voltage at the parallel amplifier output 2306, the charge pump 2390A disables the third supply voltage 2380.

In one embodiment of the group of supply voltages, the group of supply voltages consists of the first supply voltage 2376, the second supply voltage 2378, the third supply voltage 2380, and the battery voltage, $V_{BAT}$. In one embodiment of the charge pump 2390A, the charge pump 2390A provides the first supply voltage 2376, the second supply voltage 2378, and the third supply voltage 2380. In one embodiment of the charge pump 2390A, the charge pump 2390A is the μC charge pump 2410, such that the first supply voltage 2376, the second supply voltage 2378, and the third supply voltage 2380 are based on the first flying capacitor 2424 and the second flying capacitor 2426. In one embodiment of the μC charge pump 2410, the first supply voltage 2376 is about equal to any of 5/4 times a battery voltage, 4/3 times the battery voltage, and 3/2 times the battery voltage. The second supply voltage 2378 is about equal to any of ¼ times the battery voltage, ⅓ times the battery voltage, and ½ times the battery voltage. The third supply voltage 2380 is about equal to any of ½ times the battery voltage, ⅔ times the battery voltage, and ¾ times the battery voltage.

In one embodiment of the charge pump 2390A, when the first supply voltage 2376 is greater than all of the second supply voltage 2378, the third supply voltage 2380, and the battery voltage, $V_{BAT}$, and when the first supply voltage 2376 and at least one of the second supply voltage 2378, the third supply voltage 2380, and the battery voltage, $V_{BAT}$ are greater than a maximum voltage at the parallel amplifier output 2306, the charge pump 2390A disables the first supply voltage 2376. Also, when the second supply voltage 2378 is greater than all of the first supply voltage 2376, the third supply voltage 2380, and the battery voltage, $V_{BAT}$, and when the second supply voltage 2378 and at least one of the first supply voltage 2376, the third supply voltage 2380, and the battery voltage, $V_{BAT}$ are greater than the maximum voltage at the parallel amplifier output 2306, the charge pump 2390A disables the second supply voltage 2378. Further, when the third supply voltage 2380 is greater than all of the first supply voltage 2376, the second supply voltage 2378, and the battery voltage, $V_{BAT}$, and when the third supply voltage 2380 and at least one of the first supply voltage 2376, the second supply voltage 2378, and the battery voltage, $V_{BAT}$ are greater than the maximum voltage at the parallel amplifier output 2306, the charge pump 2390A disables the third supply voltage 2380.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
a switch mode power supply converter coupled to a modulated power supply output; and
a parallel amplifier having a parallel amplifier output coupled to the modulated power supply output, wherein:
the parallel amplifier has a plurality of output stages;
a coupling capacitive element is coupled between the parallel amplifier output and the modulated power supply output;
each of the plurality of output stages is configured to receive a corresponding one of a plurality of supply voltages; and
each of the plurality of output stages is directly coupled to the parallel amplifier output.

2. The circuitry of claim 1 wherein the switch mode power supply converter is configured to cooperatively operate with the parallel amplifier to provide a power amplifier supply voltage to a radio frequency power amplifier via the modulated power supply output, such that the power amplifier supply voltage is based on the plurality of supply voltages.

3. The circuitry of claim 2 wherein the power amplifier supply voltage is a modulated supply voltage.

4. The circuitry of claim 1 wherein the switch mode power supply converter has a switching voltage output, such that a power inductive element is coupled between the switching voltage output and the modulated power supply output.

5. Circuitry comprising:
a switch mode power supply converter coupled to a modulated power supply output; and
a parallel amplifier having a parallel amplifier output coupled to the modulated power supply output, wherein:
the parallel amplifier has a plurality of output stages;
each of the plurality of output stages is a push-pull output stage;
each of the plurality of output stages is configured to receive a corresponding one of a plurality of supply voltages; and
each of the plurality of output stages is directly coupled to the parallel amplifier output.

6. The circuitry of claim 5 wherein the plurality of output stages comprises and shares a shared NFET transistor element coupled between the parallel amplifier output and a ground.

7. The circuitry of claim 1 wherein the plurality of output stages consists of two output stages.

8. The circuitry of claim 1 wherein the plurality of output stages consists of three output stages.

9. The circuitry of claim 1 wherein the plurality of output stages consists of four output stages.

10. The circuitry of claim 1 wherein each of the plurality of supply voltages is not equal to any other of the plurality of supply voltages.

11. Circuitry comprising:
a switch mode power supply converter coupled to a modulated power supply output;
a charge pump configured to provide at least one of a plurality of supply voltages;
a parallel amplifier having a parallel amplifier output coupled to the modulated power supply output, wherein:
the parallel amplifier has a plurality of output stages;
each of the plurality of output stages is configured to receive a corresponding one of the plurality of supply voltages; and
each of the plurality of output stages is directly coupled to the parallel amplifier output.

12. The circuitry of claim 11 wherein the charge pump has at least a first output, such that each of the at least one of the plurality of supply voltages is provided via a corresponding one of the at least the first output.

13. The circuitry of claim 12 wherein each of at least a first output capacitive element is coupled between a corresponding one of the at least the first output and a ground.

14. The circuitry of claim 11 wherein the plurality of supply voltages consists of a battery voltage and a first supply voltage, which is provided by the charge pump.

15. The circuitry of claim 14 wherein the charge pump is a µC charge pump, such that the first supply voltage is based on two flying capacitive elements and the first supply voltage is about equal to any of 5/4 times the battery voltage, 4/3 times the battery voltage, 3/2 times the battery voltage, ¼ times the battery voltage, ⅓ times the battery voltage, ½ times the battery voltage, ⅔ times the battery voltage, and ¾ times the battery voltage.

16. The circuitry of claim 11 wherein the plurality of supply voltages consists of a first supply voltage and a second supply voltage, which are provided by the charge pump.

17. The circuitry of claim 16 wherein the charge pump is a µC charge pump, such that the first supply voltage and the second supply voltage are based on two flying capacitive elements; the first supply voltage is about equal to any of 5/4 times a battery voltage, 4/3 times the battery voltage, and 3/2 times the battery voltage; and the second supply voltage is about equal to any of ¼ times the battery voltage, ⅓ times the battery voltage, ½ times the battery voltage, ⅔ times the battery voltage, and ¾ times the battery voltage.

18. The circuitry of claim 11 wherein the plurality of supply voltages consists of a first supply voltage, a second supply voltage, and a battery voltage, such that the first supply voltage and the second supply voltage are provided by the charge pump.

19. The circuitry of claim 18 wherein the charge pump is a µC charge pump, such that the first supply voltage and the second supply voltage are based on two flying capacitive elements; the first supply voltage is about equal to any of 5/4 times the battery voltage, 4/3 times the battery voltage, and 3/2 times the battery voltage; and the second supply voltage is about equal to any of ¼ times the battery voltage, ⅓ times the battery voltage, ½ times the battery voltage, ⅔ times the battery voltage, and ¾ times the battery voltage.

20. The circuitry of claim 18 wherein when the first supply voltage is greater than both the battery voltage and the second supply voltage, and when the first supply voltage and at least one of the battery voltage and the second supply voltage are greater than a maximum voltage at the parallel amplifier output, the charge pump is configured to disable the first supply voltage; and when the second supply voltage is greater than both the battery voltage and the first supply voltage, and when the second supply voltage and at least one of the battery voltage and the first supply voltage is greater than the maximum voltage at the parallel amplifier output, the charge pump is configured to disable the second supply voltage.

21. The circuitry of claim 11 wherein the plurality of supply voltages consists of a first supply voltage, a second supply voltage, and a third supply voltage, such that the first supply voltage, the second supply voltage, and the third supply voltage are provided by the charge pump.

22. The circuitry of claim 21 wherein the charge pump is a μC charge pump, such that the first supply voltage, the second supply voltage, and the third supply voltage are based on two flying capacitive elements; the first supply voltage is about equal to any of 5/4 times a battery voltage, 4/3 times the battery voltage, and 3/2 times the battery voltage; the second supply voltage is about equal to any of ¼ times the battery voltage, ⅓ times the battery voltage, and ½ times the battery voltage; and the third supply voltage is about equal to any of ½ times the battery voltage, ⅔ times the battery voltage, and ¾ times the battery voltage.

23. The circuitry of claim 21 wherein when the first supply voltage is greater than both the second supply voltage and the third supply voltage, and when the first supply voltage and at least one of the second supply voltage and the third supply voltage are greater than a maximum voltage at the parallel amplifier output, the charge pump is configured to disable the first supply voltage; when the second supply voltage is greater than both the first supply voltage and the third supply voltage, and when the second supply voltage and at least one of the first supply voltage and the third supply voltage is greater than the maximum voltage at the parallel amplifier output, the charge pump is configured to disable the second supply voltage; and when the third supply voltage is greater than both the first supply voltage and the second supply voltage, and when the third supply voltage and at least one of the first supply voltage and the second supply voltage is greater than the maximum voltage at the parallel amplifier output, the charge pump is configured to disable the third supply voltage.

24. The circuitry of claim 11 wherein the plurality of supply voltages consists of a first supply voltage, a second supply voltage, a third supply voltage, and a battery voltage, such that the first supply voltage, the second supply voltage, and the third supply voltage are provided by the charge pump.

25. The circuitry of claim 24 wherein the charge pump is a μC charge pump, such that the first supply voltage, the second supply voltage, and the third supply voltage are based on two flying capacitive elements; the first supply voltage is about equal to any of 5/4 times the battery voltage, 4/3 times the battery voltage, and 3/2 times the battery voltage; the second supply voltage is about equal to any of ¼ times the battery voltage, ⅓ times the battery voltage, and ½ times the battery voltage; and the third supply voltage is about equal to any of ½ times the battery voltage, ⅔ times the battery voltage, and ¾ times the battery voltage.

26. The circuitry of claim 24 wherein when the first supply voltage is greater than all of the second supply voltage, the third supply voltage, and the battery voltage, and when the first supply voltage and at least one of the second supply voltage, the third supply voltage, and the battery voltage are greater than a maximum voltage at the parallel amplifier output, the charge pump is configured to disable the first supply voltage; when the second supply voltage is greater than all of the first supply voltage, the third supply voltage, and the battery voltage, and when the second supply voltage and at least one of the first supply voltage, the third supply voltage, and the battery voltage is greater than the maximum voltage at the parallel amplifier output, the charge pump is configured to disable the second supply voltage;

and when the third supply voltage is greater than all of the first supply voltage, the second supply voltage, and the battery voltage, and when the third supply voltage and at least one of the first supply voltage, the second supply voltage, and the battery voltage is greater than the maximum voltage at the parallel amplifier output, the charge pump is configured to disable the third supply voltage.

27. A method comprising:
providing a switch mode power supply converter, which is coupled to a modulated power supply output, and a parallel amplifier, which has a plurality of output stages and a parallel amplifier output, such that a coupling capacitive element is coupled between the parallel amplifier output and the modulated power supply output;
receiving a corresponding one of a plurality of supply voltages for each of the plurality of output stages; and
cooperatively operating the switch mode power supply converter with the parallel amplifier to provide a power amplifier supply voltage to a radio frequency power amplifier, such that the power amplifier supply voltage is based on the plurality of supply voltages.

* * * * *